(12) United States Patent  
Kobayakawa et al.

(10) Patent No.: US 8,901,578 B2  
(45) Date of Patent: Dec. 2, 2014

(54) LED MODULE HAVING LED CHIPS AS LIGHT SOURCE

(75) Inventors: Masahiko Kobayakawa, Kyoto (JP); Shinji Isokawa, Kyoto (JP); Riki Shimabukuro, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 56 days.

(21) Appl. No.: 13/468,356

(22) Filed: May 10, 2012

(65) Prior Publication Data

US 2012/0286301 A1 Nov. 15, 2012

(30) Foreign Application Priority Data

May 10, 2011 (JP) ................................. 2011-104923  
Jun. 15, 2011 (JP) ................................. 2011-132985  
Jun. 15, 2011 (JP) ................................. 2011-133598

(51) Int. Cl.

| H01L 29/18 | (2006.01) |
|---|---|
| H01L 33/48 | (2010.01) |
| H01L 25/075 | (2006.01) |
| H01L 33/50 | (2010.01) |
| H01L 33/64 | (2010.01) |
| H01L 33/62 | (2010.01) |

(52) U.S. Cl.  
CPC ..... *H01L 33/486* (2013.01); *H01L 2224/48465* (2013.01); *H01L 25/0753* (2013.01); *H01L 2224/48227* (2013.01); *H01L 33/50* (2013.01); *H01L 2224/73265* (2013.01); *H01L 33/64* (2013.01); *H01L 33/641* (2013.01); *H01L 2924/01322* (2013.01); *H01L 2224/32225* (2013.01); *H01L 2224/32245* (2013.01); *H01L 33/62* (2013.01)  
USPC ..................................... 257/88; 257/E33.066

(58) Field of Classification Search  
CPC ................. H01L 2924/00014; H01L 2924/00; H01L 2224/48247; H01L 2224/73265; H01L 2924/12041; H01L 2224/85; H01L 33/642  
USPC ........................................ 257/80, 88, E33.066  
See application file for complete search history.

(56) References Cited

U.S. PATENT DOCUMENTS

| 2005/0030762 | A1* | 2/2005 | Kato et al. ..................... 362/555 |
| 2005/0280017 | A1* | 12/2005 | Oshio et al. ..................... 257/99 |
| 2006/0198162 | A1* | 9/2006 | Ishidu et al. ................... 362/623 |
| 2006/0261364 | A1* | 11/2006 | Suehiro et al. ................ 257/100 |

(Continued)

FOREIGN PATENT DOCUMENTS

| JP | 2004-119743 | 4/2004 |
| JP | 2006-024794 | 1/2006 |
| JP | 2008-251696 | 10/2008 |
| JP | 2010-147318 | 7/2010 |

*Primary Examiner* — Duy T Nguyen  
(74) *Attorney, Agent, or Firm* — Hamre, Schumann, Mueller & Larson, P.C.

(57) ABSTRACT

An LED (Light Emitting Diode) module includes an LED unit having one or more LED chips and a case. The case includes: a body including a base plate made of ceramic, the base plate having a main surface and a bottom surface opposite to the main surface; a through conductor penetrating through the base plate; and one or more pads formed on the main surface and making conductive connection with the through conductor, the pads mounting thereon the LED unit. The through conductor includes a main surface exposed portion exposed to the main surface and overlapping the LED unit when viewed from top, a bottom surface reaching portion connected to the main surface exposed portion and reaching the bottom surface. The pads cover at least a portion of the main surface exposed portion.

21 Claims, 49 Drawing Sheets

(56) References Cited

U.S. PATENT DOCUMENTS

| | | | |
|---|---|---|---|
| 2007/0120463 A1* | 5/2007 | Hayashi et al. | 313/501 |
| 2008/0023713 A1* | 1/2008 | Maeda et al. | 257/98 |
| 2008/0187762 A1* | 8/2008 | Hayashi et al. | 428/413 |
| 2009/0315060 A1* | 12/2009 | Kim | 257/98 |
| 2010/0033074 A1* | 2/2010 | Nakakawaji et al. | 313/483 |

* cited by examiner

FIG. 73

| Embodiment | P0 [nm] | P1 [nm] | P2 [nm] | ΔP [nm] | Mixture ratio | Ra |
|---|---|---|---|---|---|---|
| 1 | 455 | 650 | 525 | 125 | 7.0 | 96 |
| 2 | 450 | 650 | 520 | 130 | 6.5 | 95 |
| 3 | 450 | 650 | 505 | 145 | 5.0 | 97 |
| 4 | 450 | 660 | 525 | 145 | 6.5 | 96 |
| 5 | 450 | 650 | 525 | 125 | 7.2 | 97 |
| 6 | 465 | 650 | 525 | 125 | 7.0 | 97 |
| 7 | 445 | 650 | 525 | 125 | 7.0 | 90 |
| 8 | 450 | 650 | 515 | 135 | 6.0 | 95 |
| 9 | 450 | 650 | 525 | 125 | 6.8 | 93 |
| 10 | 450 | 655 | 525 | 130 | 6.7 | 96 |
| 11 | 450 | 670 | 525 | 145 | 5.9 | 96 |
| 12 | 450 | 650 | 530 | 120 | 7.5 | 90 |
| 13 | 460 | 650 | 525 | 125 | 7.0 | 97 |
| 14 | 450 | 650 | 510 | 140 | 5.5 | 97 |
| 15 | 450 | 645 | 525 | 120 | 7.2 | 90 |
| 16 | 450 | 665 | 525 | 140 | 6.2 | 96 |
| 17 | 450 | 650 | 525 | 125 | 7.0 | 95 |

P0: Peak wavelength of LED chip 200
P1: Peak wavelength of red fluorescent material 310
P2: Peak wavelength of green fluorescent material 320
ΔP: Difference between P1 and P2

LED MODULE HAVING LED CHIPS AS LIGHT SOURCE

CROSS-REFERENCE TO RELATED APPLICATIONS

This application is based upon and claims the benefit of priority from Japanese Patent Application No. 2011-104923, filed on May 10, 2011, Japanese Patent Application No. 2011-136041, filed on Jun. 20, 2011, Japanese Patent Application No. 2011-132985, filed on Jun. 15, 2011, and Japanese Patent Application No. 2011-133598, filed on Jun. 15, 2011, the entire contents of which are incorporated herein by reference.

TECHNICAL FIELD

The present disclosure relates to an LED (Light Emitting Diode) module having an LED chip as a light source and a method for manufacturing the same.

BACKGROUND

In recent years, LED modules have been employed as light sources for illumination apparatuses.

FIG. 75 shows one example of a conventional LED module. As shown in FIG. 75, an LED module 900a includes a rectangular substrate 910 made of glass epoxy resin, and three LED chips 931, 932 and 933 mounted on the substrate 910. A plurality of electrodes 921, 922, 923 and 924 is formed on the substrate 910. The LED chips 931, 932 and 933 are die-bonded to the electrodes 921, 922 and 923, respectively. The electrode 924 is a so-called common electrode and makes conductive connection with the LED chips 931, 932 and 933 via wires 940. The three LED chips 931, 932 and 933 are surrounded by a case 950. The case 950 is a frame-like opaque resin material and has its inner space filled with transparent resin (not shown). The LED module 900a is configured as a side view type LED module that is mounted on a circuit board or the like, with a lower surface extending in the longitudinal direction of the substrate 910 as a mounting surface. The LED chips 931, 932 and 933 emit red, green and blue light, respectively. The LED module 900a aims to emit white light by mixing the lights emitted from the LED chips 931, 932 and 933.

The LED module 900 is required to emit light with high luminance because it may be used as an illumination light source for a variety of electronic devices. However, the LED chips 931, 932 and 933 generate heat due to their emission. If this heat increases the temperature of the substrate 910 excessively, the substrate 910 made of glass epoxy resin is likely to be unduly deformed.

Recently, it has been increasingly required that an LED module emit light close to natural light for illumination of a room. This recent trend results in LED modules configured to emit white light.

FIG. 76 shows one example of a conventional LED module configured to emit white light. As shown in FIG. 76, an LED module 900b includes a substrate 91 made of glass epoxy resin, and an LED chip 92 mounted on the substrate 91. A case 93 is attached to the substrate 91. The case 93 has an opening 935 formed to expose the LED chip 92. The LED module 900b further includes a fluorescent resin 94 with which the opening 935 is filled. In addition, a lens member 95 to cover the fluorescent resin 94 is attached to the case 93.

The LED chip 92 is configured to emit, for example, blue light. The fluorescent resin 94 emits yellow light by absorbing blue light emitted from the LED chip 92. The LED module 900b emits white light by mixing the blue light and the yellow light.

The color temperature of the white light emitted from the LED module 900b is determined by the LED chip 92 and the fluorescent resin 94. The color temperature is an index indicating a relative strength between the blue-violet light and red light in the white light. A higher color temperature provides more blue-violet light, whereas a lower color temperature provides more red light. The color temperature of the white light may be varied by changing the ingredients of the fluorescent resin 94. There is a need to provide the fluorescent resin 94 that is able to obtain light having a color temperature according to a consumer's taste.

Further, there is a need for mass production of the fluorescent resin 94 in order to reduce the production costs of the LED module 900b. Therefore, the manufacturability of the fluorescent resin 94 is limited by material price and the amount of material available. Accordingly, it is not necessarily the case that a fluorescent resin capable of obtaining light having a color temperature according to a consumer's taste can be easily produced.

FIG. 77 shows another example of a conventional LED module. As shown in FIG. 77, an LED module 900c includes a substrate 901 and an LED chip 902 mounted on the substrate 901. A frame-like reflector 905 is formed on the substrate 901. The reflector 905 has a reflecting surface 906 surrounding the LED chip 902. The space surrounded by the reflecting surface 906 is filled with a sealing resin 907. The LED chip 902 includes a submount substrate 903 made of Si and a semiconductor layer 904 stacked on the submount substrate 903. The semiconductor layer 904 makes conductive connection with the substrate 901 via the submount substrate 903.

There is a strong need for compactness of the LED module 900c. To facilitate reduction of the size of the LED module 900c, the angle of the reflecting surface 906 needs to be adjusted to follow the vertical direction in FIG. 77. As the reflecting surface 906 is adjusted to be aligned with the vertical direction, light emitted from the LED chip 902 toward the reflecting surface 906 propagates in the sealing resin 907 at an angle closer to the horizontal direction after being reflected by the reflecting surface 906. This light is likely to be completely reflected on the top side of the sealing resin 907.

LED modules containing LED chips that are capable of emitting white light are widely used for light sources of a variety of electronics. An LED module capable of emitting white light includes, for example, an LED chip which emits blue light and a fluorescent portion which covers the LED chip. The fluorescent portion is obtained by mixing fluorescent material in transparent resin. Examples of the fluorescent material may include red fluorescent material which emits red light when it is excited by blue light, green fluorescent material which emits green light when it is excited by blue light, and a combination thereof. When the blue light, the red light and the green light are mixed together, white light is emitted from the LED module.

Depending on the application of an LED module, it may be important to reproduce the inherent tone of an illuminated object. This color rendering property is commonly estimated by using an average color rendering index (hereinafter, referred to as "Ra value") defined by JIS (Japanese Industrial Standards). A simple mixture of blue light, red light and green light may not necessarily provide a sufficient Ra value. Applications placing stress on the color rendering property require an LED module having an Ra value as large as possible.

SUMMARY

The present disclosure provides some embodiments of an LED module which is capable of achieving high luminance and high heat radiation.

Further, the present disclosure provides some embodiments of an LED module which is capable of providing light having a more preferable color temperature.

Further, the present disclosure provides some embodiments of an LED module which is capable of achieving compactness and high luminance.

Further, the present disclosure provides some embodiments of an LED module which is capable of increasing an Ra value and a method of manufacturing the same.

According to one aspect of the present disclosure, there is provided an LED module including an LED unit having one or more LED chips and a case. The case includes: a body including a base plate made of ceramic, the base plate having a main surface and a bottom surface opposite to the main surface; a through conductor penetrating through the base plate: and one or more pads formed on the main surface and making conductive connection with the through conductor, the pads mounting thereon the LED unit. The through conductor may have a main surface exposed portion exposed to the main surface and overlapping the LED unit when viewed from top, and a bottom surface reaching portion connected to the main surface exposed portion and reaching the bottom surface, the bottom surface reaching portion not overlapping the LED unit when viewed from top. The pads may cover at least a portion of the main surface exposed portion.

In some embodiments, the main surface exposed portion contains the LED unit when viewed from top.

In some embodiments, at least a portion of the bottom surface reaching portion does not overlap the LED unit.

In some embodiments, the pads cover the main surface exposed portion such that the main surface exposed portion is not exposed.

In some embodiments, the through conductor is made of Ag.

In some embodiments, each of the pads has a surface made of Au.

In some embodiments, a mounting electrode making a conductive connection with the through conductor is formed on the bottom surface of the base plate.

In some embodiments, the body further includes a frame unit made of resin, the frame unit being bonded to the main surface and surrounding the LED unit.

In some embodiments, an inner side of the frame unit surrounding the LED unit serves as a reflector.

In some embodiments, the reflector has a section perpendicular to a normal line of the main surface, a dimension of the section decreasing as the section becomes more spaced apart from the main surface.

In some embodiments, the LED module further includes a transparent resin filling a region surrounded by the frame unit and covering the LED unit, the transparent resin being formed of resin material transmitting light from the LED unit and fluorescent material emitting, when excited by the light emitted from the LED unit, light having a wavelength different from a wavelength of the light emitted from the LED unit.

With this configuration, heat generated from the LED unit can be transferred to the bottom surface of the case via the pads, the main surface exposed portion and the bottom surface reaching portion, which results in an improvement in heat radiation of the LED module.

According to another aspect of the present disclosure, there is provided an LED module including an LED unit having one or more LED chips and a case. The case may include one or more pads mounting thereon the LED unit, a base plate having a main surface on which the pads are formed and a bottom surface opposite to the main surface, and a frame unit bonded to the main surface and surrounding the LED unit. The base plate may be made of ceramic and the frame unit may be made of resin.

In some embodiments, an inner side of the frame unit surrounds the LED unit.

In some embodiments, the reflector has a section perpendicular to a normal line of the main surface, a dimension of the section decreasing as the section becomes more spaced apart from the main surface.

In some embodiments, the LED module further includes a transparent resin filling a region surrounded by the frame unit and covering the LED unit, the transparent resin being formed of a resin material transmitting light emitted from the LED unit and fluorescent material emitting, when excited by the light emitted from the LED unit, light having a wavelength different from a wavelength of the light emitted from the LED unit.

In some embodiments, the case further includes a through conductor making conductive connection with the pads and penetrating through the base plate, the through conductor having a main surface exposed portion exposed to the main surface and overlapping the LED unit when viewed from top, and a bottom surface reaching portion connected to the main surface exposed portion and reaching the bottom surface. The bottom surface reaching portion does not overlap with the LED unit when viewed from top. The pads cover at least a portion of the main surface exposed portion.

In some embodiments, the main surface exposed portion contains the LED unit when viewed from top.

In some embodiments, at least a portion of the bottom surface reaching portion does not overlap the LED unit.

In some embodiments, the pads cover the main surface exposed portion such that the main surface exposed portion is not exposed.

In some embodiments, the through conductor is made of Ag.

In some embodiments, each of the pads has a surface made of Au.

In some embodiments, a mounting electrode making a conductive connection with the through conductor is formed on the bottom surface of the base plate.

With this configuration, heat generated from the LED unit can be transferred to the bottom surface of the case via the pads, the main surface exposed portion and the bottom surface reaching portion, which results in an improvement in heat radiation of the LED module.

Further, since the ceramic is not noticeably thermally-deformed because of its relatively low thermal expansion, the case can be prevented from becoming unduly deformed even if the LED module is designed to have high luminance, where the amount of heat generated from the LED unit tends to increase. Furthermore, very little heat generated from the LED unit is transferred to the frame unit. This reduces the likelihood of producing excessive thermal deformation, even if the frame unit is made of resin. Furthermore, the resin of which the frame unit is made is higher in reflectivity than ceramic. This facilitates the achievement of high luminance of the LED module.

According to another aspect of the present disclosure, there is provided an LED module including a first LED chip, a first fluorescent resin covering the first LED chip and a case supporting the first fluorescent resin. The first fluorescent resin may generate a first fluorescent light when excited by light from the first LED chip, and light having a first color temperature may be emitted when the light from the first LED chip is mixed with the first fluorescent light. The LED module may further include a second LED chip and a second fluorescent resin covering the second LED chip. The second fluorescent resin may generate a second fluorescent light when excited by light from the second LED chip, and light having a second color temperature different from the first color temperature may be emitted when the light from the second LED chip is mixed with the second fluorescent light.

With this configuration, by emitting light having the first color temperature and light having the second color temperature simultaneously, light having a color temperature between the first and the second color temperature can be provided. Accordingly, the LED module of the present disclosure can provide light having a color temperature which is difficult to obtain by conventional LED modules emitting light having a single color temperature, by mixing lights having two or more color temperatures. Accordingly, the present disclosure can provide light having a more preferable color temperature which cannot be provided by conventional LED modules.

In some embodiments, the case has a first opening exposing the first LED chip and a second opening exposing the second LED chip, and the first fluorescent resin fills the first opening and the second fluorescent resin fills the second opening.

In some embodiments, the case includes a base plate having a main surface and a bottom surface opposite to the main surface, and a frame unit in which the first and the second opening are formed. The first and the second LED chip may be disposed on the main surface, and the frame unit may be arranged such that the first and the second opening expose the main surface.

In some embodiments, the frame unit includes an outer frame and a partition formed inside the outer frame. The partition may be interposed between the first and the second opening in a first direction.

In some embodiments, the frame has a first inner side located at one side of the partition in the first direction and a second inner side located at the other side of the partition in the first direction, the partition has a first side and a second side located at the other side of the first side in the first direction, the first opening is defined by the first inner side and the first side, and the second opening is defined by the second inner side and the second side.

In some embodiments, the first inner side is inclined in such a manner that it becomes farther away from the first LED unit in the first direction as it moves farther away from the main surface in a direction perpendicular to the main surface, and the second inner side is inclined in such a manner that it becomes farther away from the second LED unit in the first direction as it moves farther away from the main surface in the direction perpendicular to the main surface.

In some embodiments, the first side is inclined in such a manner that it becomes closer to the main surface in the direction perpendicular to the main surface as it moves toward one side in the first direction, and the second side is inclined in such a manner that it becomes closer to the main surface in the direction perpendicular to the main surface as it moves toward the other side in the first direction.

In some embodiments, each of the first LED chip and the second LED chip includes a first electrode and a second electrode. The case may include a first mounting electrode making conductive connection with the first electrode of the first LED chip, a second mounting electrode making conductive connection with the second electrode of the first LED chip and the second electrode of the second LED chip, and a third mounting electrode making conductive connection with the first electrode of the second LED chip, and the first to third mounting electrodes may be spaced apart from each other.

In some embodiments, the second electrode of the second LED chip makes conductive connection with the second mounting electrode.

In some embodiments, the first to third mounting electrodes are disposed on the bottom surface.

In some embodiments, the second mounting electrode is interposed between the first mounting electrode and the third mounting electrode in the first direction.

In some embodiments, the first mounting electrode is located at one side of the second mounting electrode in the first direction, the third mounting electrode is located at the other side of the second mounting electrode in the first direction, the second electrode of the first LED chip is located at the other side of the first LED chip with respect to the first electrode of the first LED chip in the first direction, and the second electrode of the second LED chip is located at the other side of the second LED chip with respect to the first electrode of the second LED chip in the first direction.

In some embodiments, the case includes a first bonding pad disposed on the main surface and covered by the first fluorescent resin and a second bonding pad disposed on the main surface and covered by the second fluorescent resin. The first bonding pad may be located at one side of the first LED chip in the first direction and make conductive connection with the first mounting electrode, and the second bonding pad may be located at the other side of the second LED chip in the first direction and make conductive connection with the third mounting electrode. The case further includes a first wire making conductive connection between the first electrode of the first LED chip and the first bonding pad, and a second wire making conductive connection between the first electrode of the second LED chip and the second bonding pad.

In some embodiments, the LED unit further includes a first additional LED chip covered by the first fluorescent resin and having a first electrode making conductive connection with the first mounting electrode and a second electrode making conductive connection with the second mounting electrode. The first additional LED chip may be disposed in a position different from the first LED chip in the first direction and different from the first LED chip in a second direction perpendicular to the first direction.

In some embodiments, the LED unit further includes a second addition LED chip covered by the second fluorescent resin and having a first electrode making conductive connection with the third mounting electrode and a second electrode making conductive connection with the second mounting electrode. The second additional LED chip may be disposed in a position different from the second LED chip in the first direction and different from the second LED chip in a second direction perpendicular to the first direction.

In some embodiments, the case includes a first bonding pad disposed on the main surface and covered by the first fluorescent resin and a second bonding pad disposed on the main surface and covered by the second fluorescent resin. The first bonding pad may be located at one side of the first LED chip in the first direction and make conductive connection with the first mounting electrode, and the second bonding pad may be located at the other side of the second LED chip in the first direction and make conductive connection with the third mounting electrode. The case may further include a first wire making a conductive connection between the first electrode of the first LED chip and the first bonding pad, a first additional wire making a conductive connection between the first electrode of the first additional LED chip and the first bonding pad, a second wire making a conductive connection between the first electrode of the second LED chip and the second bonding pad, and a second additional wire making a conductive connection between the first electrode of the second additional LED chip and the second bonding pad.

In some embodiments, the width of the partition in the first direction is smaller than that of the outer frame.

In some embodiments, the LED unit further includes a third LED chip disposed on the main surface, and the case further includes a third opening exposing the third LED chip and a third fluorescent resin filling the third opening.

In some embodiments, the frame unit includes an additional partition interposed between the second opening and the third opening in the first direction.

In some embodiments, the first color temperature is lower than the second color temperature, and the third fluorescent resin emits the first fluorescent light when excited by light from the third LED chip.

In some embodiments, the frame unit includes an additional partition interposed between the second opening and the third opening in a second direction perpendicular to the first direction.

In some embodiments, the first color temperature is lower than the second color temperature, and the third fluorescent resin emits the second fluorescent light when excited by light from the third LED chip.

In some embodiments, the LED unit further includes a fourth LED chip disposed on the main surface, and the case further includes a fourth opening exposing the fourth LED chip and a fourth fluorescent resin filling the fourth opening. The partition may be interposed between the third opening and the fourth opening in the first direction, and the frame unit may include an additional partition interposed between the first opening and the fourth opening in the second direction perpendicular to the first direction.

According to another aspect of the present disclosure, there is provided an LED module including one or more LED chips, a supporting member mounting thereon the LED chips and having a reflecting surface surrounding the LED chips, a sealing resin filling a space surrounded by the reflecting surface and transmitting light from the LED chips. The reflecting surface may have unevenness to scatter the light from the LED chips.

In some embodiments, the reflecting surface is made of resin.

In some embodiments, the resin is white.

In some embodiments, the roughness of the reflecting surface is 1 µm to 10 µm in Ry (maximum height).

In some embodiments, the supporting member includes a substrate having a base and a wiring pattern and mounting thereon the LED chips and a reflector formed on the substrate and having the reflecting surface.

In some embodiments, the supporting member includes a plurality of leads mounting thereon the LED chips and a reflector having the reflecting surface and covering some of the leads.

In some embodiments, each of the LED chips includes a submount substrate made of Si and a semiconductor layer stacked on the submount substrate.

In some embodiments, the LED module further includes two wires connecting the submount substrate and the supporting member.

In some embodiments, the LED module further includes one wire connecting the submount substrate and the supporting member.

In some embodiments, two electrode pads are formed on a surface of the submount substrate, the surface opposite to a surface on which the semiconductor layer is stacked, and the two electrodes are bonded to and make conductive connection with the supporting member.

In some embodiments, each of the LED chips includes two electrode pads bonded to the semiconductor layer and the supporting member.

In some embodiments, a surface of the semiconductor layer opposite to the supporting member includes an uneven surface.

In some embodiments, the roughness of the uneven surface of the semiconductor layer is 1 µm to 10 µm in Ry (maximum height).

In some embodiments, the semiconductor layer emits blue light or green light.

In some embodiments, mixed in the sealing resin is fluorescent material emitting light having a wavelength different from a wavelength of light from the LED chips when the sealing resin is excited by the light from the LED chips.

In some embodiments, the fluorescent material emits yellow light.

With this configuration, light propagating within the LED chips to the reflecting surface is scattered by the reflecting surface. The scattered light includes light having an incidence angle smaller than a critical angle to the top side of the sealing resin and is not totally reflected. This facilitates reliable emission of some light propagating onto the reflecting surface from the sealing resin, which results in compactness and high luminance of the LED module.

According to another aspect of the present disclosure, there is provided an LED module emitting white light, the LED module including a semiconductor light emitting device having an output peak wavelength of 440 nm to 485 nm and a fluorescent portion having a first and a second fluorescent material disposed to receive light from the semiconductor light emitting device. When the fluorescent portion is excited by the light from the semiconductor light emitting device, the first fluorescent material emits light having a peak wavelength equal to or greater than 655 nm and the second fluorescent material emits light having a peak wavelength equal to or less than 565 nm.

In some embodiments, the peak wavelength of the light emitted from the first fluorescent material is equal to or less than 700 nm and the peak wavelength of the light emitted from the second fluorescent material is equal to or greater than 500 nm.

In some embodiments, the peak wavelength of the light emitted from the second fluorescent material is equal to or less than 525 nm.

In some embodiments, a mixture ratio of the second fluorescent material to the first fluorescent material is 5.5 to 7.0.

According to another aspect of the present disclosure, there is provided an LED module emitting white light, the LED module including a semiconductor light emitting device having an output peak wavelength of 440 nm to 485 nm and a fluorescent portion having a first and a second fluorescent material disposed to receive light from the semiconductor light emitting device. When the fluorescent portion is excited by the light from the semiconductor light emitting device, the first fluorescent material emits light having a peak wavelength equal to or greater than 625 nm and the second fluorescent material emits light having a peak wavelength equal to or less than 520 nm.

In some embodiments, the peak wavelength of the light emitted from the first fluorescent material is equal to or less than 700 nm and the peak wavelength of the light emitted from the second fluorescent material is equal to or greater than 500 nm.

In some embodiments, the peak wavelength of the light emitted from the first fluorescent material is equal to or greater than 645 nm.

In some embodiments, the output peak wavelength of the semiconductor light emitting device is 445 nm to 465 nm.

In some embodiments, a mixture ratio of the second fluorescent material to the first fluorescent material is 5.0 to 6.5.

According to another aspect of the present disclosure, there is provided an LED module emitting white light, the LED module including a semiconductor light emitting device having an output peak wavelength of 440 nm to 485 nm and a fluorescent portion having a first and a second fluorescent material disposed to receive light from the semiconductor light emitting device. When the fluorescent portion is excited by the light from the semiconductor light emitting device, the first fluorescent material emits light having a peak wavelength equal to or greater than 625 nm and the second fluorescent material emits light having a peak wavelength equal to or less than 565 nm, wherein a difference in the peak wavelengths between the light from the first fluorescent material and the light from the second fluorescent material is equal to or greater than 120 nm.

In some embodiments, the peak wavelength of the light emitted from the first fluorescent material is equal to or less than 700 nm and the peak wavelength of the light emitted from the second fluorescent material is equal to or greater than 500 nm.

In some embodiments, a mixture ratio of the second fluorescent material to the first fluorescent material is 5.0 to 7.5.

In some embodiments, the output peak wavelength of the semiconductor light emitting device is 445 nm to 465 nm.

According to another aspect of the present disclosure, there is provided an LED module emitting white light, the LED module including a semiconductor light emitting device having an output peak wavelength of 440 nm to 485 nm and a fluorescent portion having a first and a second fluorescent material disposed to receive light from the semiconductor light emitting device. When the fluorescent portion is excited by the light from the semiconductor light emitting device, the first fluorescent material emits light having a peak wavelength equal to or greater than 625 nm and the second fluorescent material emits light having a peak wavelength equal to or less than 565 nm, wherein a mixture ratio of the second fluorescent material to the first fluorescent material is 6.8 to 7.2.

In some embodiments, the peak wavelength of the light emitted from the first fluorescent material is equal to or less than 645 nm In some embodiments, the peak wavelength of the light emitted from the second fluorescent material is equal to or greater than 530 nm.

According to another aspect of the present disclosure, there is provided an LED module emitting white light, the LED including a semiconductor light emitting device having an output peak wavelength of 440 nm to 485 nm and a fluorescent portion having a first and a second fluorescent material disposed to receive light from the semiconductor light emitting device. When the fluorescent portion is excited by the light from the semiconductor light emitting device, the first fluorescent material emits light having a peak wavelength of 640 nm to 675 nm and the second fluorescent material emits light having a peak wavelength of 500 nm to 535 nm, wherein a mixture ratio of the second fluorescent material to the first fluorescent material is 5.0 to 7.5.

In some embodiments, the output peak wavelength of the semiconductor light emitting device is 440 nm to 470 nm, peak wavelength of the light emitted from the first fluorescent material is 640 nm to 655 nm, the peak wavelength of the light emitted from the second fluorescent material is 520 nm to 530 nm, and the mixture ratio of the second fluorescent material to the first fluorescent material is 6.5 to 7.5.

In some embodiments, the output peak wavelength of the semiconductor light emitting device is 440 nm to 470 nm, the peak wavelength of the light emitted from the first fluorescent material is 645 nm to 655 nm, and the mixture ratio of the second fluorescent material to the first fluorescent material is 5.5 to 7.5.

In some embodiments, the output peak wavelength of the semiconductor light emitting device is 440 nm to 470 nm, the peak wavelength of the light emitted from the second fluorescent material is 520 nm to 530 nm, and the mixture ratio of the second fluorescent material to the first fluorescent material is 5.5 to 7.5.

In some embodiments, the output peak wavelength of the semiconductor light emitting device is 440 nm to 470 nm, the peak wavelength of the light emitted from the first fluorescent material is 645 nm to 655 nm, and the peak wavelength of the light emitted from the second fluorescent material is 520 nm to 530 nm.

In some embodiments, the first and the second fluorescent material are uniformly distributed in the fluorescent portion.

With this configuration, an Ra value of light emitted from the LED module can be increased and the LED mode suitable for applications placing stress on color rendition can be provided.

These and other features and advantages of the present disclosure are apparent from the following detailed description in conjunction with the accompanying, drawings.

BRIEF DESCRIPTION OF THE DRAWINGS

FIG. 73 is a table of the 23rd embodiment of the present disclosure, showing a relationship between a peak wavelength of a light emitting device, peak wavelengths of red fluorescent material and green fluorescent material, and an Ra value.

DETAILED DESCRIPTION

Figure 1:
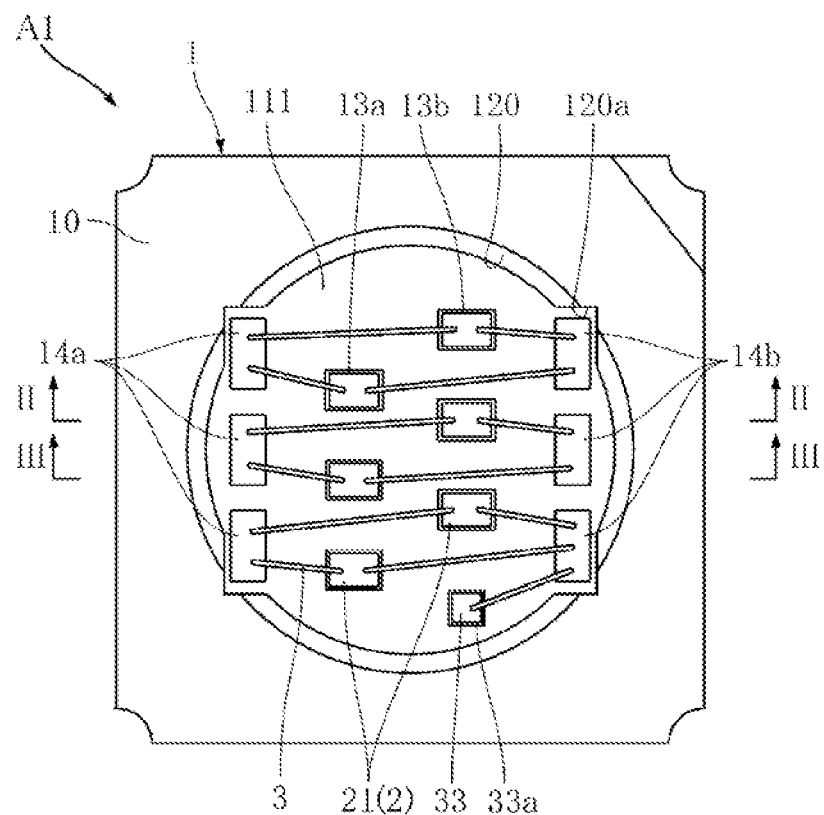
FIG. 1 is a plan view showing an LED module according to a first embodiment of the present disclosure.

Preferred embodiments of the present disclosure will now be described in detail with reference to the drawings.

First, LED modules which are capable of achieving high luminance and high heat radiation will be described in detail with reference to FIGS. 1 to 22.

FIGS. 1 to 6 show one example of an LED module according to an embodiment of the present disclosure. In this embodiment, an LED module A1 includes a case 1, a plurality of LED units 2, a zener diode 33, wires 3 and transparent resin 5 (not shown in FIG. 1). The LED module A1 is a high power type LED module having relatively high luminance and has the dimensions of a square of 5 mm×5 mm and a thickness of about 0.9 mm when viewed from top.

The case 1 includes a body 10, a plurality of pads 13a and 13b, a plurality of bonding pads 14a and 14b, a pad 33a, a pair of mounting electrodes 150a and 150b and a plurality of through conductors 15a, 15b, 15c and 15d.

The body 10 includes a base plate 11 and a frame unit 12. The base plate 11 is of a rectangular plate shape and is made of a white ceramic such as alumina or the like. The base plate 11 has a main surface 111 and a bottom surface 112. The frame unit 12 is bonded to the main surface 111 of the base plate 11 and has a frame shape when viewed from top. The frame unit 12 is made of a white resin such as epoxy resin, silicone resin, liquid crystal polymer (LCP), polyphthalamide (PPA) or the like, which is higher in reflectivity than ceramic. An inner side of the frame unit 12 corresponds to a reflector 120. The reflector 120 reflects light, which propagates from a plurality of LED chips 21 in the left/right direction in FIG. 2, into the upper side of FIG. 2. The reflector 120 is tapered in such a manner that the dimensions of a section perpendicular to the normal line of the main surface 111 decreases as the reflector 120 is farther away from the main surface 111. In this embodiment, the reflector 120 is formed with four concave portions 120a. Each of the four concave portions 120a has a sectional shape which is substantially triangular when viewed from top, and extends to reach the main surface 111. The main surface 111 is substantially circular and is connected to a bottom edge of the reflector 120.

The plurality of pads 13a and 13b (three pads 13a and three pads 13b in this embodiment) is arranged in two lines on the main surface 111. Each of the pads 13a and 13b has a rectangular shape and is formed of a plating layer made of, for example, Ni and Au stacked in order from the main surface 111. If the top surface of the plating layer is made of Au, the thickness oldie Au layer may be about 0.1 μm.

The plurality of bonding pads 14a and 14b (three bonding pads 14a and three bonding pads 14b in this embodiment) is arranged in two columns on the main surface 111. Each of the bonding pads 14a and 14b has a rectangular shape and has the same plating structure as that of the pads 13a and 13b. About one-third of the area of the bonding pads 14a and 14b located at four corners is accommodated in the four concave portions 120a.

The pad 33a is disposed near an edge of the main surface 111 and has the same plating structure as that of the pads 13a and 13b and the bonding pads 14a and 14b.

Figure 6:
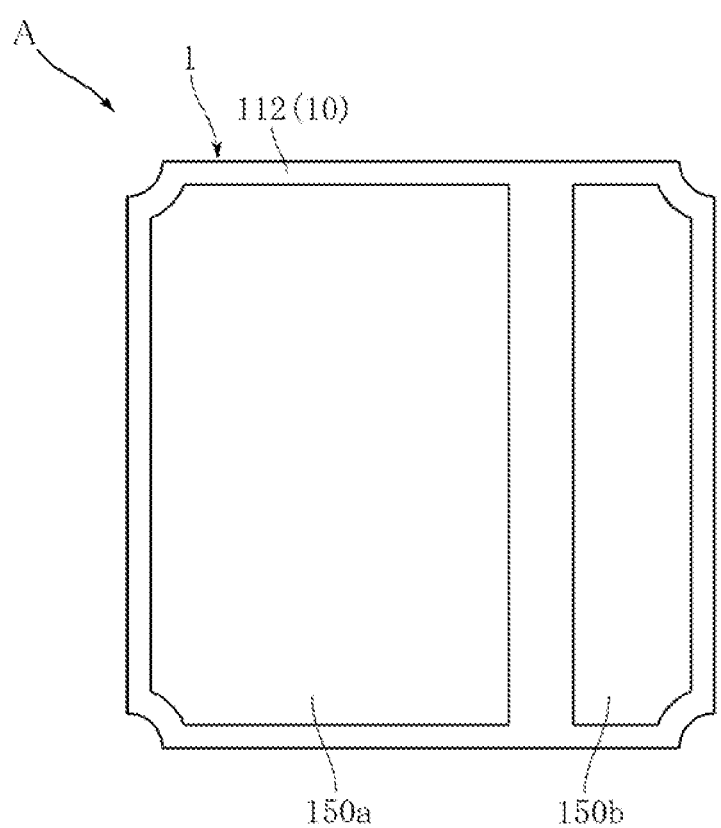
FIG. 6 is a bottom view showing the LED module according to the first embodiment of the present disclosure.
Figure 7:
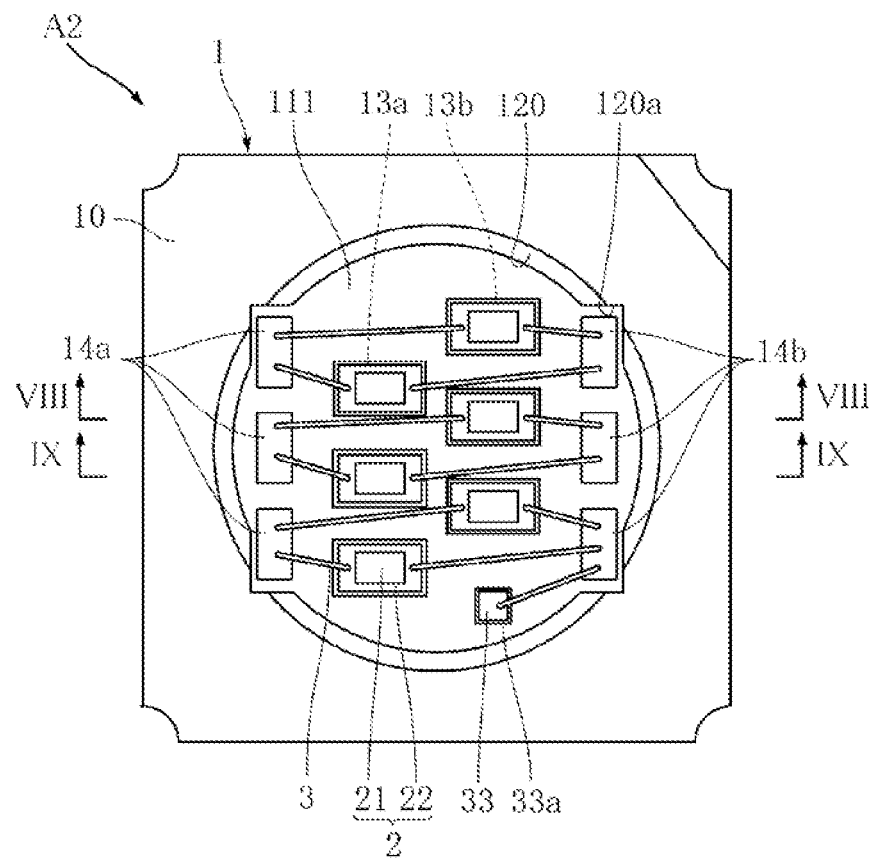
FIG. 7 is a plan view showing an LED module according to a second embodiment of the present disclosure.
Figure 8:
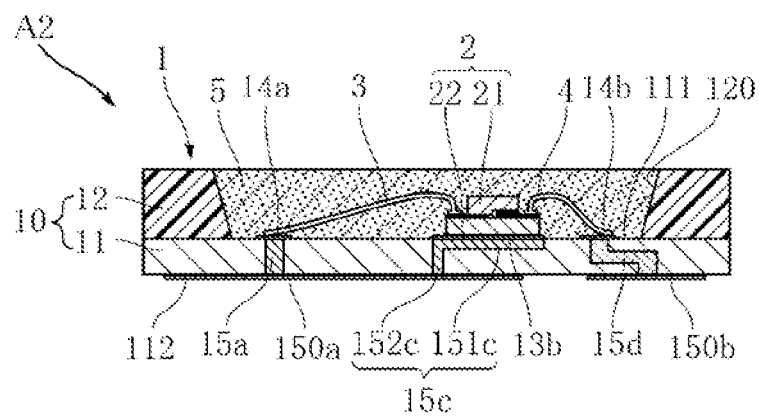
FIG. 8 is a sectional view taken along line VIII-VIII in FIG. 7.
Figure 9:
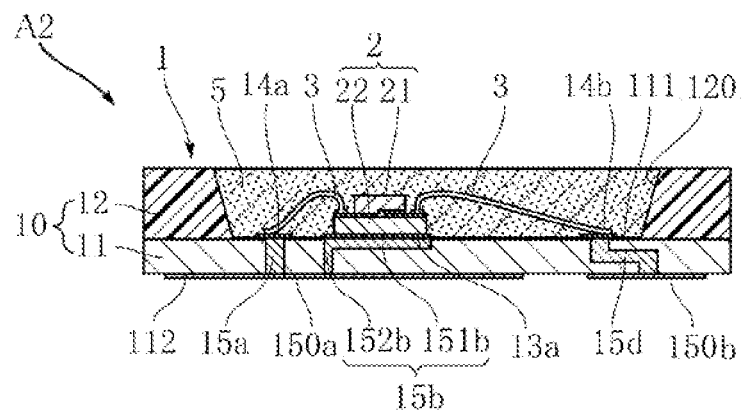
FIG. 9 is a sectional view taken along line IX-IX in FIG. 7.

As shown in FIG. 6, the pair of mounting electrodes 150a and 150b is formed on the bottom Surface 112, opposite to the side where the reflector 120 and the main surface 111 are formed in the body 10, and has a rectangular shape. In FIG. 6, the mounting electrode 150a is particularly larger than the mounting electrode 150b and overlaps the plurality of LED chips 21 when viewed from top.

The through conductors 15a, 15b, 15c and 15d pass through the body 10 and are made of for example, Ag or W. In this embodiment, three through conductors 15a connect the three bonding pads 14a and the mounting electrode 150a. Three through conductors 15b connect the three pads 13a and the mounting electrode 150a. Three through conductors 15c connect the three pads 13b and the mounting electrode 150a. One through conductor 15c connects the pad 33a and the mounting electrode 150a. Three through conductors 15d connect the three bonding pads 14b and the mounting electrode 150b, and are formed in a crank shape.

Figure 2:
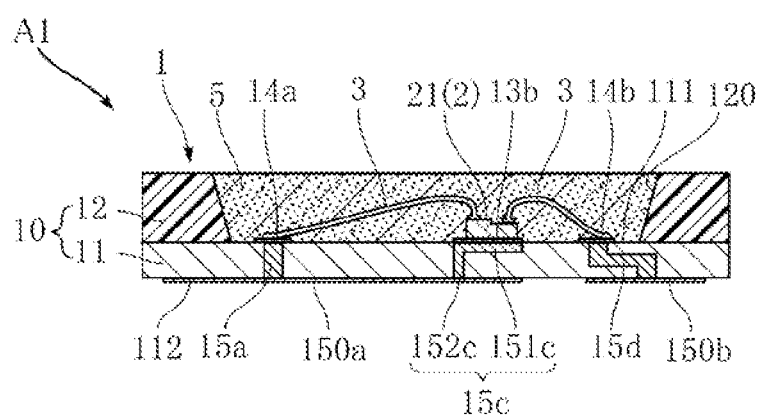
FIG. 2 is a sectional view taken along line II-II in FIG. 1.
Figure 3:
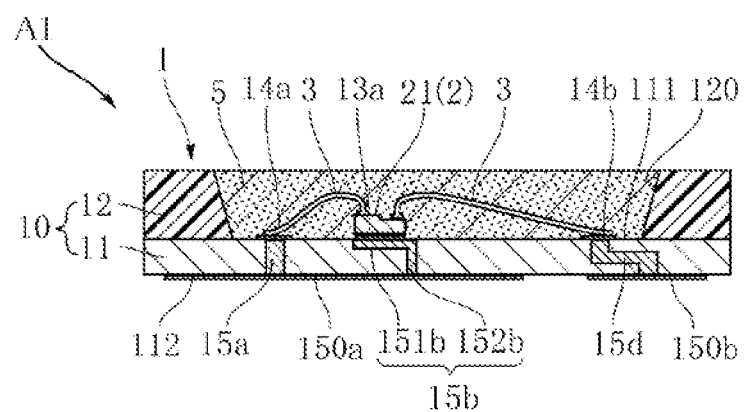
FIG. 3 is a sectional view taken along line III-III in FIG. 1.

The through conductors 15b and 15c include main surface exposed portions 151b and 151c and bottom surface reaching portions 152b and 152c, respectively. As shown in FIGS. 2 and 3, the main surface exposed portions 151b and 151c are exposed to the main surface 111 and have a plate shape whose dimension is relatively small in the thickness direction of the base plate 11 but relatively large when viewed from top. The bottom surface reaching portions 152b and 152c are connected to the bottom surfaces of the main surface exposed portions 151b and 151c, respectively, and their bottoms reach the bottom surface 112. The bottom surface reaching portions 152b and 152c have a cylindrical shape whose dimension is relatively small in the thickness direction of the base plate 11 and relatively small when viewed from top. In this embodiment, the main surface exposed portions 151b and 151c are larger than the LED unit 2 when viewed from top and contain the LED unit 2 when viewed from top. In addition, the bottom surface reaching portions 152b and 152c are deviated from the LED unit 2 when viewed from top.

The base plate 11 and the through conductors 15a, 15b, 15c and 15d may be formed for example, by firing a ceramic material and Ag or W material, which are stacked in appropriate order. The pads 13a and 13b, the bonding pads 14a and 14b, and the mounting electrodes 150a and 150b may be formed by plating with respect to the base plate 11. In addition, the case 1 may be obtained by bonding the frame unit 12 made of resin to the base plate 11.

Figure 4:
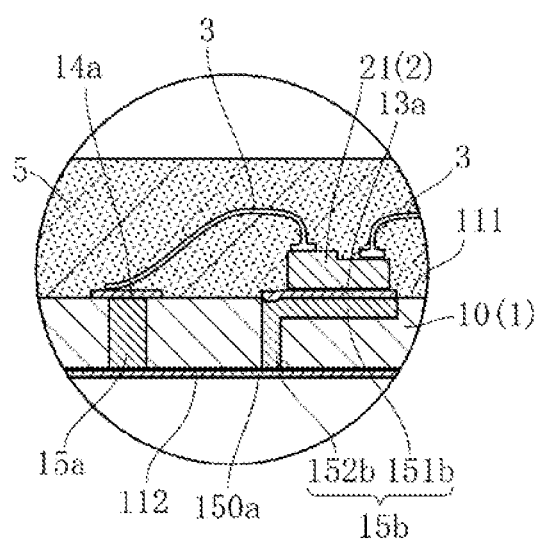
FIG. 4 is a main part enlarged sectional view showing the LED module according to the first embodiment of the present disclosure.
Figure 5:
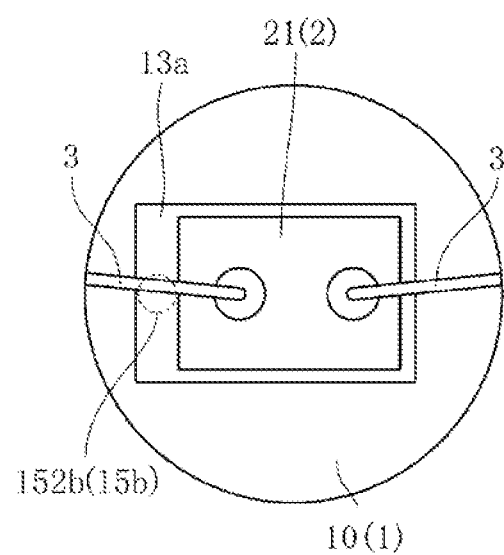
FIG. 5 is a main part enlarged plan view showing the LED module according to the first embodiment of the present disclosure.

In this embodiment, the main surface exposed portion 151b is entirely covered by the pad 13a and the main surface exposed portion 151c is entirely covered by the pad 13b. As shown in FIG. 4, a portion of the upper side of the main surface exposed portion 151b overlapping the bottom surface reaching portion 152b when viewed from top has a caved shape, and a portion of the pad 13a overlapping the portion oldie upper side of the main surface exposed portion 151b also has a caved shape. It is believed that the caved shapes result from the remains of a caved liquid level of liquefied Ag or W material during a firing step in the manufacturing process of the case 1. In addition, since the pad 13a is formed by plating, the upper side of the pad 13a has a caved shape according to the cave formed in the through conductor 15b. This is equally applied to the main surface exposed portion 151c and the bottom surface reaching portion 152c.

The plurality of LED units 2 serves as a light source of the LED module A1 and includes a plurality of LED chips 21 in this embodiment. Each of the LED chips 21 includes an n-type semiconductor layer made of, for example, a GaN semiconductor, a p-type semiconductor layer made of, for example, a GaN semiconductor, and an active layer interposed therebetween; and emits blue light. Each of the LED chips 21 is eutectically bonded to the pads 13a and 13b. When viewed from top, the dimensions of each of the LED chips 21 is smaller than the dimensions of the pads 13a and 13b. That is, the outer edges of the pads 13a and 13b when viewed from top are located a little outside of the outer edges of each of the LED chips 21. In this embodiment, each of the LED chips 21 is a so-called 2-wire type LED chip.

The zener diode 33 serves to prevent an excessive reverse voltage from being applied to the plurality of LED chips 21 and acts to flow a reverse current only when a reverse voltage exceeding a predetermined voltage is applied. The zener diode 33 is bonded to the pad 33a via, for example, Ag paste.

The plurality of wires 3 is made of, for example, Au and has one end bonded to the bonding pads 14a and 14b and the other end bonded to the LED chip 21 or the zener diode 33.

A region surrounded by the reflector 120 and the main surface 111 is filled with the transparent resin 5 to cover the plurality of LED chips 21, the zener diode 33 and the plurality of wires 3. The transparent resin 5 is made of, for example, a mixture of transparent silicone resin and fluorescent material. The fluorescent material emits yellow light, for example, when it is excited by the blue light from the LED chips 21. When the yellow light is mixed with the blue light from the LED chips 21, white light is emitted from the LED module A1. Alternatives to the above-mentioned fluorescent material may include a fluorescent material emitting red light and a fluorescent material emitting green light when they are excited by the blue light.

Next, operation of the LED module A1 will be described.

In this embodiment, the LED unit 2 is supported by the main surface exposed portions 151b and 151c via the pads 13a and 13b. This facilitates the transfer of heat from the LED unit 2 to the bottom surface 112 via the main surface exposed portions 151b and 151c and the bottom surface reaching portions 152b and 152c, which may result in high heat radiation of the LED module A1.

As shown in FIG. 4, the bottom surface reaching portions 152b and 152c are likely to cause caves in the main surface exposed portions 151b and 151c, respectively. In many cases, these caves may lead to caves in the surfaces of the pads 13a and 13b. When the bottom surface exposed portions 152b and 152c are deviated from the LED unit 2 when viewed from top, the caves of the pads 13a and 13b are not covered by the LED unit 2. This can prevent the LED unit 2 and the pads 13a and 13b from having a gap therebetween.

The main surface exposed portions 151b and 151c are larger in dimension than the bottom surface reaching portions 152b and 152c when viewed from top. This reduces the likelihood of producing noticeable caves. The main surface exposed portions 151b and 151c have a size and position which enables the LED unit 2 to be contained thereon when viewed from top, and the portions of the surfaces of the pads 13a and 13b that overlap with the LED unit 2 to have a flat shape. This facilitates stable mounting of the LED unit 2.

The base plate 11 made of ceramic is not noticeably thermally-deformed because of its relatively low rate of thermal expansion. This can prevent the case 1 from becoming unduly deformed, even if the LED module A1 is designed to have high luminance, where the amount of heat generated from the LED unit 2 tends to increase. Very little heat from the LED unit 2 is transferred to the frame unit 12. This reduces the likelihood of producing excessive thermal deformation of the frame unit 12, even if the frame unit 12 is made of resin. A white resin of which the frame unit 12 is made, such as epoxy resin, silicone resin, liquid crystal polymer (LCP) or polyphthalamide (PPA) resin, is higher in reflectivity than ceramic such as alumina. This facilitates the achievement of high luminance of the LED module A1.

FIGS. 7 to 22 show other embodiments of the present disclosure. In FIGS. 7 to 22, the same or similar elements as the above-described embodiments are denoted by the same reference numerals.

FIGS. 7 to 10 show an LED module according to a second embodiment of the present disclosure. An LED module A2 of this embodiment is different in configuration of the LED units 2 from those of the above-described embodiments. In this embodiment, each of the LED units 2 includes an LED chip 21 and a submount substrate 22.

Figure 10:
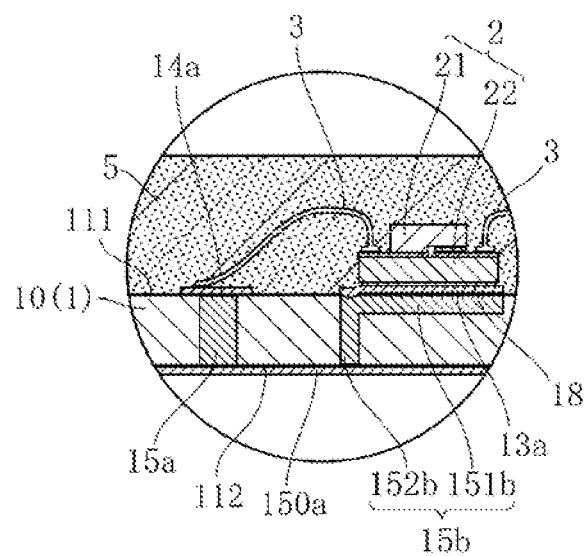
FIG. 10 is a main part enlarged sectional view showing the LED module according to the second embodiment of the present disclosure.
Figure 11:
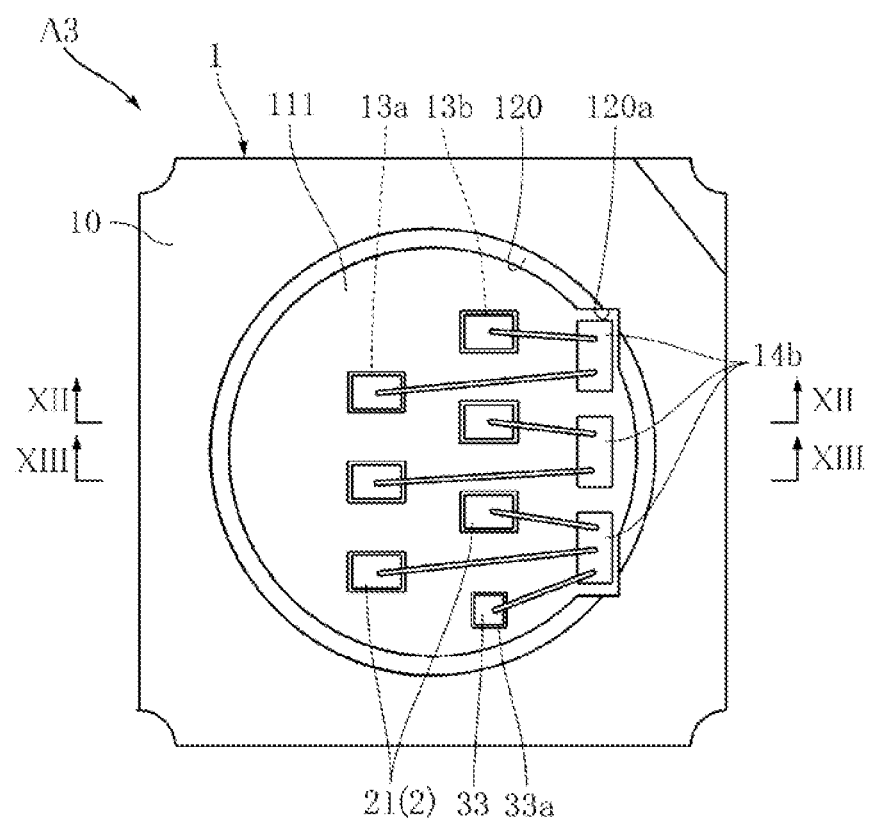
FIG. 11 is a plan view showing an LED module according to a third embodiment of the present disclosure.
Figure 12:
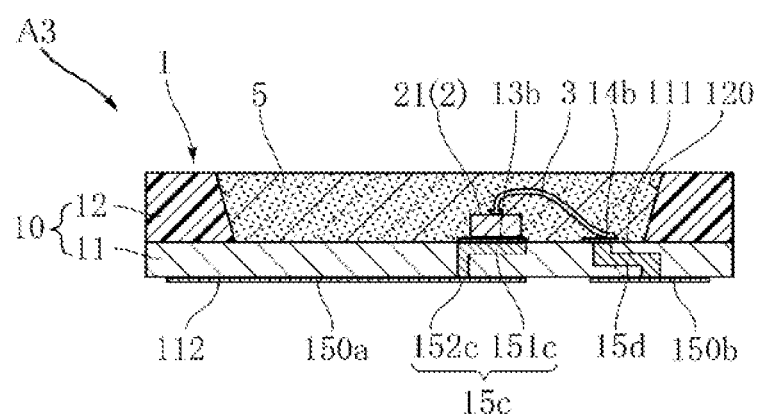
FIG. 12 is a sectional view taken along line XII-XII in FIG. 11.
Figure 13:
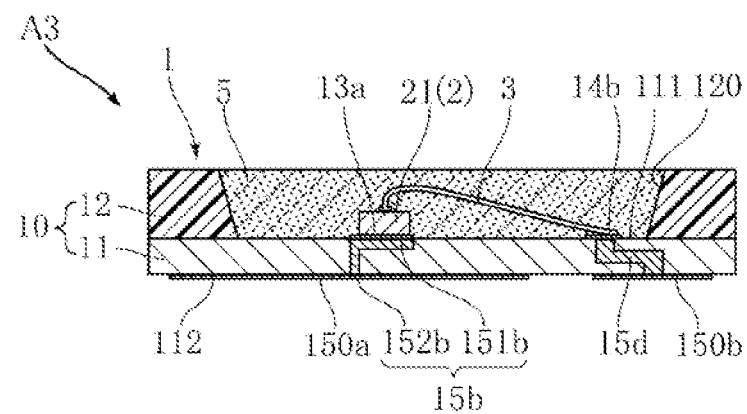
FIG. 13 is a sectional view taken along line XIII-XIII in FIG. 11.
Figure 14:
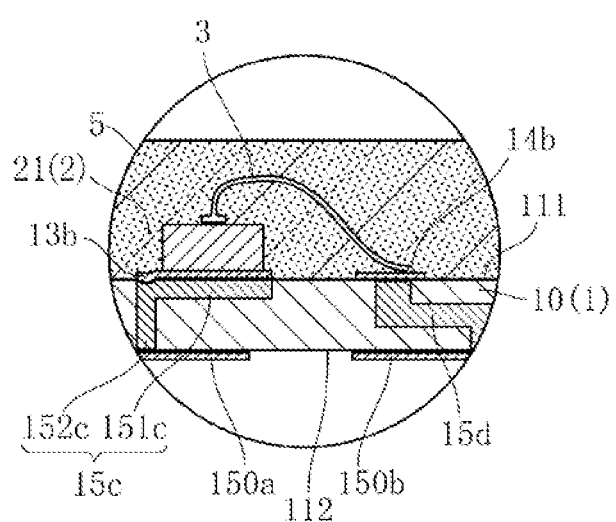
FIG. 14 is a main pan enlarged sectional view showing the LED module according to the third embodiment of the present disclosure.
Figure 15:
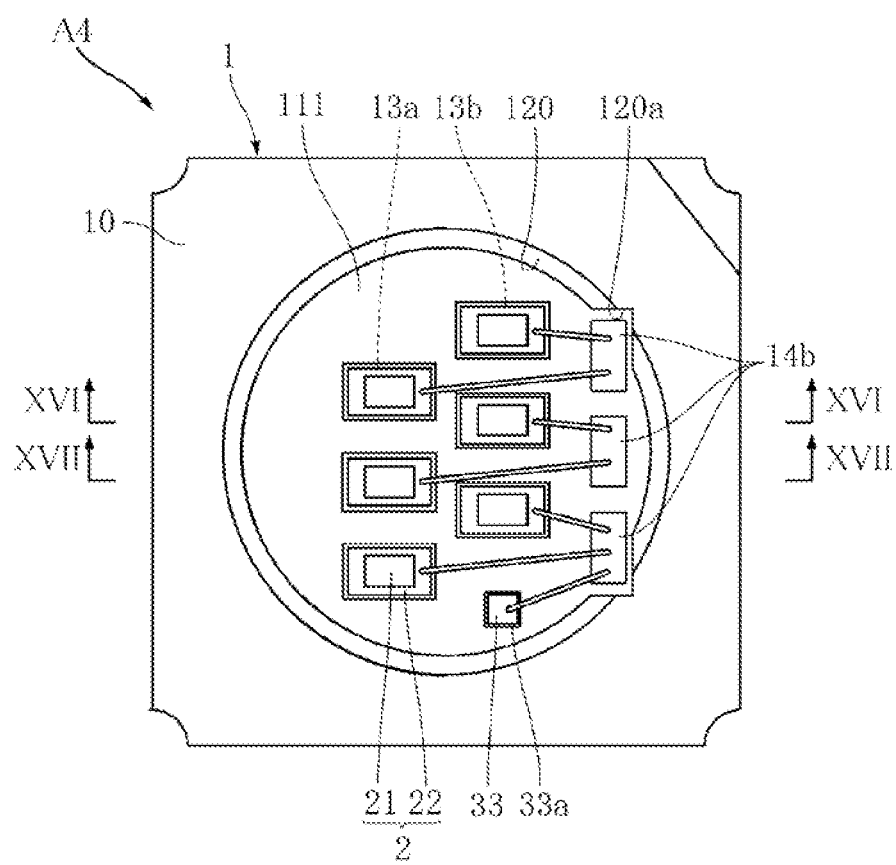
FIG. 15 is a plan view showing an LED module according to a fourth embodiment of the present disclosure.
Figure 16:
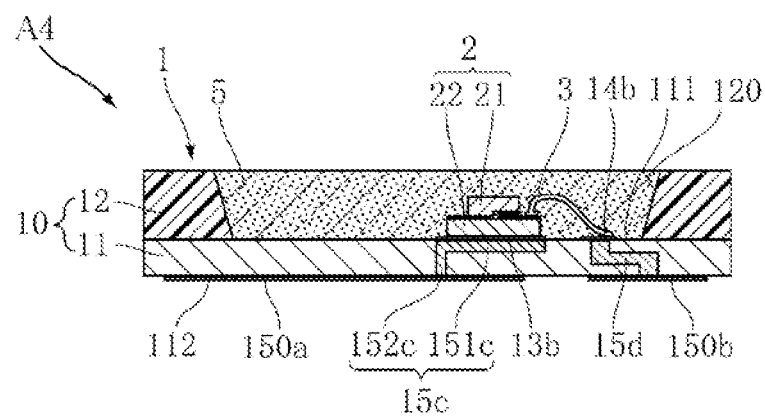
FIG. 16 is a sectional view taken along line XVI-XVI in FIG. 15.
Figure 17:
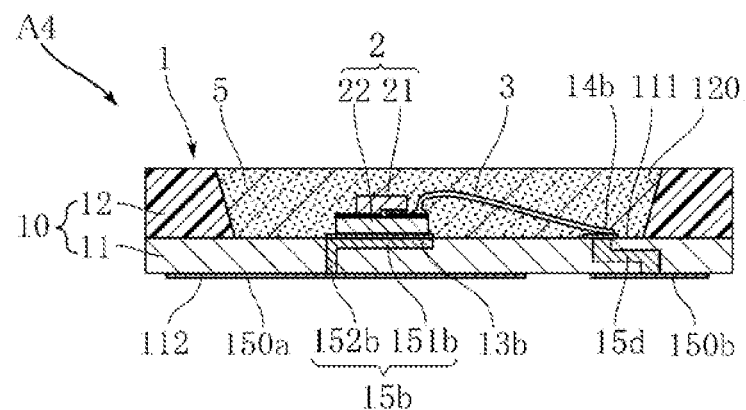
FIG. 17 is a sectional view taken along line XVII-XVII in FIG. 15.
Figure 18:
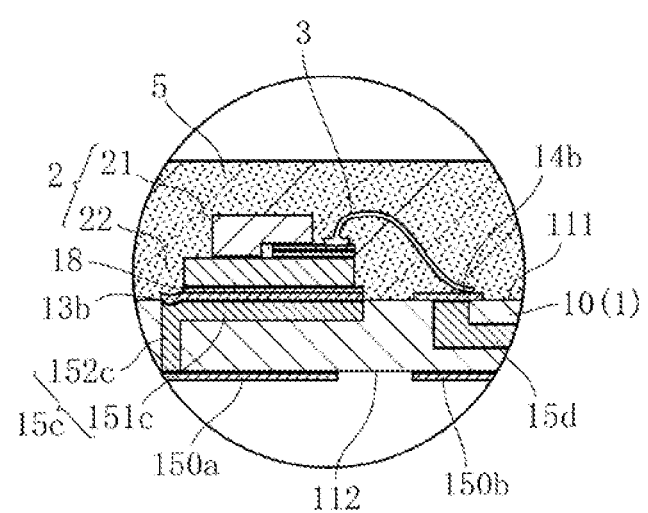
FIG. 18 is a main part enlarged sectional view showing the LED module according to the fourth embodiment of the present disclosure.

The submount substrate 22 is made of, for example, Si, and is mounted with the LED chip 21. The submount substrate 22 is formed with a wiring pattern. This wiring pattern has a portion which makes conductive connection with the electrodes (not shown) of the LED chip 21 and extends to a region not covered by the LED chip 21. In this embodiment, wires 3 are bonded to the wiring pattern. As shown in FIG. 10, the submount substrate 22 is bonded to the pad 13a and 13b via, for example, an Ag paste 18. This bonding may be eutectic bonding.

When viewed from top, the dimensions of the main surface exposed portions 151b and 151c are larger than the dimensions of the submount substrate 22, and the outer edges of the main surface exposed portions 151b and 151c are located a little outside of the outer edges of the submount substrate 22.

This embodiment can also achieve high heat radiation and luminance of the LED module A2.

FIGS. 11 to 14 show an LED module according to a third embodiment of the present disclosure. An LED module A3 of this embodiment is different in configuration of the LED units 2 from those of the above-described embodiments. In this embodiment, each of the LED unit 2 is a so-called 1-wire type including an LED chip 21 alone. In addition, the bonding pad 14a and the through conductor 15a included in the case 1 in the LED modules A1 and A2 are not included in the LED module A3.

In this embodiment, electrodes (not shown) are formed in the upper and the lower side of the LED chip 21. Wires 3 are bonded to the electrodes formed in the upper side. The electrodes formed in the lower side are bonded to the pads 13a and 13b, for example, by eutectic bonding.

When viewed from top, the dimensions of the main surface exposed portions 151b and 151c are larger than the dimensions of the LED chips 21 and the outer edges of the main surface exposed portions 151b and 151c are located a little outside of the outer edges of the LED chips 21.

This embodiment can also achieve high heat radiation and luminance of the LED module A3.

FIGS. 15 to 18 show an LED module according to a fourth embodiment of the present disclosure. An LED module A4 of this embodiment is different in configuration of the LED units 2 from those of the above-described embodiments. In this embodiment, each of the LED unit 2 is a so-called 1-wire type including an LED chip 21 and a submount substrate 22.

The submount substrate 22 is made of, for example, Si, and is mounted with the LED chip 21. The submount substrate 22 is formed with a wiring pattern via an insulating film. This wiring pattern has a portion which makes conductive connection with electrodes (not shown) of the LED chip 21 and extends to a region not covered by the LED chip 21. In this embodiment, wires 3 are bonded to the wiring pattern. Other electrodes (not shown) of the LED chip 21 contact the submount substrate 22. The submount substrate 22 is bonded to the pads 13a and 13b via, for example, an Ag paste 18. This bonding may be eutectic bonding.

Also in this embodiment, when viewed from top, the dimensions of the main surface exposed portions 151b and 151c are larger than the dimensions of the submount substrate 22 and the outer edges of the main surface exposed portions 151b and 151c are located a little outside of the outer edges of the submount substrate 22.

This embodiment can also achieve high heat radiation and luminance of the LED module A2.

Figure 19:
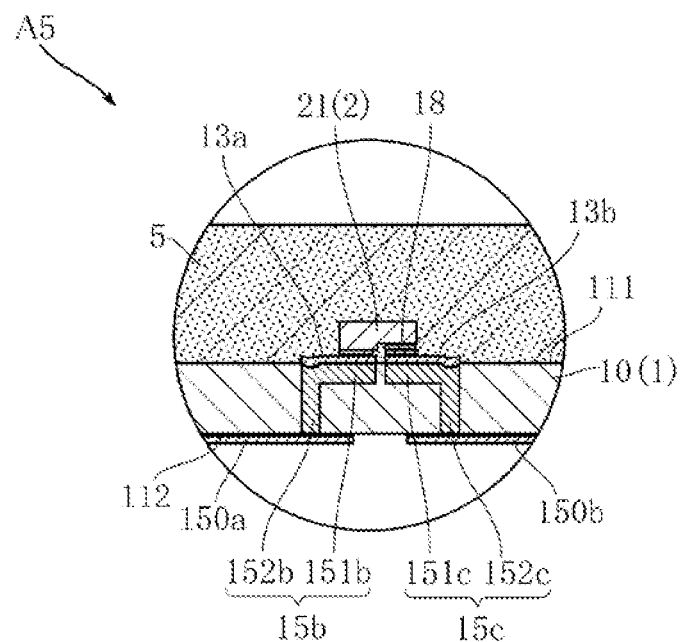
FIG. 19 is a main part enlarged sectional view showing an LED module according to a fifth embodiment of the present disclosure.
Figure 20:
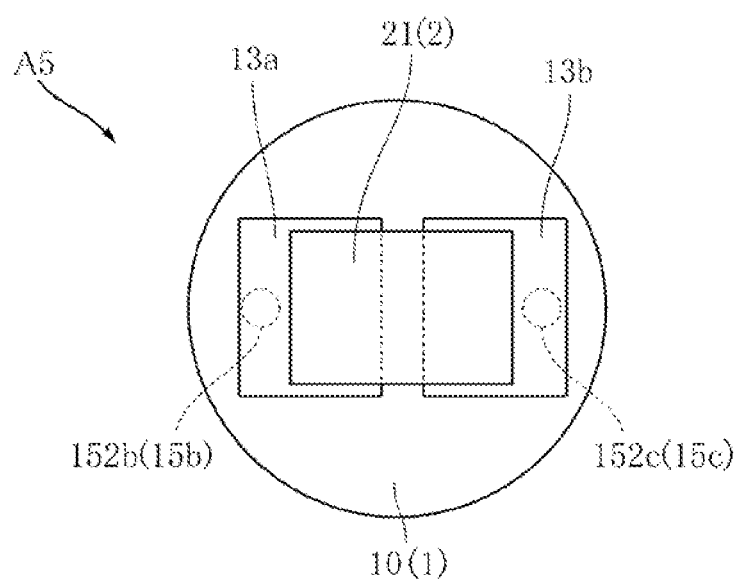
FIG. 20 is a main part enlarged plan view showing the LED module according to the fifth embodiment of the present disclosure.

FIGS. 19 and 20 show an LED module according to a fifth embodiment of the present disclosure. An LED module A5 of this embodiment is different in configuration of the LED units 2 from those of the above-described embodiments. In this embodiment, each of the LED unit 2 includes an LED chip 21 alone. The LED chip 21 is a so-called flip chip type including two electrodes in its lower side.

The LED chip 21 is bonded to the pads 13a and 13b. The pad 13a covers the main surface exposed portion 151b of the through conductor 15b, and the pad 13b covers the main surface exposed portion 151c of the through conductor 15c. The main surface exposed portions 151b and 151c have respective portions overlapping the LED module 2 when viewed from top.

This embodiment can also achieve high heat radiation and luminance of the LED module A5.

Figure 21:
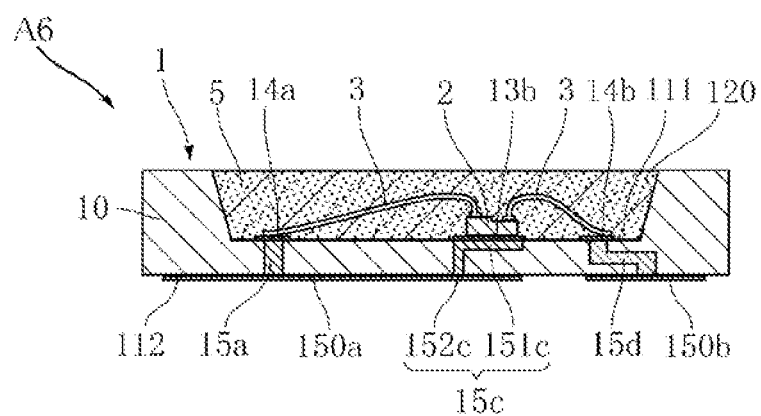
FIG. 21 is a sectional view showing an LED module according to a sixth embodiment of the present disclosure.

FIG. 21 shows an LED module according to a sixth embodiment of the present disclosure. An LED module A6 of this embodiment has the same configuration as the LED module A1 except that the body 10 is made of ceramic.

This embodiment can also achieve high heat radiation of the LED module A6.

Figure 22:
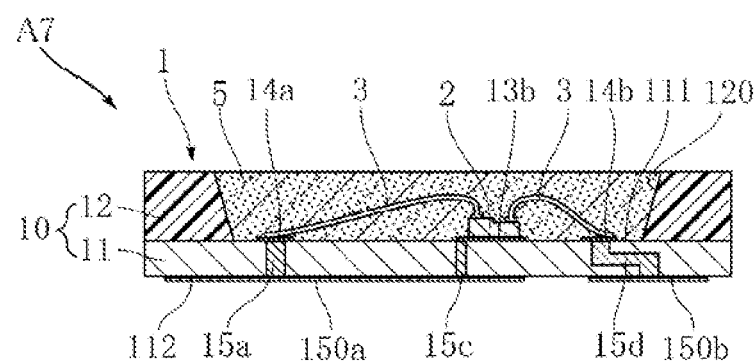
FIG. 22 is a sectional view showing an LED module according to a seventh embodiment of the present disclosure.

FIG. 22 shows an LED module according to a seventh embodiment of the present disclosure. An LED module A7 of this embodiment has the same configuration as the LED module A1 except that the through conductors 15b and 15c have a cylindrical shape. The through conductor 15c is deviated from the LED module 2 when viewed from top, and its upper side contacts the pad 13b.

This embodiment can also achieve high luminance of the LED module A7.

The LED modules of the present disclosure are not limited to the above-described embodiments. Details of various components of the LED modules of the present disclosure may be changed in design in various ways.

Next, an LED module capable of emitting light having a more preferable color temperature will be described in detail with reference to FIGS. 23 to 48.

Figure 23:
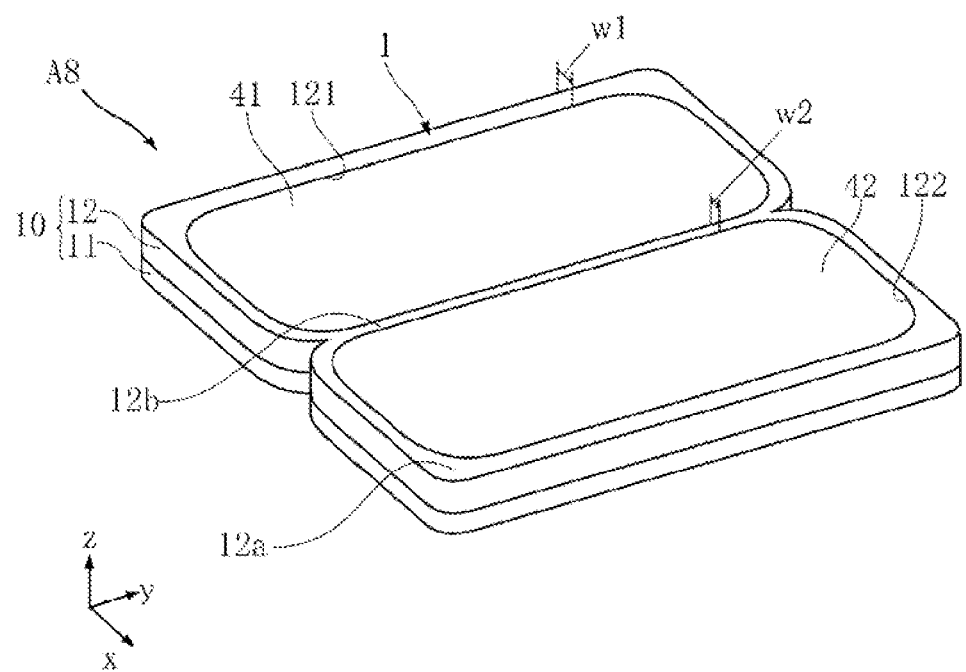
FIG. 23 is a perspective view showing an LED module according to an eighth embodiment of the present disclosure.

FIGS. 23 to 30 show an LED module according to an eighth embodiment of the present disclosure. In this embodiment, an LED module A8 includes a case 1, a plurality of LED unit 2, a plurality of wires 3, a first fluorescent resin 41 and a second fluorescent resin 42. The first and the second fluorescent resin 41 and 42 are not shown in FIG. 24. As shown in FIG. 23, the LED module A5 has a rectangular plate shape. The x-direction and y-direction shown in FIG. 23 are perpendicular to each other and follow sides of the LED module A5, respectively. The x-direction and the y-direction correspond to a first and a second direction in the claims of the present disclosure, respectively. The z-direction is a direction perpendicular to the x-direction and the y-direction and corresponds to the thickness direction of the LED module A8. The dimensions of the LED module A8 is, for example, 7.5 mm in the x-direction, 7.5 mm in the y-direction and 0.9 mm in the z-direction.

The case 1 includes a body 10; a plurality of pads 13; a plurality of bonding pads 14a, 14b, 14c and 14d; mounting electrodes 151, 152 and 153; and a plurality of through conductors 16, 17a, 17b, 17c and 17d. The case 1 supports the first and the second fluorescent resin 41 and 42.

The body 10 includes a base plate 11 and a frame unit 12. The base plate 11 is made of a white ceramic such as alumina or the like. The base plate 11 has a main surface 111 and a bottom surface 112 which are opposite to each other in the z-direction. The main surface 111 and the bottom surface 112 are surfaces on the x-y plane, which is perpendicular to the z-direction.

The frame unit 12 is bonded to the main surface 111 of the base plate 11 and has a frame shape when viewed from top. The frame unit 12 is made of, for example, a white resin, like the base plate 11. The ceramic body 10 has a relatively high heat resistance and is suitable to operate the LED module A8 under high temperature environments. In addition, the frame unit 12 may be made of a white resin such as epoxy resin, silicone resin, liquid crystal polymer (LCP), polyphthalamide (PPA) resin or the like, which is higher in reflectivity than ceramic and is suitable to provide higher luminance for the LED module A8.

As shown in FIG. 23, the frame unit 12 includes a rectangular outer frame 12a and a partition 12b formed inside the outer frame 12a. The width w1 of the outer frame 12a is, for example, 0.3 to 0.5 mm. The partition 12b extends in the y-direction and is formed to connect both sides of the outer frame 12a in the y-direction. The width w2 of the partition 12b in the x-direction is, for example, 0.15 to 0.25 mm, which is about half the width w1.

The interior of the outer frame 12a is partitioned into two areas by the partition 12b. The frame unit 12 has a first and a second opening 121 and 122 formed in the x-direction. As shown in FIG. 23, the partition 12b is interposed between the first and the second opening 121 and 122.

Figure 26:
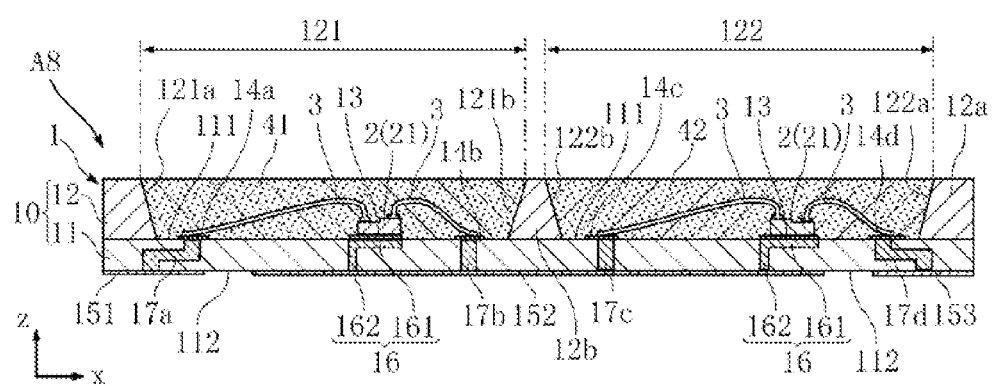
FIG. 26 is a sectional view taken along line IV-IV in FIG. 24.
Figure 27:
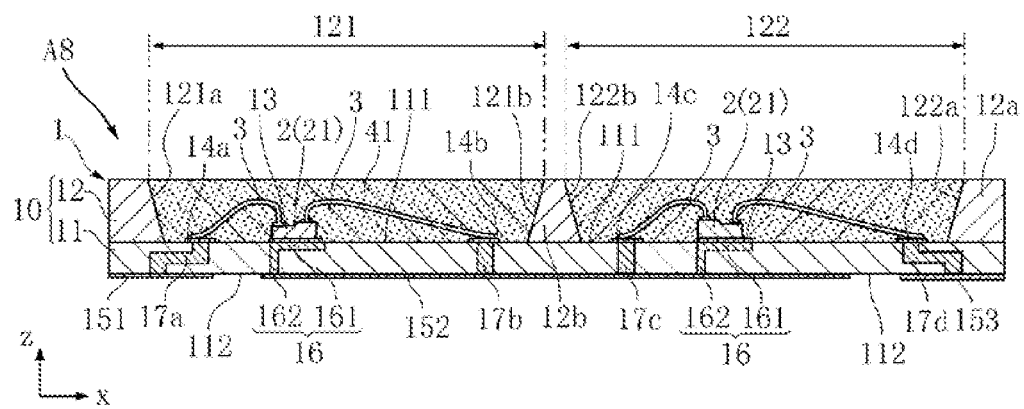
FIG. 27 is a sectional view taken along line V-V in FIG. 24.

The first and the second opening 121 and 122 have a rectangular shape when viewed from the z-direction. The first and the second opening 121 and 122 extend in the y-direction. As shown in FIGS. 26 and 27, the frame unit 12 is disposed in such a manner that the first and the second opening 121 and 122 expose the main surface Ill.

Figure 24:
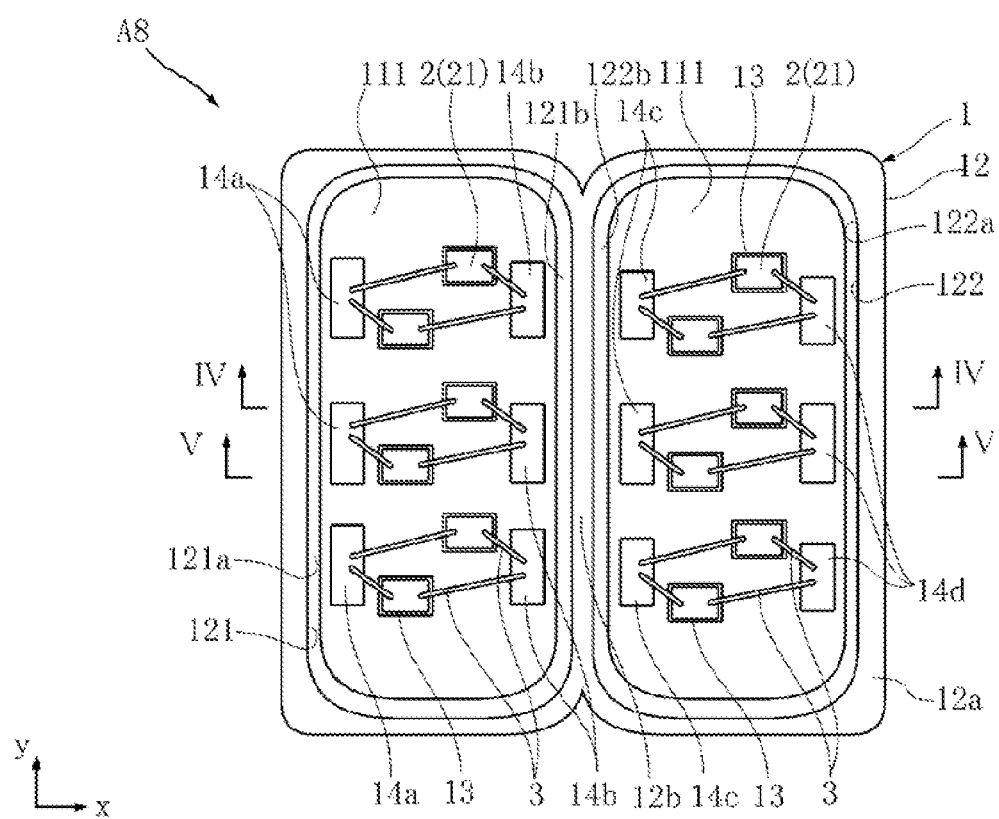
FIG. 24 is a main part plan view of the LED module shown in FIG. 23.

As shown in FIGS. 24 and 26, the outer frame 12a has an inner side 121a located at the left side of the partition 12b in FIG. 24 in the x-direction and an inner side 122a located at the right side of the partition 12b in FIG. 24 in the x-direction. The partition 12b has a side 121b, and a side 122b located at the right side of the side 121b in FIG. 24 in the x-direction. The first opening 121 is defined by the inner side 121a and the side 121b, and the second opening 122 is defined by the inner side 122a and the side 122b.

As shown in FIG. 26, the inner side 121a is inclined in such a manner that it is farther away from the LED unit 2 located in the first opening 121 in the x-direction as it moves farther away from the main surface 111 in the z-direction. The inner side 122a is inclined in such a manner that it is farther away from the LED unit 2 located in the second opening 122 in the x-direction as it moves farther away from the main surface 111 in the z-direction.

As shown in FIG. 26, the side 121b is inclined in such a manner that it is closer to the main surface 111 in the z-direction as it moves closer to the left side in FIG. 26 in the x-direction. The side 122b is inclined in such a manner that it is closer to the main surface 111 in the z-direction as it moves closer to the right side in FIG. 26 in the x-direction.

The inner sides 121a and 122a and sides 121b and 122b serve as reflectors which reflect light propagating in the left and the right direction in FIG. 26 toward the top side of FIG. 26. This configuration is advantageous for increasing the amount of light emitted from the LED module A8.

Six pads 13, three bonding pads 14a, and three bonding pads 14b are formed in a region exposed by the first opening 121 of the main surface 111. Six pads 13, three bonding pads 14c and three bonding pads 14d are formed in a region exposed by the second opening 122 of the main surface 111.

As shown in FIG. 24, the six pads 13 are arranged in the first opening 121 in two columns in the x-direction, and each of the columns includes three pads 13 arranged in the y-direction. The positions of the pads 13 in the y-direction that belong to the left column in FIG. 24 in the x-direction are different from the positions of the pads 13 in the y-direction that belong to the right column in FIG. 24 in the x-direction.

As shown in FIG. 24, the six pads 13 are arranged in the second opening 122 in two columns in the x-direction, and each of the columns includes three pads 13 arranged in the y-direction. The positions of the pads 13 in the y-direction that belong to the left column in FIG. 24 in the x-direction are different from the positions of the pads 13 in the y-direction that belong to the right column in FIG. 24 in the x-direction.

Each pad 13 has a rectangular shape when viewed in the z-direction and is formed of a plating layer made of, for example, Ni and Au stacked in order from the main surface 111. If the top surface of the plating layer is made of Au, the thickness of the Au layer may be about 0.1 μm.

As shown in FIG. 24, the three bonding pads 14a are arranged in the first opening 121 on the left side of the six pads 13 in the x-direction in FIG. 24. The three bonding pads 14a are arranged, for example, at equal intervals in the x direction y direction. Each bonding pad 14a has a rectangular shape when viewed in the z-direction and has the same plating structure as that of the pads 13.

As shown in FIG. 24, the three bonding pads 14b are arranged in the first opening 121 on the right side of the six pads 13 in the x-direction in FIG. 24. The three bonding pads 14b are arranged, for example, at equal intervals in the y-direction. Each bonding pad 14b has a rectangular shape when viewed in the z-direction and has the same plating structure as that of the pads 13.

As shown in FIG. 24, the three bonding pads 14c are arranged in the second opening 122 on the left side of the six pads 13 in the x-direction in FIG. 24. The three bonding pads 14c are arranged, for example, at equal intervals in the y-direction. Each bonding pad 14c has a rectangular shape when viewed in the z-direction and has the same plating structure as that of the pads 13.

As shown in FIG. 24, the three bonding pads 14d are arranged in the second opening 122 on the right side of the six pads 13 in the x-direction in FIG. 24. The three bonding pads 14d are arranged, for example, at equal intervals in the y-direction. Each bonding pad 14d has a rectangular shape when viewed in the z-direction and has the same plating structure as that of the pads 13.

Figure 25:
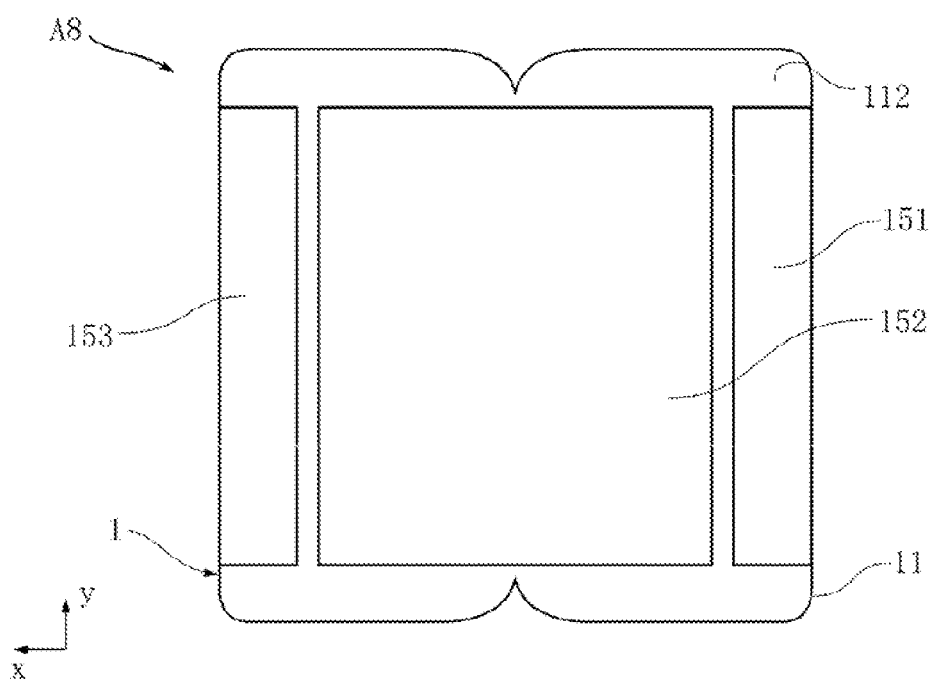
FIG. 25 is a bottom view of the LED module shown in FIG. 23.

As shown in FIG. 25, the mounting electrodes 151, 152 and 153 having rectangular shapes are formed on the bottom surface 112. The mounting electrodes 151, 152 and 153 are separated from each other. The mounting electrode 151 is located near the right end of FIG. 25 in the x-direction, and the mounting electrode 153 is located near the left end of FIG. 25 in the x-direction. The mounting electrode 152 is interposed between the mounting electrodes 151 and 152 in the x-direction. In FIG. 25, the mounting electrode 152 is significantly larger than the mounting electrodes 151 and 153 and overlaps the plurality of LED units 2 when viewed from top.

The plurality of through conductors 16, 17a, 17b, 17c and 17d made of, for example, Ag or W, penetrates through the base plate 11. In this embodiment, twelve through conductors 16 connect twelve pads 13 and the mounting electrode 152, respectively. Three through conductors 17a having a crank shape make conductive connection between three bonding pads 14a and the mounting electrode 151, respectively. Three through conductors 17b make conductive connection between three bonding pads 14b and the mounting electrode 152, respectively. Three through conductors 17c make conductive connection between three bonding pads 14c and the mounting electrode 152, respectively. Three through conductors 17d having a crank shape make conductive connection between three bonding pads 14d and the mounting electrode 153, respectively.

Figure 28:
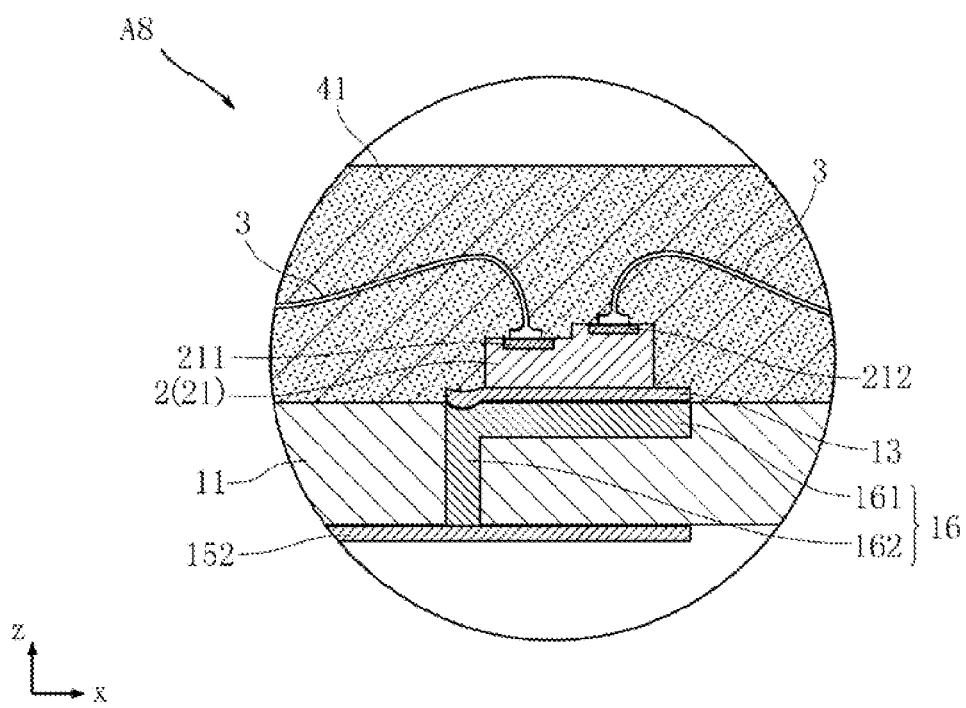
FIG. 28 is a main part enlarged sectional view showing the LED unit in a first opening shown in FIG. 26.
Figure 29:
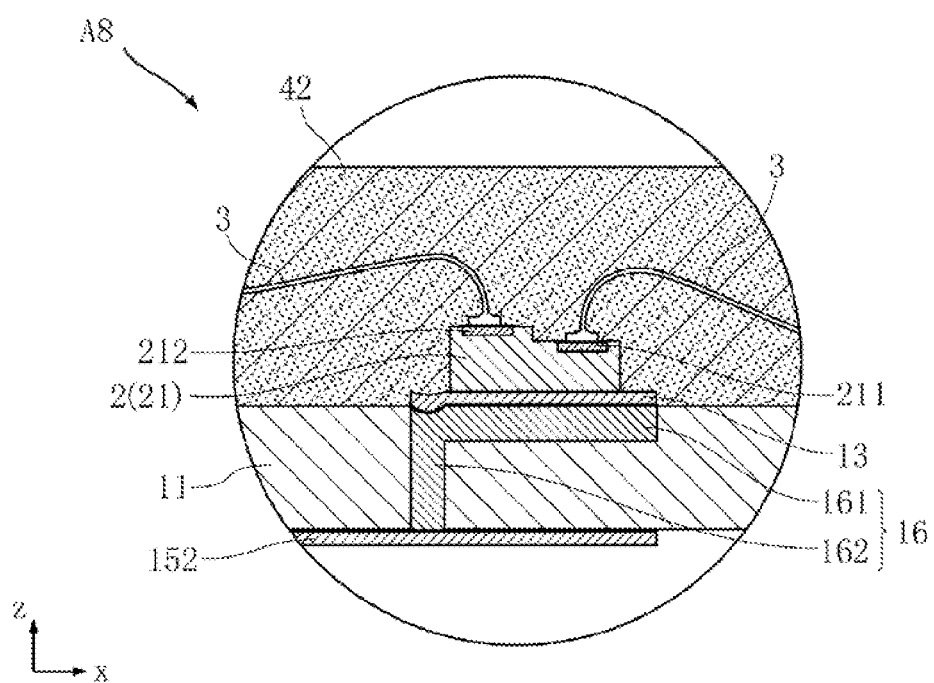
FIG. 29 is a main part enlarged sectional view showing the LED unit in a second opening shown in FIG. 26.
Figure 30:
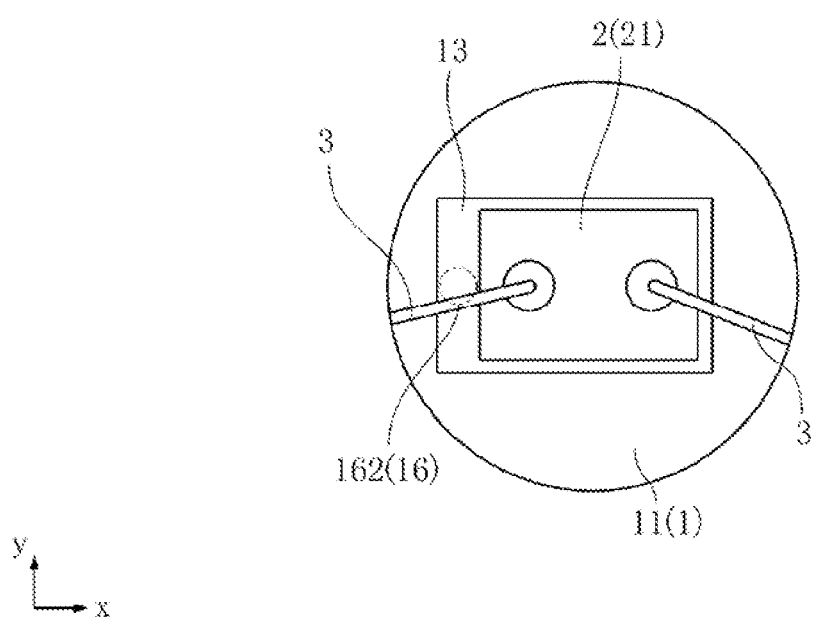
FIG. 30 is a main part plan view of the LED unit shown in FIG. 28.
Figure 31:
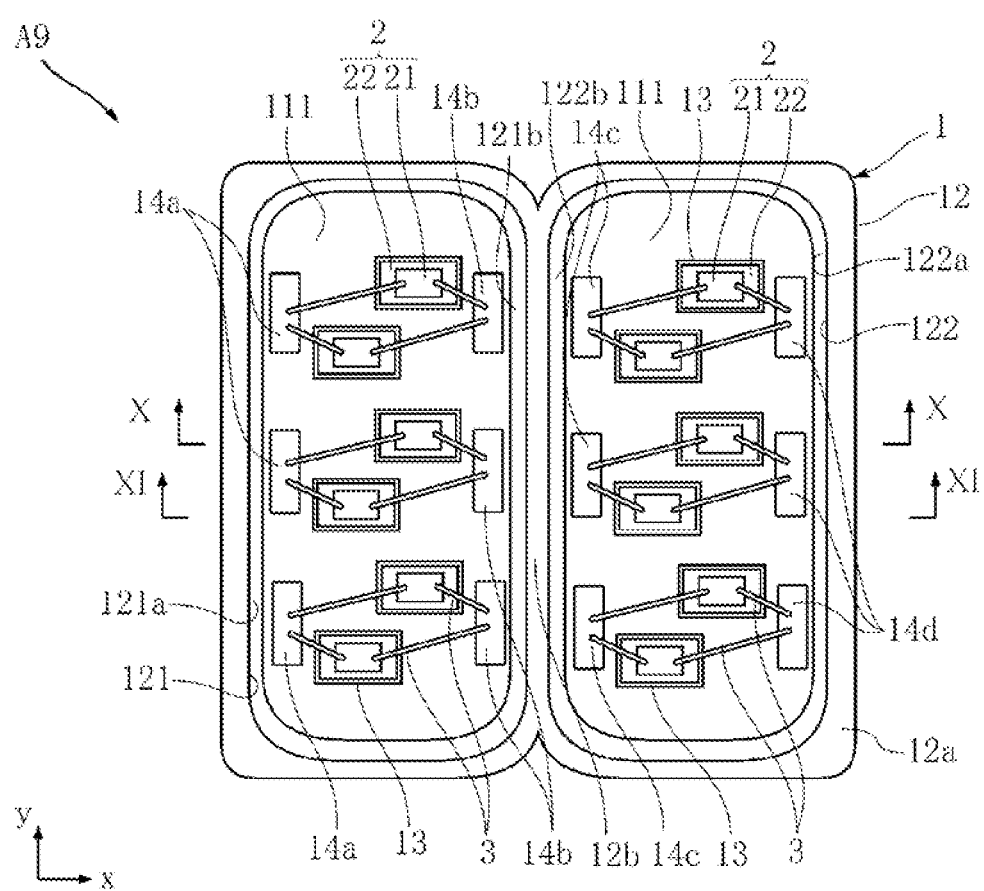
FIG. 31 is a main part plan view showing an LED module according to a ninth embodiment of the present disclosure.
Figure 32:
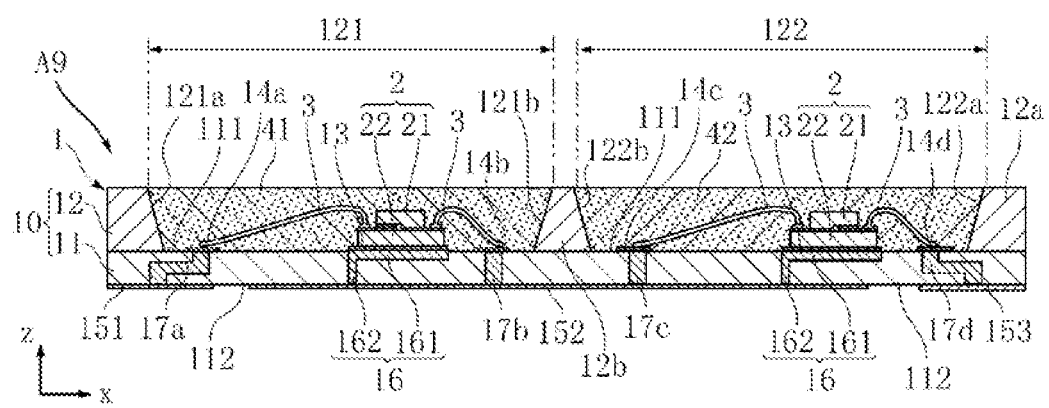
FIG. 32 is a sectional view taken along line X-X in FIG. 31.
Figure 33:
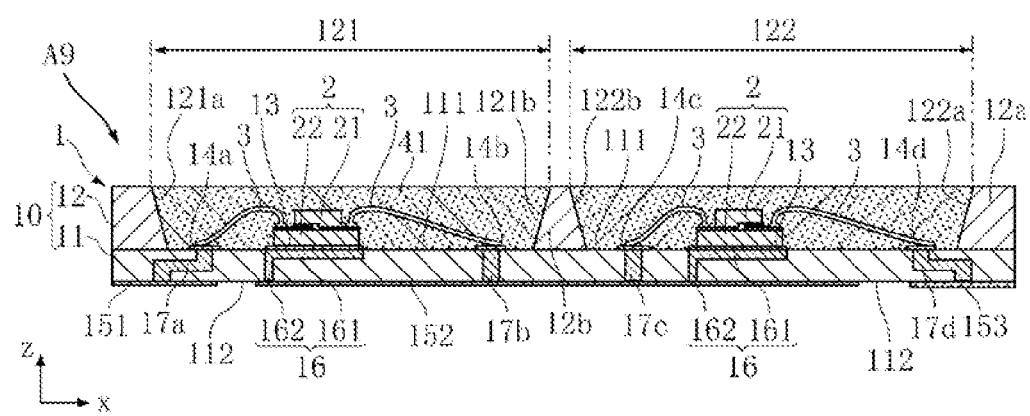
FIG. 33 is a sectional view taken along line XI-XI in FIG. 31.

Each through conductor 16 includes a main surface exposed portion 161 and a bottom surface reaching portion 162. As shown in FIGS. 28 and 29, the main surface exposed portion 161 is exposed to the main surface 111 and has a plate shape whose dimension is relatively small in the z-direction (thickness direction of the base plate 11) but relatively large when viewed in the z-direction. The bottom surface reaching portion 162 is connected to the main surface exposed portion 161, and its bottom reaches the bottom surface 112. The bottom surface reaching portion 162 has a cylindrical shape whose dimension is relatively large in the z-direction but relatively small when viewed in the z-direction. In this embodiment, the main surface exposed portion 161 is larger than the LED unit 2 when viewed in the z-direction and contains the LED unit 2 when viewed in the z-direction. In addition, as shown in FIG. 30, the bottom surface reaching portion 162 is deviated from the LED unit 2 when viewed in the z-direction.

The base plate 11 and the through conductors 16, 17a, 17b, 17c and 17d may be formed, for example, by firing a ceramic material and Ag or W material, which are stacked in appropriate order. The pad 13; the bonding pads 14a, 14b, 14c and 14d; and the mounting electrodes 151, 152 and 153 may be formed by plating with respect to the base plate 11. In addition, the case 1 may be obtained by bonding the frame unit 12, which is formed by firing a ceramic material, to the base plate 11. In addition, the base plate 11 and the frame unit 12 may be formed integratedly.

In this embodiment, as shown in FIGS. 28 and 29, the main surface exposed portion 161 is entirely covered by the pad 13. In addition, a portion of the upper side of the main surface exposed portion 161 overlapping the bottom surface reaching portion 162 when viewed in the z-direction has a caved shape, and a portion of the pad 13 overlapping the portion of the upper side of the main surface exposed portion 161 also has a caved shape. It is believed that the caved shapes results from the remains of a caved liquid level of liquefied Ag or W material during a firing step in the manufacturing process of the case 1. In addition, since the pad 13 is formed by plating, the upper side of the pad 13 has a caved shape according to a cave formed in the through conductor 16.

The plurality of LED units 2 serves as a light source of the LED module A5 and includes a plurality of LED chips 21 in this embodiment. Each LED chip 21 includes an n-type semiconductor layer made of, for example, a GaN semiconductor, a p-type semiconductor layer made of, for example, a GaN semiconductor, and an active layer interposed between the n-type semiconductor layer and the p-type semiconductor layer; and emits blue light. Each of the chips 21 is eutectically bonded to the pad 13. When viewed in the z-direction, the dimensions of each LED chip 21 is smaller than the dimensions of the pad 13. That is, outer edges of the pad 13 when viewed from top are located a little outside of the outer edges of the LED chip 21. In this embodiment, each of the LED chips 21 is a so-called 2-wire type LED chip.

As described above, the pads 13 are arranged on the main surface 111 in the first opening 121 in two columns in the y-direction. The LED chips 21 disposed on these pads 13 are also arranged in two columns in the y-direction. As shown in FIG. 24, the two columns, each including three LED chips 21 arranged in the y-direction, are arranged in the x-direction. FIG. 26 shows a section of the LED chips 21 belonging to the right column in FIG. 24 in the x-direction, and FIG. 25 shows a section of the LED chips 21 belonging to the left column in FIG. 24 in the x-direction. The two columns are inherently different in position in the x-direction from each other. In addition, the LED chips 21 are arranged in such a manner that the LED chips 21 belonging to one of the two columns are different in position in the y-direction from the LED chips 21 belonging to the other of the two columns. A positional relationship between a plurality of LED chips 21 in the second opening 122 is the same as described above. This arrangement is suitable for forming the wires 3.

FIG. 28 is an enlarged view of an LED chip 21 disposed in the first opening 121. As shown in FIG. 28, the LED chip 21 includes an electrode 211 connected to an n-type semiconductor layer and an electrode 212 connected to a p-type semiconductor layer. As shown in FIG. 28, the LED chip 21 is disposed in such a manner that the electrode 212 is located on the right side of the electrode 211 in the x-direction in FIG. 28. In addition, although not shown, the bonding pads 14a and 14b are disposed on the left and the right side of the LED chip 21, respectively.

FIG. 29 is an enlarged view of an LED chip 21 disposed in the second opening 122. As shown in FIG. 29, in the second opening 122, as opposed to the first opening 121, the electrode 212 is located on the left side of the electrode 211 in the x-direction in FIG. 29. In addition, although not shown, the bonding pads 14c and 14d are disposed on the left and the right side of the LED chip 21, respectively.

The plurality of wires 3 is made of, for example, Au, and has one end bonded to the bonding pads 14a, 14b, 14c and 14d and the other end bonded to the LED chip 21.

The electrode 211 of each LED chip 21 disposed in the first opening 121 is connected to the bonding pad 14a via the wire 3. The electrode 212 of each LED chip 21 disposed in the first opening 121 is connected to the bonding pad 14b via the wire 3. The electrode 211 of each LED chip 21 disposed in the second opening 122 is connected to the bonding pad 14d via the wire 3. The electrode 212 of each LED chip 21 disposed in the second opening 122 is connected to the bonding pad 14c via the wire 3.

As described above, each LED chip 21 is disposed in the first opening 121 in such a manner that the electrode 211 is closer to the bonding pad 14a (on the left side in FIG. 26). With this configuration, the electrode 211 and the bonding pad 14a are connected via the wire 3. Each LED chip 21 is disposed in the second opening 122 in such a manner that the electrode 211 is closer to the bonding pad 14d (on the right side in FIG. 26). With this configuration, the electrode 211 and the bonding pad 14d are connected via the wire 3.

With this configuration, each LED chip 21 in the first opening 121 can be turned on by making conductive connection between the mounting electrodes 151 and 152. In addition, each LED chip 21 in the second Opening 122 can be turned on by making conductive connection between the mounting electrodes 153 and 152.

The first opening 121 is filled with the first fluorescent resin 41. The first fluorescent resin 41 covers six LED chips 21 arranged in the first opening 121, three bonding pads 14a, three bonding pads 14b, and twelve wires 3. The first fluorescent resin 41 is made of, for example, a mixture of transparent silicone resin and fluorescent material. The fluorescent material emits yellow light when it is excited by blue light emitted from the LED chip 21. When the yellow light is mixed with the blue light from the LED chip 21, white light is emitted from the first opening 121. In this embodiment, the fluorescent material is adjusted such that the color temperature of the white light emitted from the first opening 121 is about 3000 K.

The second opening 122 is filled with the second fluorescent resin 42. The second fluorescent resin 42 covers six LED chips 21 arranged in the second opening 122, three bonding pads 14c, three bonding pads 14d, and twelve wires 3. The second fluorescent resin 42 is made of, for example, a mixture of transparent silicone resin and fluorescent material. The fluorescent material emits yellow light when it is excited by blue light emitted from the LED chip 21. When the yellow light is mixed with the blue light from the LED chip 21, white light is emitted from the second opening 122. In this embodiment, the fluorescent material is adjusted such that the color temperature of the white light emitted from the second opening 122 is about 5000 K. The fluorescent material contained in the second fluorescent resin 42 has ingredients that are different from those of the fluorescent material contained in the first fluorescent resin 41.

The first and the second fluorescent resin 41 and 42 are formed by introducing liquefied silicone resins mixed with different fluorescent materials into the first and the second opening 121 and 122, respectively, and curing the silicone resins. In order to prevent the silicone resins containing the different fluorescent materials from being mixed with each other, the partition 12b is disposed in the frame unit 12. The partition 12b can be formed to be narrower than the outer frame 12a because such configuration is sufficient to prevent the mixture of the silicon resins.

Next, operation of the LED module A8 will be described.

The LED module A8 is operable to emit white light having a color temperature of about 3000 K from the first opening 121 and white light having a color temperature of about 5000 K from the second opening 122. Light is emitted from only the first opening 121 when only conductive connection between the mounting electrodes 151 and 152 is made, while light is emitted from only the second opening 122 when only conductive connection between the mounting electrodes 152 and 153 is made. When the entire conductive connection between the mounting electrodes 151, 152 and 153 is made, light is emitted from both the first and the second opening 121 and 122.

When the light is emitted from both the first and the second opening 121 and 122, the white light emitted from the LED module A8 is a mixture of white light having a color temperature of about 3000 K and white light having a color temperature of about 5000 K. In this embodiment, the width w2 of the partition 12b interposed between the first and the second opening 121 and 122 in the x-direction is set to be relatively small, for example, 0.15 mm to 0.25 mm. Accordingly, a distance between the first and the second opening 121 and 122 is set to be relatively small. This configuration is advantageous for mixing light emitted from the first and the second opening 121 and 122.

In this way, the LED module A8 is configured to selectively emit light having different color temperatures. Depending on a user's need, white light having a color temperature of about 3000 K, white light having a color temperature of about 5000 K, or a mixture thereof can be chosen. If it is assumed that the first and the second fluorescent resin 41 and 42 are relatively inexpensive and available and a fluorescent resin to achieve white light having a color temperature of about 4500 K is relatively expensive, the provision of a white light having a color temperature of about 4500 K by using an LED module made of a single fluorescent resin requires relatively high costs. In contrast, the configuration of the LED module A5 of this embodiment allows the provision of a white light having a color temperature of about 4500 K with relatively low costs by using the first and the second fluorescent resin 41 and 42.

The above-mentioned color temperatures are merely examples and the first and the second fluorescent resin 41 and 42 may contain different fluorescent materials. For example, the first and the second fluorescent resin 41 and 42 may contain a fluorescent material emitting red light and a fluorescent material emitting green light when excited by blue light.

In this embodiment, the LED unit 2 is supported by the main surface exposed portion 161 via the pads 13. This facilitates transfer of heat from the LED unit 2 to the bottom surface 112 via the main surface exposed portion 161 and the bottom surface reaching portion 162, which may result in high heat radiation of the LED module A8.

As shown in FIGS. 28 and 29, the bottom surface reaching portion 162 is likely to cause a cave in the main surface exposed portion 161. In many cases, this cave may lead to caves in the surface of the pads 13. When the bottom surface exposed portion 162 is deviated from the LED unit 2 when viewed from top, the caves of the pads 13 are not covered by the LED unit 2. This can prevent the LED unit 2 and the pads 13 from forming a gap therebetween.

The main surface exposed portion 161 is larger in dimension than the bottom surface reaching portion 162 when viewed from top. This reduces the likelihood of producing noticeable caves. The main surface exposed portion 161 has a size and position which enables the LED unit 2 to be contained therein when viewed in the z-direction, and the surfaces of portions of the pads 13 overlapping the LED unit 2 to have a flat shape. This facilitates stable mounting of the LED unit 2.

In this embodiment, the surfaces of the pads 13 and the bonding pads 14a, 14b, 14c and 14d are made of Au to prevent discoloration, which results in the prevention of color deterioration of light emitted from the LED module A8.

FIGS. 31 to 48 show other embodiments of the present disclosure. In FIGS. 31 to 48, the same or similar elements as the above-described embodiments are denoted by the same reference numerals.

Figure 34:
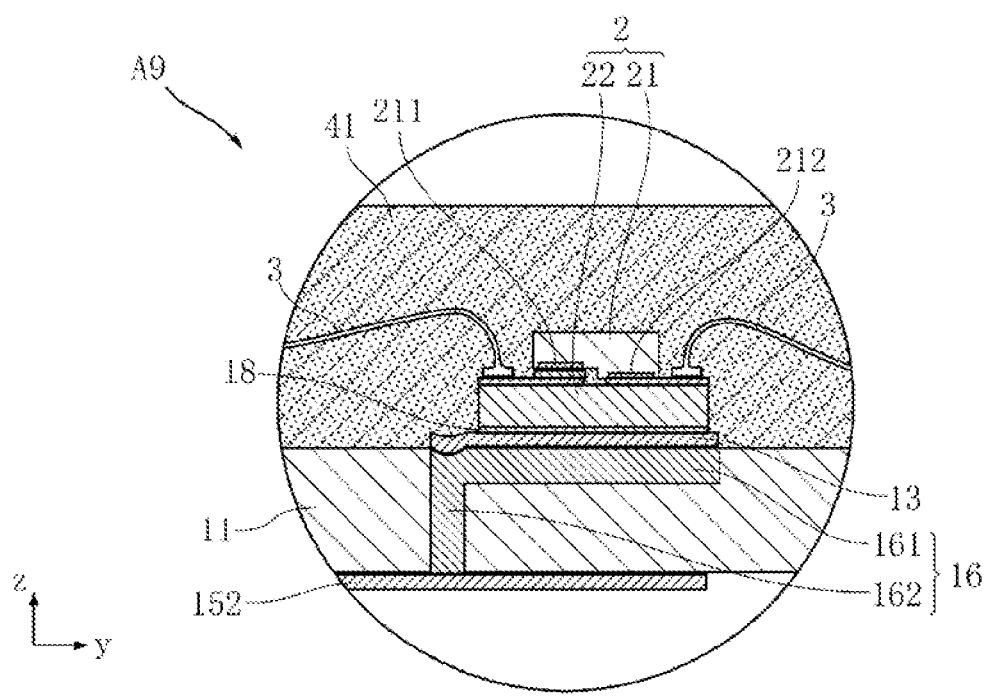
FIG. 34 is a main part enlarged sectional view showing the LED unit in a first opening shown in FIG. 32.

FIGS. 31 to 34 show an LED module according to a ninth embodiment of the present disclosure. An LED module A9 of this embodiment is different in configuration of the LED units 2 from those of the above-described embodiments. In this embodiment, each of the LED units 2 includes an LED chip 21 and a submount substrate 22. FIG. 34 is an enlarged view of the LED unit 2 in the first opening 121.

The submount substrate 22 is made of, for example, Si, and mounted with the LED chip 21. The submount substrate 22 is formed with a wiring pattern. This wiring pattern has a portion which makes conductive connection with the electrodes 211 and 212 of the LED chip 21 and extends to a region not covered by the LED chip 21. In this embodiment, wires 3 are bonded to the wiring pattern. As shown in FIG. 34, the submount substrate 22 is bonded to the pads 13 via, for example, an Ag paste 18. This bonding may be eutectic bonding.

As shown in FIG. 34, the LED chip 21 in the first opening 121 is disposed such that the electrode 211 connected to the n-type semiconductor layer lies on the left side in FIG. 34 and the electrode 212 connected to the p-type semiconductor layer lies on the right side in FIG. 34. Although not shown in FIG. 34, the bonding pads 14a are arranged on the left side of the LED chip 21 and the bonding pads 14b are arranged on the right side of the LED chip 21. A portion of the wiring pattern on the submount substrate 22, which is connected to the electrode 211, is connected to the bonding pads 14a via the wires 3. A portion of the wiring pattern on the submount substrate 22, which is connected to the electrode 212, is connected to the bonding pads 14b via the wires 3. Accordingly, like the LED module A8, the electrodes 211 and 212 make conductive connection with the mounting electrodes 151 and 152, respectively.

Like the LED module A8, an LED chip 21 in the second opening 122 is disposed in reverse direction to the LED chip 21 in the first opening 121. Accordingly, like the LED module A8, the electrodes 211 and 212 of the LED chip 21 in the second opening 122 make conductive connection with the mounting electrodes 153 and 152, respectively.

When viewed in the z-direction, the dimensions of the main surface exposed portion 161 is larger than the dimensions of the submount substrate 22, and when viewed from top, the outer edges of the main surface exposed portion 161 are located a little outside of the outer edges of the submount substrate 22.

This embodiment can also realize the LED module A9 capable of emitting white light having different color temperatures simultaneously.

Figure 35:
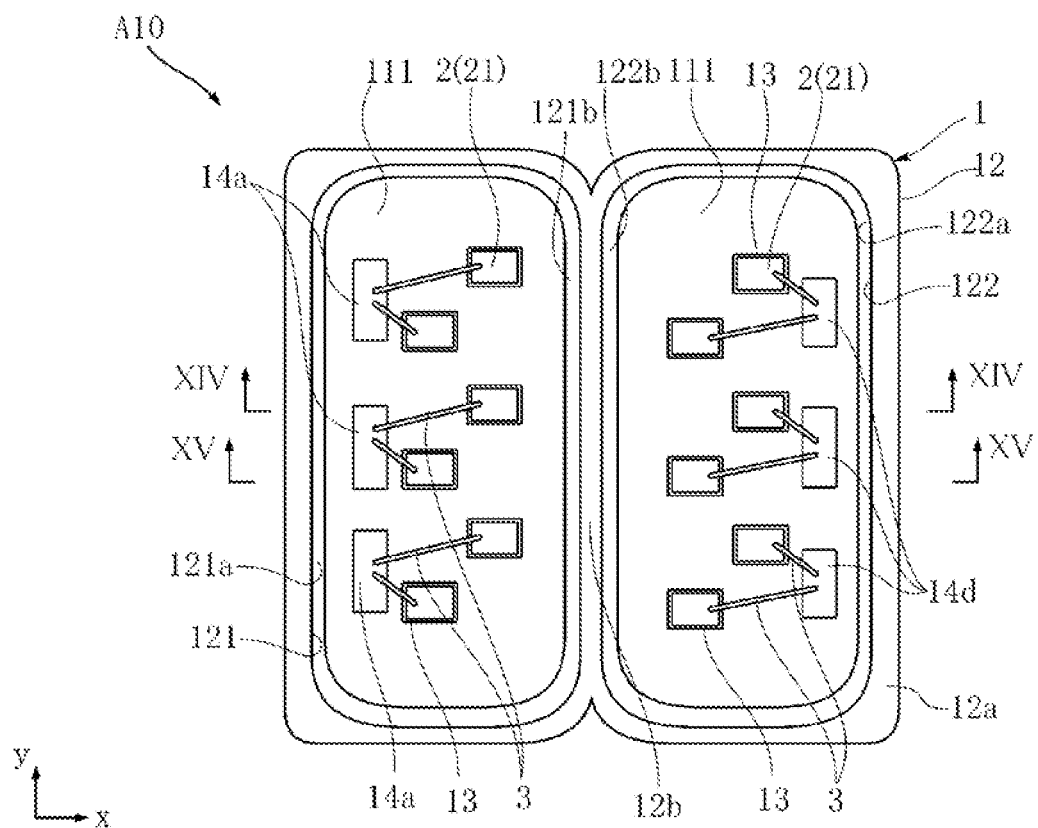
FIG. 35 is a main part plan view showing an LED module according to a tenth embodiment of the present disclosure.
Figure 36:
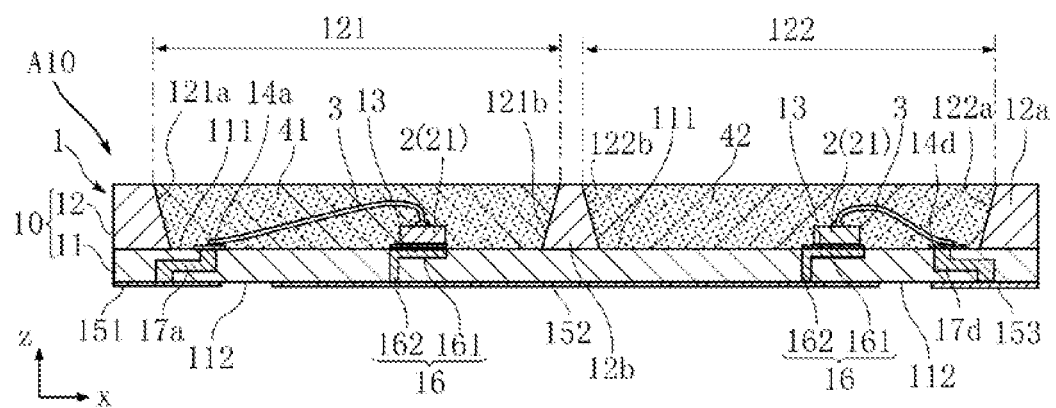
FIG. 36 is a sectional view taken along line XIV-XIV in FIG. 35.
Figure 37:
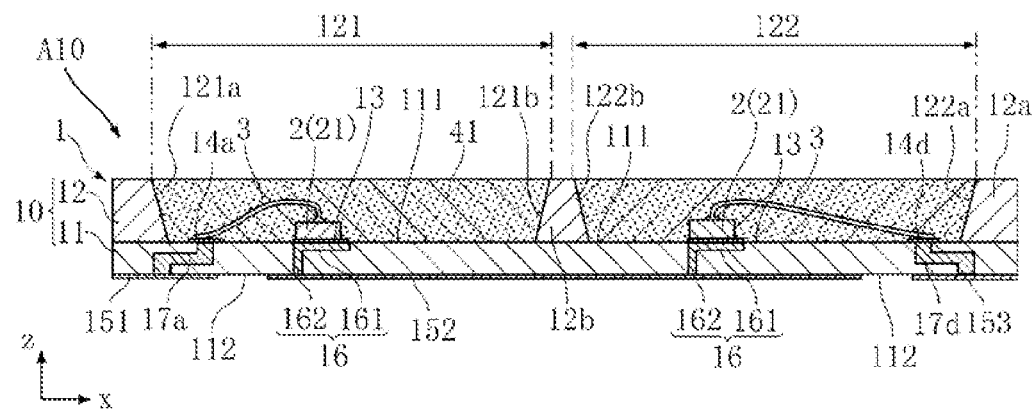
FIG. 37 is a sectional view taken along line XV-XV in FIG. 35.

FIGS. 35 to 37 show an LED module according to a tenth embodiment of the present disclosure. An LED module A10 of this embodiment is different in configuration of the LED units 2 from those of the above-described embodiments. In this embodiment, each of the LED units 2 is a so-called I-wire type including an LED chip 21 alone. In addition, the bonding pads 14b and 14c and the through conductors 17b and 17c included in the case 1 in the LED modules A8 and A9 are not included in the I-wire type LED unit 2.

In this embodiment, electrodes (not shown) are formed in the upper and the lower side of the LED chip 21. Wires 3 are bonded to the electrode formed in the upper side. The electrode formed in the lower side is bonded to the pads 13, for example, by eutectic bonding.

As shown in FIGS. 36 and 37, the electrode (not shown) formed in the lower side of each LED chip 21 is connected to the mourning electrode 152 via the pad 13 and the through conductor 16. The electrode (not shown) formed in the upper side of the LED chip 21 in the first opening 121 is connected to the bonding pad 14a via the wire 3 and makes conductive connection with the mounting electrode 151. The electrode (not shown) formed in the upper side of the LED chip 21 in the second opening 122 is connected to the bonding pad 14d via the wire 3 and makes conductive connection with the mounting electrode 153.

This embodiment can also realize the LED module A10 capable of emitting white light having different color temperatures simultaneously.

Figure 38:
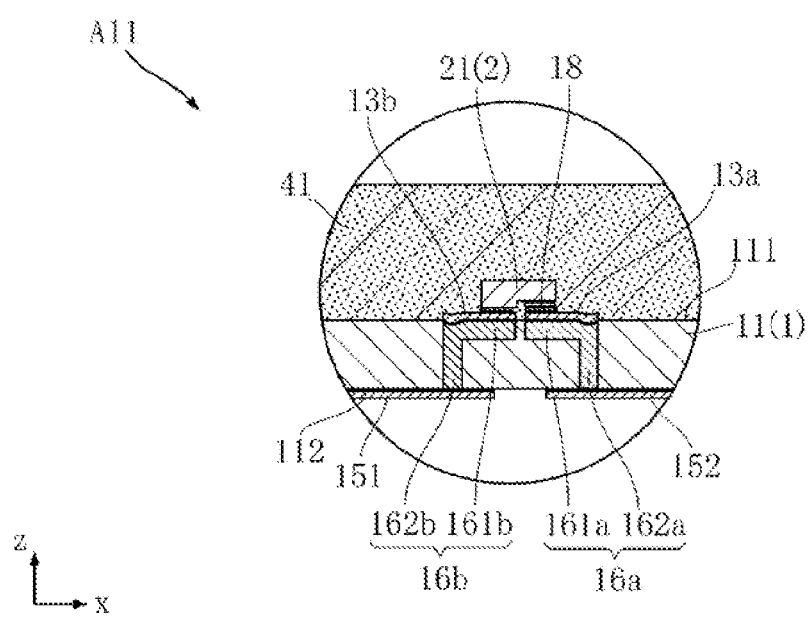
FIG. 38 is a main part enlarged sectional view showing an LED module according to an 11th embodiment of the present disclosure.

FIG. 38 shows an LED module according to an eleventh embodiment of the present disclosure. An LED module A11 of this embodiment is different in configuration of the LED units 2 from those of the above-described embodiments. In this embodiment, each of the LED units 2 is a so-called flip chip type including an LED chip 21 alone which has two electrodes in its lower side. FIG. 38 shows an LED chip 21 in the first opening 121. An electrode of an LED chip 21 in the second opening 122 is disposed as opposed to that of the LED chip 21 shown in FIG. 38.

In this embodiment, the wires 3 and the bonding pads 14a, 14b, 14c and 14d need not to be provided. As shown in FIG. 38, pads 13a and 13b separated from each other replace the pads 13 of the above-described embodiments. The LED chip 21 is bonded to the pads 13a and 13b. The pad 13a is connected to the mounting electrode 151 via the through conductor 16a and the pad 13b is connected to the mounting electrode 152 via the through conductor 16b. The through conductor 16a includes a main surface exposed portion 161a and a bottom surface reaching portion 162a. The through conductor 16b includes a main surface exposed portion 161b and a bottom surface reaching portion 162b.

This embodiment can also realize the LED module A11 capable of emitting white light having different color temperatures simultaneously.

Figure 39:
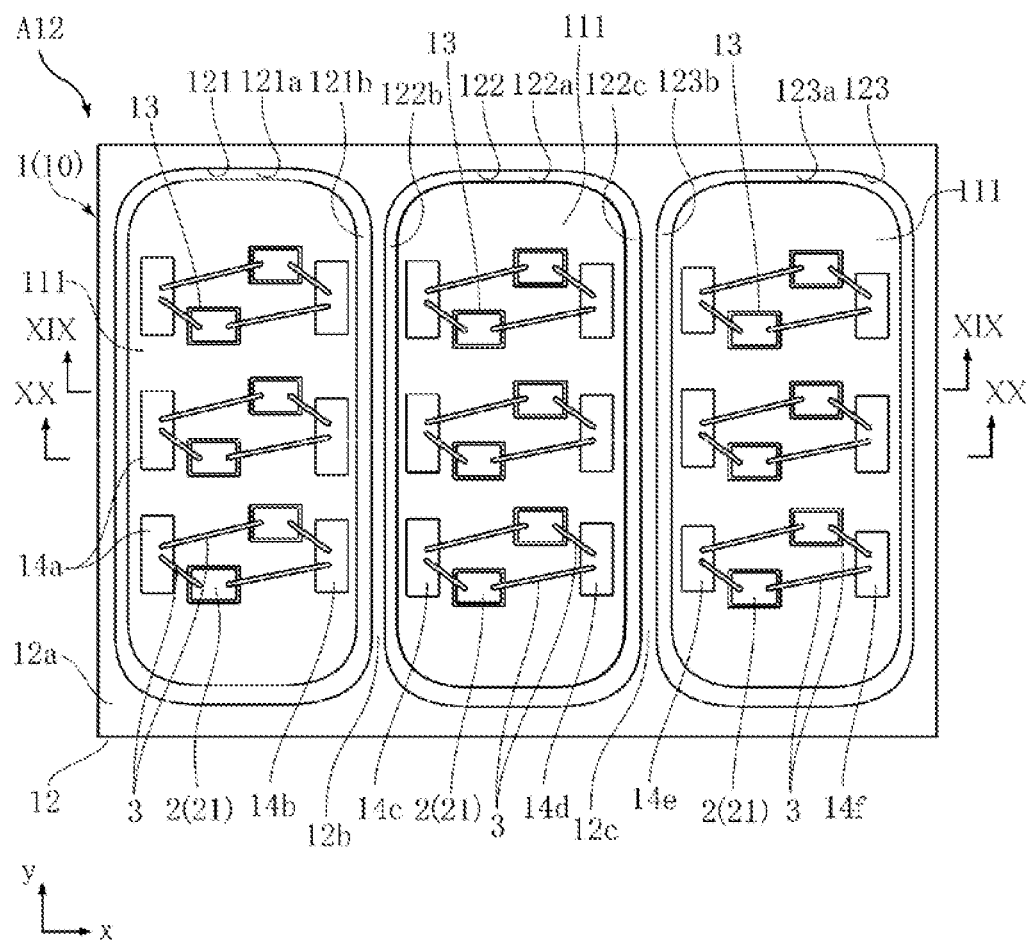
FIG. 39 is a main part plan view showing an LED module according to a 12th embodiment of the present disclosure.

FIGS. 39 to 42 show an LED module according to a twelfth embodiment of the present disclosure. An LED module A12 of this embodiment further includes a third opening 123 adjacent to the second opening 122 added to the configuration of the LED module A8. As shown in FIG. 39, six LED units 2 are disposed in a region exposed by the third opening 123 of the main surface 111. These LED units 2 have the same configuration and arrangement as the LED units 2 in the first opening 121. Hereinafter, differences between the LED module A12 and the LED module A8 will be described in more detail. Explanation of the same portions or elements of the LED module A12 as found in the LED module A8 will be omitted.

The frame unit 12 of this embodiment includes an additional partition 12c. The additional partition 12c is interposed between the second opening 122 and the third opening 123 in the x-direction. The additional partition 12c is formed to be parallel to the partition 12b. The width of the additional partition 12c in the x-direction is set to be equal to that of the partition 12b. The additional partition 12c has a side 122c and a side 123b located at the right side of the side 122c in FIG. 39 in the x-direction.

As shown in FIG. 39, in this embodiment, the outer frame 12a further has an inner side 123a located at the right side of the additional partition 12c in FIG. 39 in the x-direction. In this embodiment, the second opening 122 is defined by the side 122b, the inner side 122a and the side 122c. The third opening 123 is defined by the inner side 123a and the side 123b.

Figure 41:
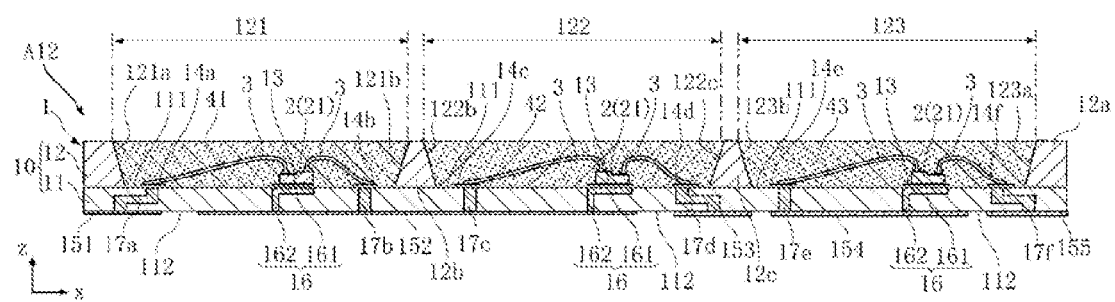
FIG. 41 is a sectional view taken along line XIX-XIX in FIG. 39.

As shown in FIG. 41, the inner side 123a is inclined in such a manner that it is farther away from the LED unit 2 located in the third opening 123 in the x-direction as it moves farther away from the main surface 111 in the z-direction. The side 122c is inclined in such a manner that it is closer to the main surface 111 in the z-direction as it moves closer to the left side in FIG. 41 in the x-direction. The side 123b is inclined in such a manner that it is closer to the main surface 111 in the z-direction as it moves closer to the right side in FIG. 41 in the x-direction.

The inner side 123a and sides 122c and 123b serve as reflectors which reflect light propagating in the left and the right direction in FIG. 39 toward the top side of FIG. 39. This configuration is advantageous for increasing the amount of light emitted from the LED module A12.

As shown in FIG. 39, the case 1 further includes six pads 13, three bonding pads 14e and three bonding pads 14f in the third opening 123. The six pads 13 have the same configuration and arrangement as the six pads 13 in the first and the second opening 121 and 122

The bonding pads 14e have the same configuration as the bonding pads 14a in the first opening 121. The three bonding pads 14e are arranged on the left side of the six pads 13 in the third opening 123 in FIG. 39 in the x-direction.

The bonding pads 14f have the same configuration as the bonding pads 14b in the first opening 121. The three bonding pads 141 are arranged on the right side of the six pads 13 in the third opening 123 in FIG. 39 in the x-direction.

Figure 40:
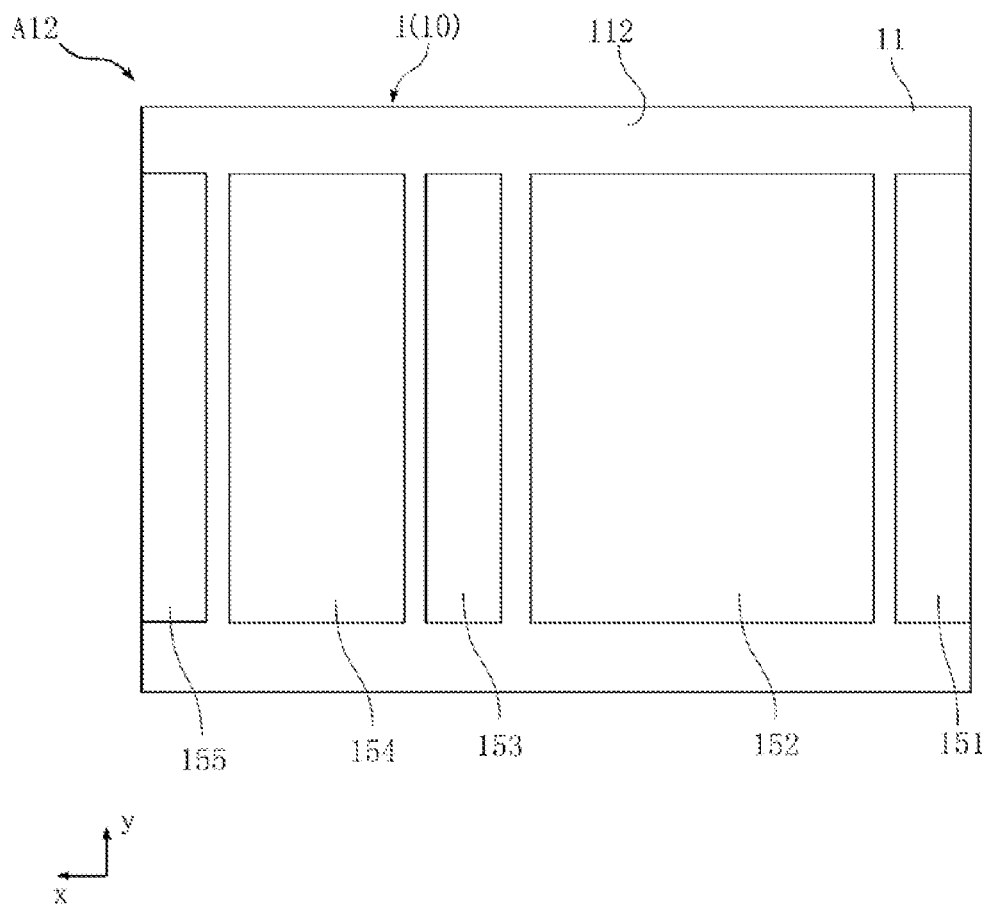
FIG. 40 is a bottom view of the LED module shown in FIG. 39.
Figure 42:
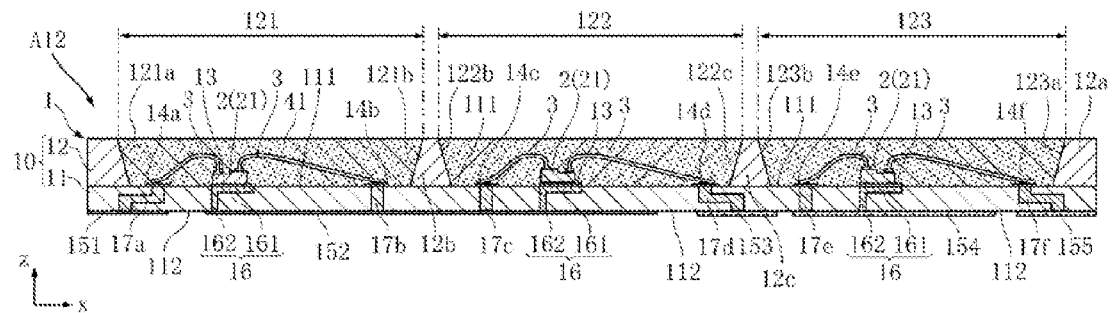
FIG. 42 is a sectional view taken along line XX-XX in FIG. 39.

As shown in FIG. 40, the case 1 further includes mounting electrodes 154 and 155 disposed in the bottom surface 112. As shown in FIG. 40, the mounting electrode 154 is disposed to be separated from the mounting electrode 153 in the x-direction. The mounting electrode 155 is disposed on the left side of the mounting electrode 154 in FIG. 40 in the x-direction and separated from the mounting electrode 154. The mounting electrode 154 is formed to be wider than the mounting electrode 155 in the x-direction and extends up to a position overlapping the LED unit 2 in the third opening 123 when viewed in the z-direction, as shown in FIG. 41. Although the mounting electrode 154 is not connected to the mounting electrode 152 in the example shown in FIG. 40, the mounting electrode 154 may be connected to the mounting electrode 152, e.g., via a wire As shown in FIGS. 41 and 42, the case 1 includes a through conductor 17e which makes conductive connection between the bonding pads 14e and the mounting electrode 154, and a through conductor 17f which makes conductive connection between the bonding pads 141 and the mounting electrode 155. In addition, the case 1 includes a through conductor 16 which connects the pads 13 in the third opening 123 and the mounting electrode 154. The through conductor 17e has the same configuration as the through conductors 17b and 17c and the through conductor 171 has the same configuration as the through conductors 17a and 17d.

In addition, the LED module A12 includes a third fluorescent resin 43 with which the third opening 123 is filled. The third fluorescent resin 43 covers six LED chips 21, three bonding pads 14e, three bonding pads 14f and twelve wires 3, which are arranged in the third opening 123. The third fluorescent resin 43 is made of, for example, a mixture of transparent silicone resin and fluorescent material. The fluorescent material emits yellow light when it is excited by blue light emitted from the LED chip 21. When the yellow light is mixed with the blue light from the LED chip 21, white light is emitted from the third opening 123. In this embodiment, the third fluorescent resin 43 is the same as the first fluorescent resin 41. The color temperature of the white light emitted from the third opening 123 is about 3000 K.

Light having a lower color temperature is darker than light having a higher color temperature. Accordingly, with the configuration of the LED module A8, turning-on only the first opening 121 may provide a sense of dimness. However, with the configuration of the LED module A12, simultaneous turning-on of the first and the third opening 121 and 123 can avoid such a problem.

Alternatively, the third fluorescent resin 43 may be different from the first and the second fluorescent resin 41 and 42. This facilitates the mixture of more kinds of light and hence emission of more kinds of white light by the LED module A12.

Figure 43:
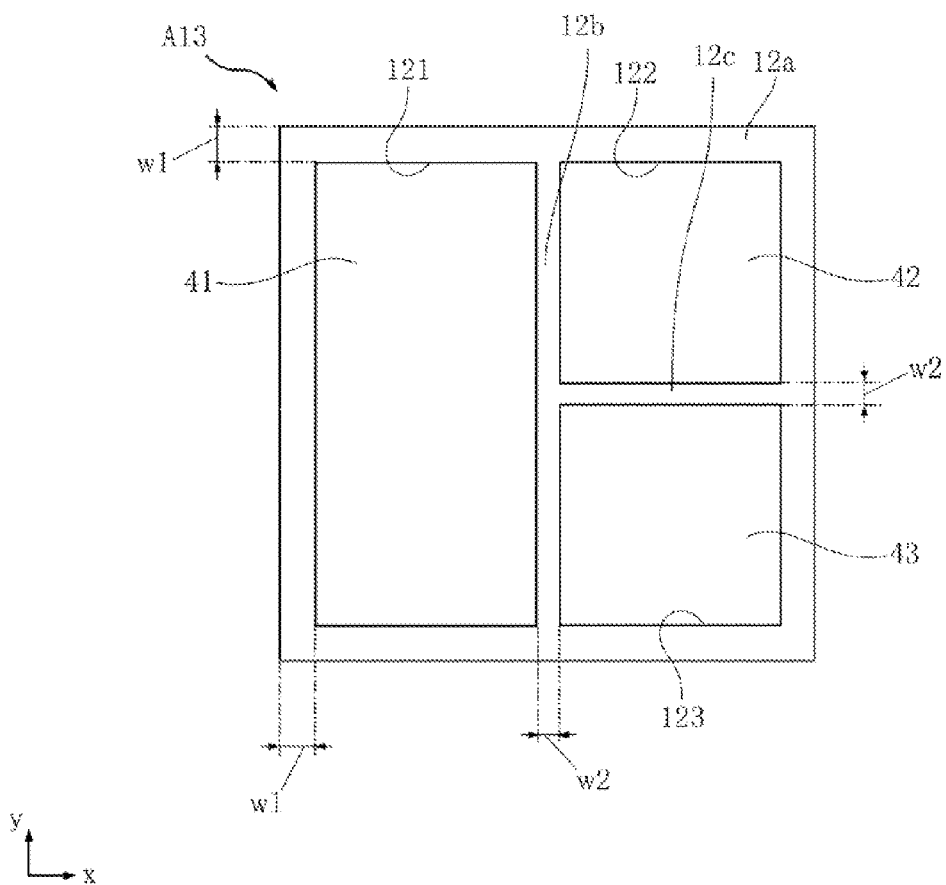
FIG. 43 is a plan view showing an LED module according to a 13th embodiment of the present disclosure.
Figure 44:
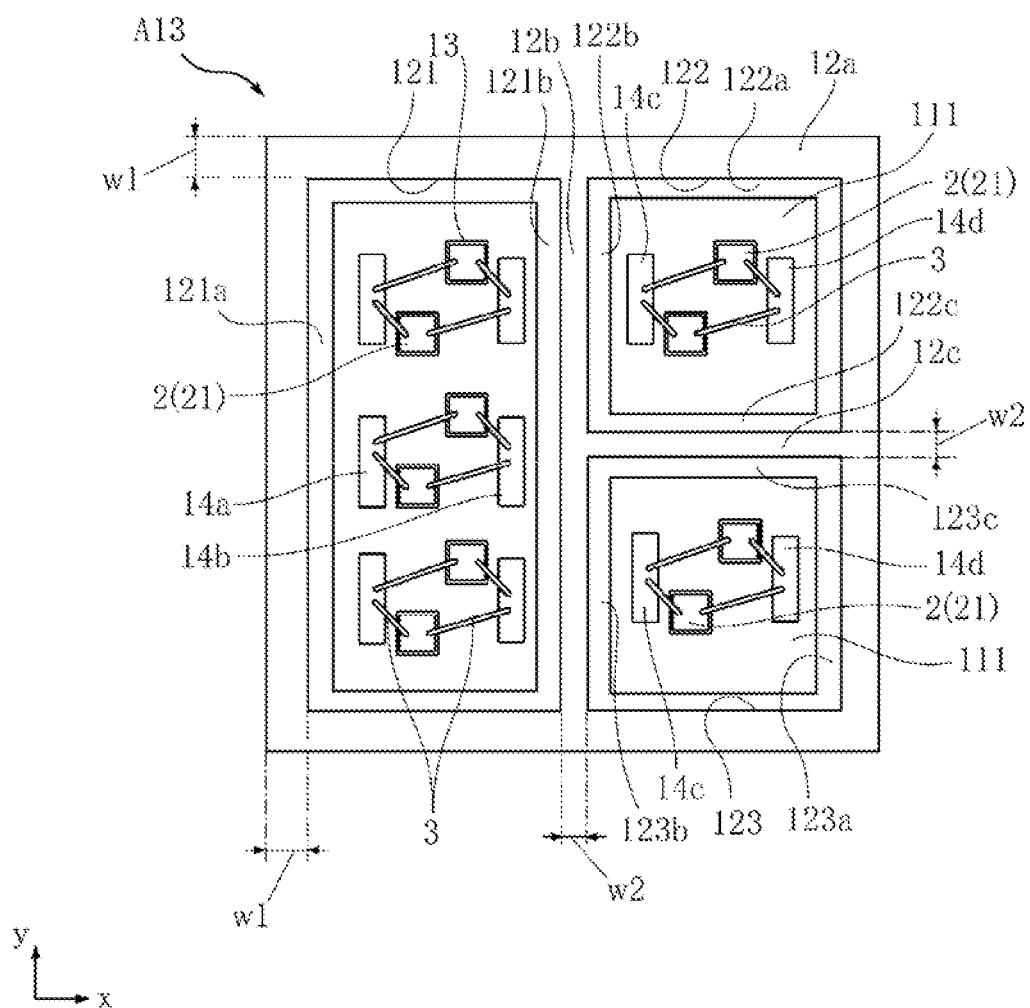
FIG. 44 is a main part plan view of the LED module shown in FIG. 43.
Figure 45:
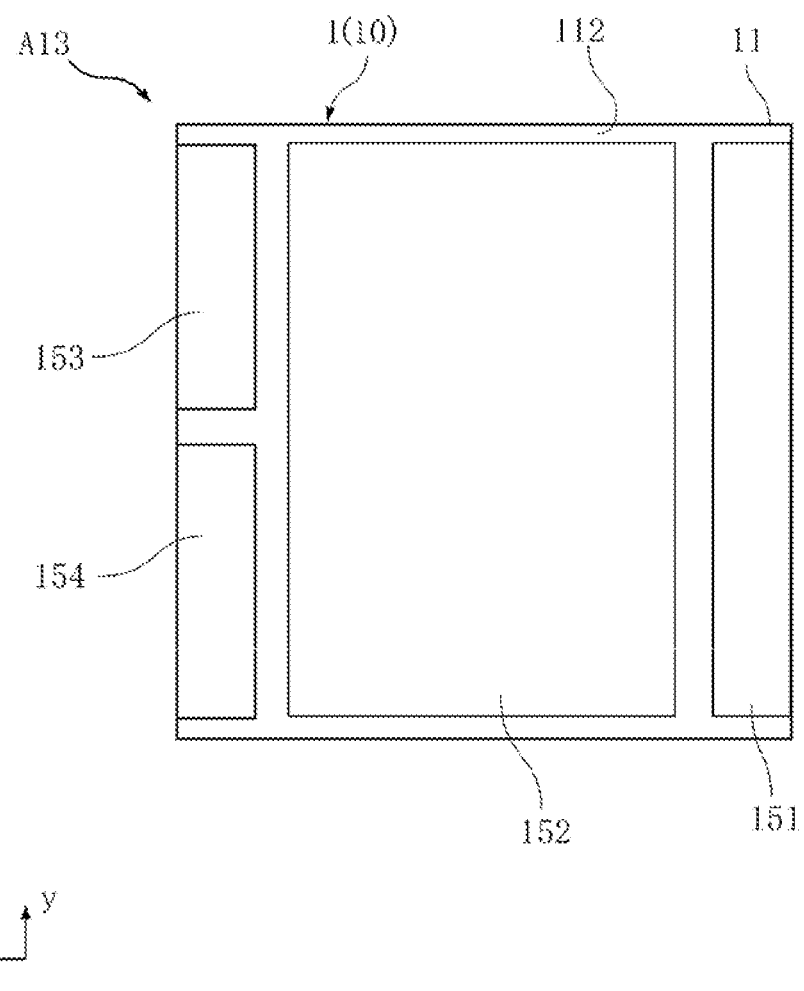
FIG. 45 is a bottom view of the LED module shown in FIG. 43.

FIGS. 43 to 45 show an LED module according to a thirteenth embodiment of the present disclosure. An LED module A13 of this embodiment is different in the shape of the frame unit 12 from the LED module A8. As shown in FIG. 43, the frame unit 12 includes an additional partition 12c which extends in the x-direction. This additional partition 12c allows a third opening 123 to be formed in the frame unit 12. As shown in FIG. 44, two LED units 2, two pads 13, a bonding pad 14e, a bonding pad 14d and four wires 3 are disposed in the second and the third opening 122 and 123, respectively. In addition, as shown in FIG. 45, a mounting electrode 154 is disposed in the bottom surface 112. In addition, the third opening 123 is filled with a third fluorescent resin 43. Other configurations of the LED module A13 are the same as those of the LED module A8.

As shown in FIG. 43, the additional partition 12c is formed to connect the central portion of the partition 12b in the y-direction and the outer frame 12a. The additional partition 12c is interposed between the second opening 122 and the third opening 123 in the y-direction. As shown in FIG. 44, the additional partition 12c has a side 122c and a side 123c located below the side 122c in FIG. 44 in the y-direction. In addition, the outer frame 12a has an inner side 123a located below the additional partition 12c in FIG. 44 in the y-direction.

As shown in FIG. 44, in this embodiment, the partition 12b has a side 123b located below the additional partition 12c in FIG. 44 in the y-direction. In this embodiment, the second opening 122 is defined by the inner side 122a, the side 122b and the side 122c. The third opening 123 is defined by the inner side 123a, the side 123b and the side 123b.

As shown in FIG. 45, the mounting electrode 154 is formed to be aligned with the mounting electrode 153 in the y-direction at the left side of the mounting electrode 152 in FIG. 45 in the x-direction. The bonding pad 14d disposed in the third opening 123 makes conductive connection with the mounting electrode 154.

The third fluorescent resin 43 covers the two LED chips 21, the bonding pad 14c, the bonding pad 14d and the four wires 3, which are arranged in the third opening 123. The third fluorescent resin 43 is made of, for example, a mixture of transparent silicone resin and fluorescent material. The fluorescent material emits yellow light when excited by blue light emitted from the LED chip 21. When the yellow light is mixed with the blue light from the LED chip 21, white light is emitted from the third opening 123. In this embodiment, the third fluorescent resin 43 is the same as the second fluorescent resin 42. The color temperature of the white light emitted from the third opening 123 is about 5000 K.

As opposed to the LED module A12, the LED module A13 is effective to compensate for over-brightness of light having a relatively high color temperature. As shown in FIG. 44, more LED units 2 are disposed in the first opening 121 emitting light having a relatively low color temperature than in the second and the third opening 122 and 123 emitting light having relatively high color temperatures. This configuration also facilitates adjustment of the brightness of light having different color temperatures.

The third fluorescent resin 43 may be different from the first and the second fluorescent resin 41 and 42. This facilitates the mixture of more kinds of light and hence emission of more kinds of white light by the LED module A13.

Figure 46:
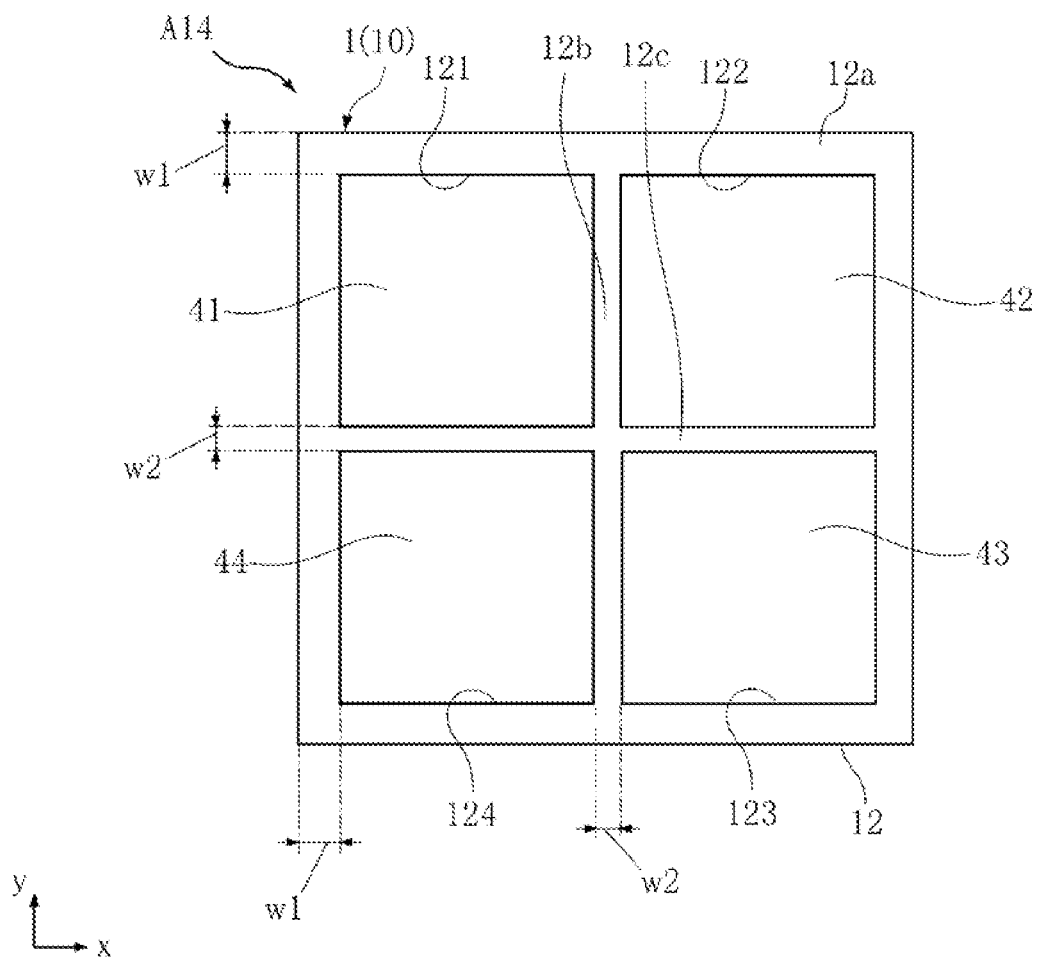
FIG. 46 is a plan view showing an LED module according to a 14th embodiment of the present disclosure.
Figure 47:
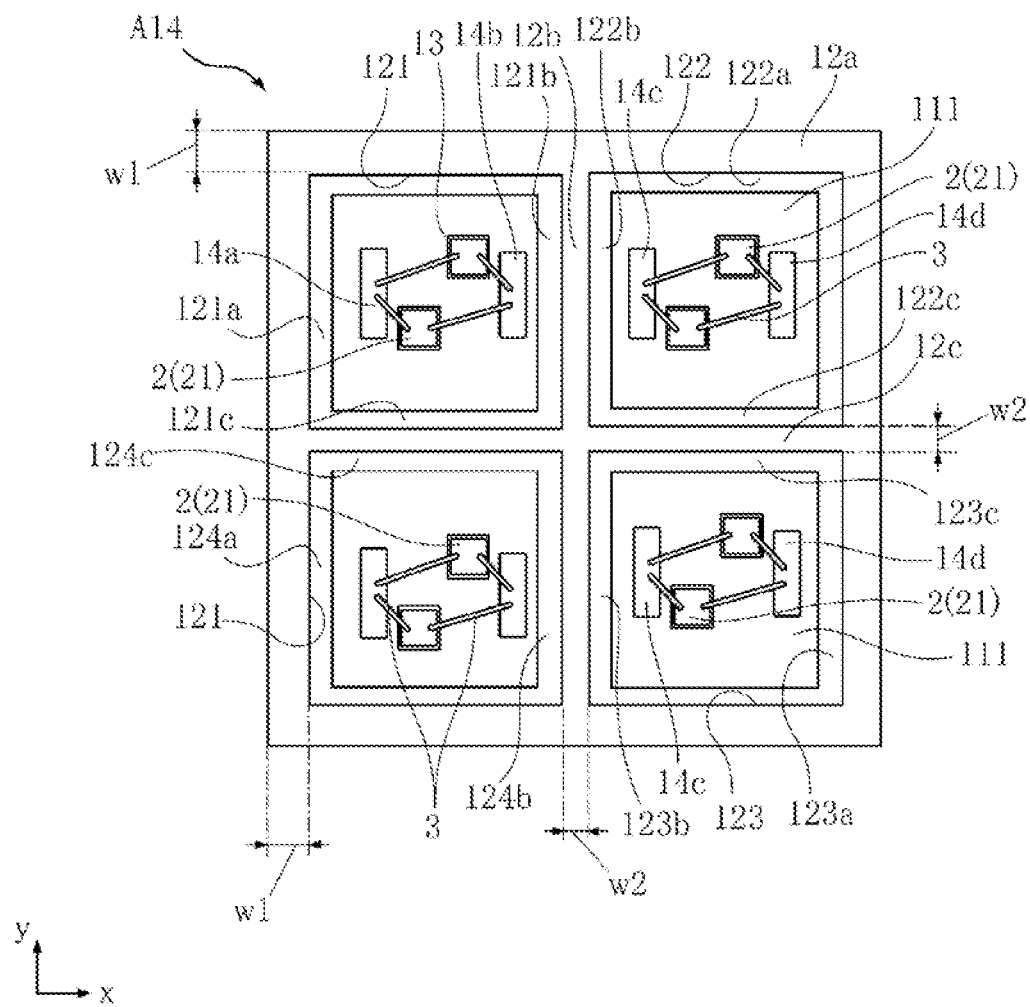
FIG. 47 is a main part plan view of the LED module shown in FIG. 46.
Figure 48:
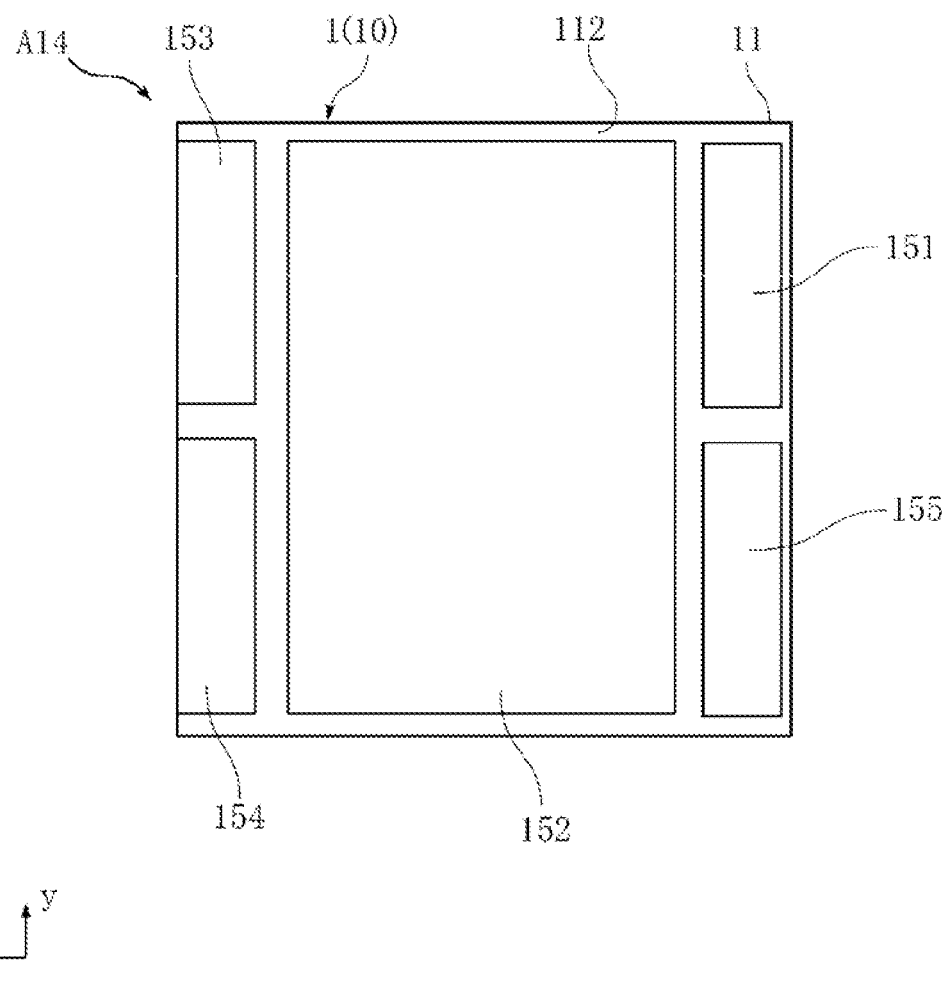
FIG. 48 is a bottom view of the LED module shown in FIG. 46.
Figure 49:
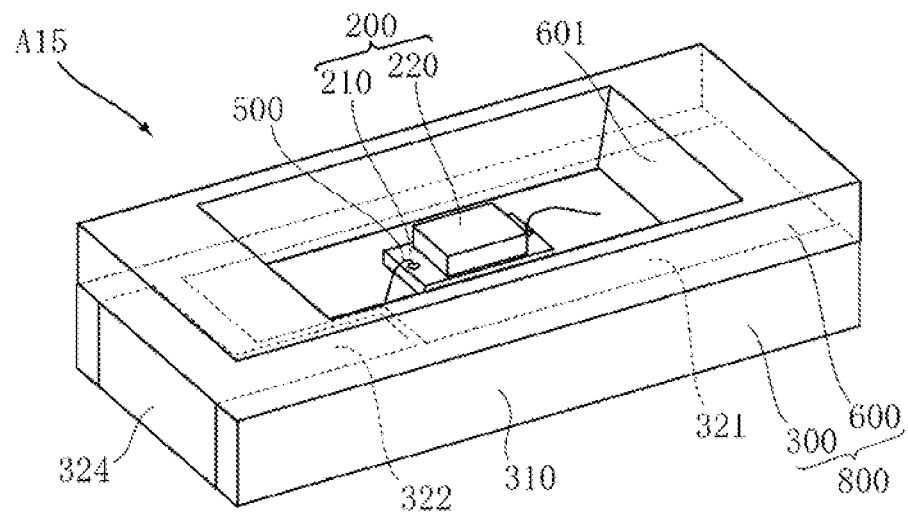
FIG. 49 is a perspective view showing an LED module according to a 15th embodiment of the present disclosure.
Figure 50:
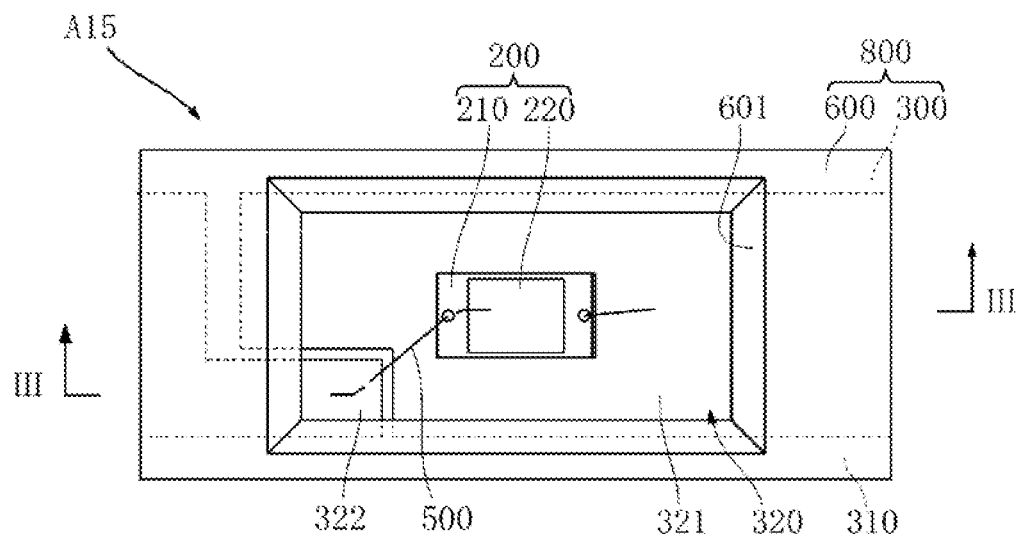
FIG. 50 is a plan view showing the LED module shown in FIG. 49.

FIGS. 46 to 48 show an LED module according to a fourteenth embodiment of the present disclosure. An LED module A14 shown in FIG. 46 has a configuration where the first opening 121 in the LED module A13 is divided by the additional partition 12c, thereby forming a fourth opening 124 below the first opening 121 in FIG. 46. As shown in FIG. 47, two LED units 2, two pads 13, a bonding pad 14a, a bonding pad 14b and four wires 3 are disposed in the first and the fourth opening 121 and 124, respectively. In addition, as shown in FIG. 48, a mounting electrode 155 is disposed in the bottom surface 112. In addition, the fourth opening 124 is filled with a fourth fluorescent resin 44. Other configurations of the LED module A14 are the same as those of the LED module A13.

As shown in FIG. 46, the additional partition 12c is formed to connect the left and the right end of the outer frame 12a in FIG. 46 through the center of the partition 12b in the y-direction. The additional partition 12c is interposed between the second opening 122 and the third opening 123 and between the first opening 121 and the fourth opening 124 in the y-direction. As shown in FIG. 47, the additional partition 12c has a side 121c and a side 124c located below the side 121c in FIG. 47 in the y-direction. In addition, the outer frame 12a has an inner side 124a located below the additional partition 12c in FIG. 47 in the y-direction.

As shown in FIG. 46, in this embodiment, the partition 12b is interposed between the fourth opening 124 and the third opening 123 in the x-direction. The partition 12b has a side 124b located below the additional partition 12c in FIG. 46 in the y-direction. In this embodiment, the first opening 121 is defined by the inner side 121a, the side 121b and the side 121c. The fourth opening 124 is defined by the inner side 124a, the side 124b and the side 124c.

As shown in FIG. 48, the mounting electrode 155 is formed to be aligned with the mounting electrode 151 in the y-direction at the right side of the mounting electrode 152 in FIG. 48 in the x-direction. The bonding pad 14a disposed in the fourth opening 124 makes conductive connection with the mounting electrode 155.

The fourth fluorescent resin 44 covers the two LED chips 21, the bonding pad 14a, the bonding pad 14b and the four wires 3, which are arranged in the fourth opening 124. The fourth fluorescent resin 44 is made of, for example, a mixture of transparent silicone resin and fluorescent material. The fluorescent material emits yellow light when excited by blue light emitted from the LED chip 21. When the yellow light is mixed with the blue light from the LED chip 21, white light is emitted from the fourth opening 124.

In the LED module A14, the third and the fourth fluorescent resin 43 and 44 may be different from or the same as the first and the second fluorescent resin 41 and 42. For example, if the third and the fourth fluorescent resin 43 and 44 are different from the first and the second fluorescent resin 41 and 42, more kinds of light can be mixed and thus more kinds of white light can be emitted by the LED module A14.

The LED modules of the present disclosure are not limited to the above-described embodiments. Details of various components of the LED modules of the present disclosure may be changed in design in various ways.

Although in the above-described embodiments a plurality of LED chips is disposed in each opening, the LED modules of the present disclosure are not limited to this configuration. A single LED chip may be disposed in each opening.

Further, in the above-described LED module A8, the LED units 2 in the first opening 121 have the same arrangement as the LED units 2 in the second opening 122. However, the LED modules of the present disclosure are not limited to this configuration. For example, the LED units 2 in the first opening 121 may be arranged to be in symmetry with the LED units 2 in the second opening 122 with the partition 12b interposed therebetween.

Although the above-described LED modules A12 to A14 are configured by using the LED units 2 shown in the LED module A8, they may also be configured by using the LED units 2 shown in the LED modules A9 to A11.

Next, an LED module capable of achieving compactness and high luminance will be described in detail with reference to FIGS. 49 to 71.

FIGS. 49 to 52 show an LED module according to a fifteenth embodiment of the present disclosure. An LED module A15 of this embodiment includes a substrate 300, an LED chip 200, two wires 500, a reflector 600 and a sealing resin 700. For convenience, the sealing resin 700 is not shown in FIGS. 49 and 50.

The substrate 300 includes a base 310 and a wiring pattern 320 formed on the base 310. The base 310 has a rectangular shape and is made of, for example, glass epoxy resin. The wiring pattern 320 is made of for example, a metal such as Cu, Ag or the like, and includes bonding portions 321 and 322, bypass portions 323 and 324, and mounting terminals 325 and 326. The bonding portions 321 and 322 are formed on the top side of the base 310. The bypass portions 323 and 324 are connected to the bonding portions 321 and 322 and formed in both sides of the base 310, respectively. The mounting terminals 325 and 326 are formed on the bottom side of the base 310 and connected to the bypass portions 323 and 324, respectively. The mounting terminals 325 and 326 are used to mount the LED module A15 on, for example, a circuit board.

Figure 52:
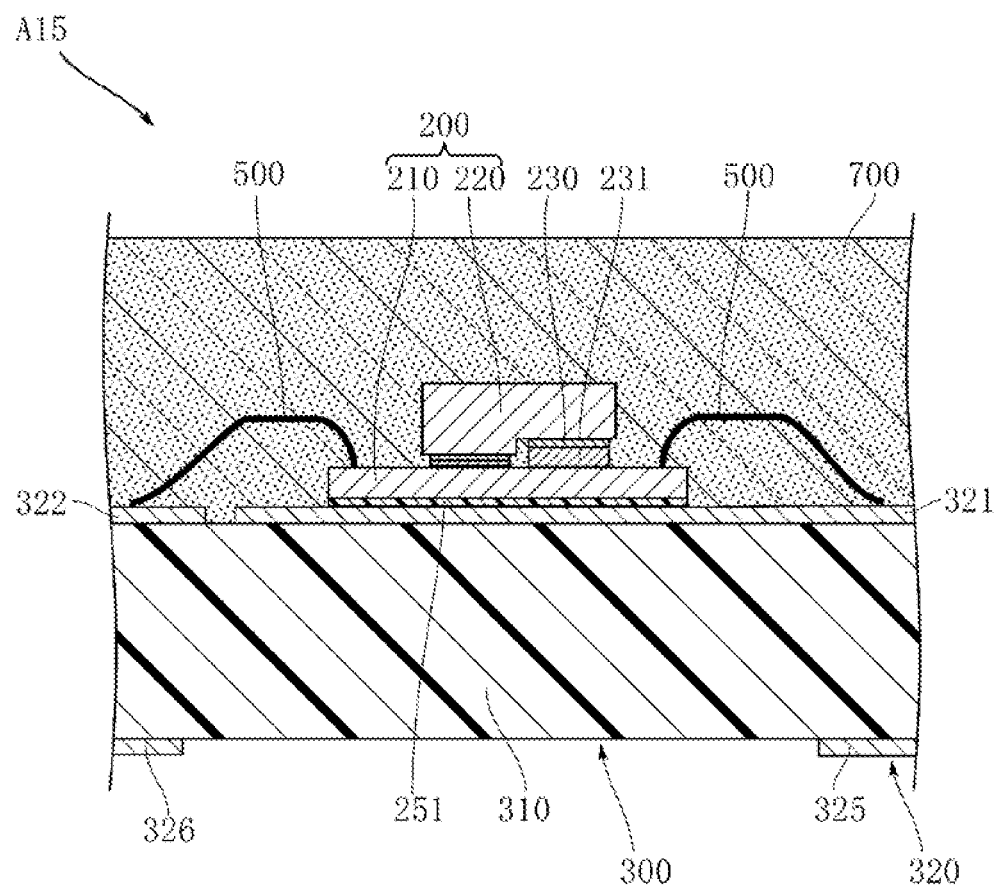
FIG. 52 is a main part enlarged sectional view showing the LED module shown in FIG. 1.

The LED chip 200 emits, for example, blue light, and includes a submount substrate 210 made of Si and a semiconductor layer 220 which includes an n-type semiconductor layer made of, for example, GaN, an active layer and a p-type semiconductor layer. As shown in FIG. 52, two electrode pads 230 are formed on the semiconductor layer 220 on the side facing the submount substrate 210. The electrode pads 230 are bonded to a wiring pattern (not shown), which is formed on the submount substrate 210 by means of a conductive paste 231. The submount substrate 210 is bonded to the bonding portion 321 by means of an insulating paste 251. Two electrodes (not shown) are formed on the submount substrate 210. Ends of the two wires 500 are bonded to the two electrodes, respectively, thereby configuring the LED chip 200 as a so-called 2-wire type. The other end of one wire 500 is bonded to the bonding portion 321 and the other end of the other wire 500 is bonded to the bonding portion 322. In addition, a zener diode (not shown) to prevent an excessive reverse voltage from being applied to the semiconductor layer 220 is formed on the submount substrate 210.

The reflector 600 is made of, for example, white epoxy resin or liquid crystal polymer (LCP) and has a frame shape surrounding the LED chip 200. The reflector 600 is formed with a reflecting surface 601. In this embodiment, the reflecting surface 601 is inclined in such a manner that it is farther away from the LED chip 200 in a direction perpendicular to the thickness direction of the substrate 300 as it becomes more spaced apart from the substrate 300 in the thickness direction of the substrate 300. The reflecting surface 601 is an uneven surface to scatter light from the LED chip 200. The roughness of the uneven surface may be, for example, 1 μm to 10 μm (preferably 1 μm to 6 μm) in Ry (maximum height). The substrate 300 and the reflector 600 together form a supporting member 800. Ry (maximum height) is defined in JIS B 0601 and JIS B 0031 and refers to a distance in micrometers (μm), the distance being obtained by sampling the roughness curve by a reference length in a direction of an average line of the roughness curve and measuring a distance between a summit line and a valley line of said sampled roughness curve in a direction of longitudinal magnification of the roughness curve.

The sealing resin 700 covers the LED chip 200 and fills a space surrounded by the reflecting surface 601. The sealing resin 700 is made of, for example, a mixture of transparent epoxy resin and fluorescent material. The fluorescent material emits yellow light, for example when excited by blue light emitted from the semiconductor layer 220 of the LED chip 200. When the yellow light is mixed with the blue light, white light is emitted from the LED module A15. Alternatives to the above-mentioned fluorescent material may include a fluorescent material emitting red light and a fluorescent material emitting green light when excited by the blue light.

A method of manufacturing the LED module A15 will be described in brief below, by way of example. First, the semiconductor layer 220 is bonded to the submount substrate 210. Next, the reflector 600 is formed on the substrate 300 by using a mold. The mold has an uneven surface for use in forming the reflecting surface 601. The roughness of the uneven surface may be, for example, 1 μM to 10 μm (preferably 1 μm to 6 μm) in Ry (maximum height). Next, the LED chip 200 is mounted on the substrate 300. Next, the wires 500 are bonded to the LED chip 200. Finally, the sealing resin 700 is formed to complete the LED module A15.

Figure 51:
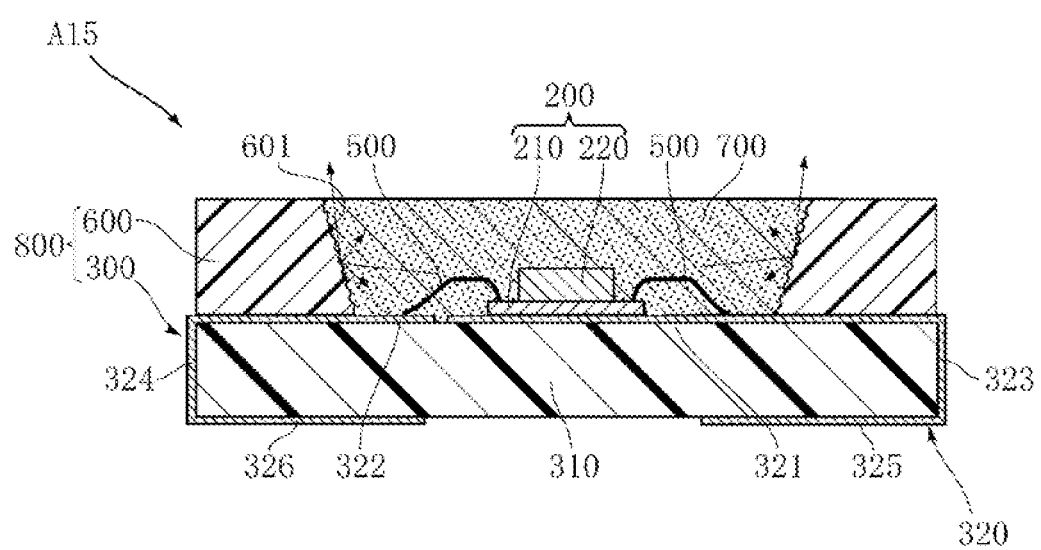
FIG. 51 is a sectional view taken along line III-III in FIG. 50.

Next, operation of the LED module A15 will be described. According to this embodiment, as shown in FIG. 51, light propagating laterally from the LED chip 200 is scattered by the reflecting surface 601. The scattered light includes light having an incidence angle smaller than a critical angle to the top side of the sealing resin 700 and not being totally reflected. This facilitates reliable emission of some light propagating onto the reflecting surface 601 from the sealing resin 700, which may result in compactness and high luminance of the LED module A15.

When the reflector is made of white resin, more light can be emitted from the sealing resin 700. Studies of the present inventors showed that an effect of high luminance could be greatly improved when the roughness of the reflecting surface 601 was 1 μm to 10 μm (preferably 1 μm to 6 μm) in Ry (maximum height).

FIGS. 53 to 71 show other embodiments of the present disclosure. In FIGS. 53 to 71, the same or similar elements as the above-described embodiments are denoted by the same reference numerals.

Figure 53:
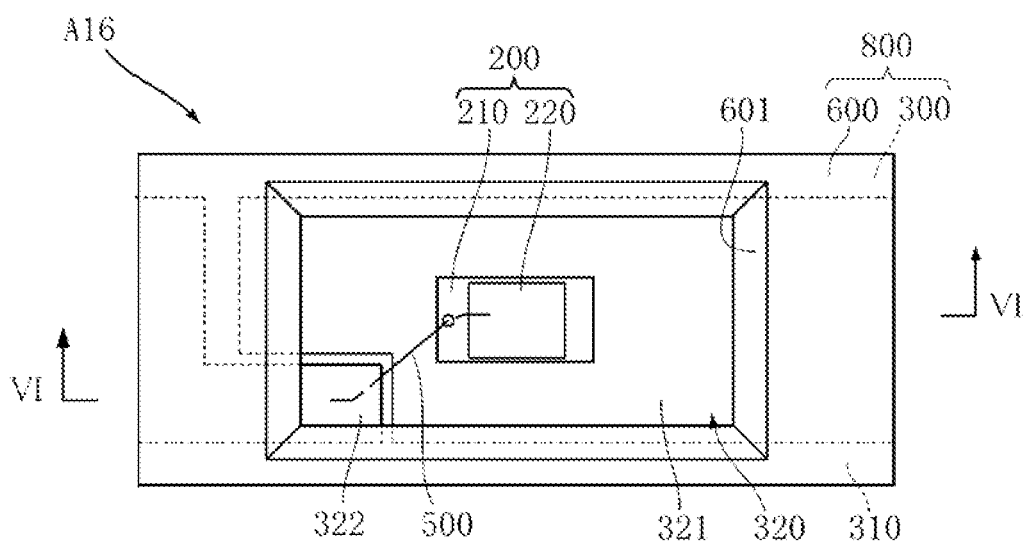
FIG. 53 is a plan view showing an LED module according to a 16th embodiment of the present disclosure.
Figure 54:
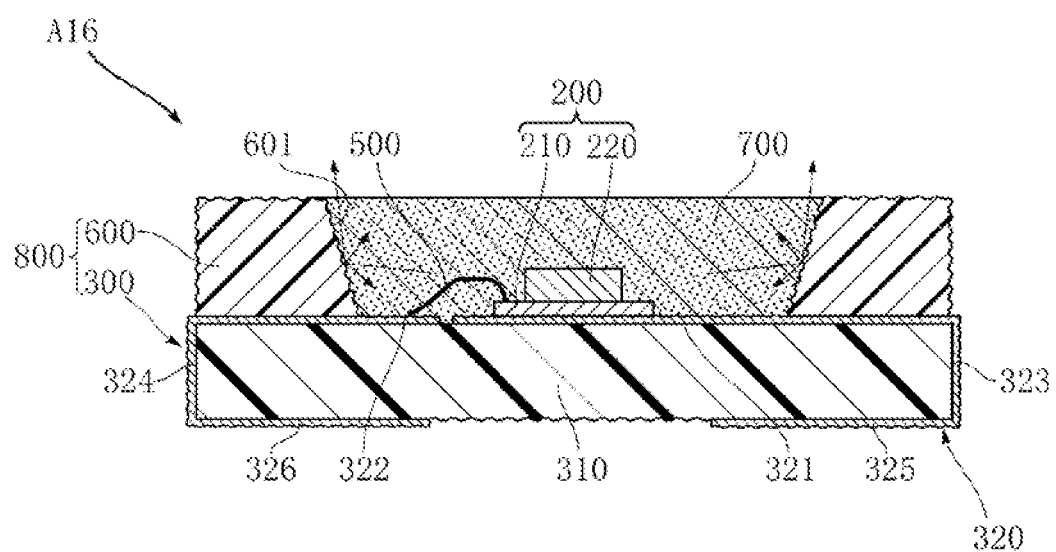
FIG. 54 is a sectional view taken along line VI-VI in FIG. 53.
Figure 55:
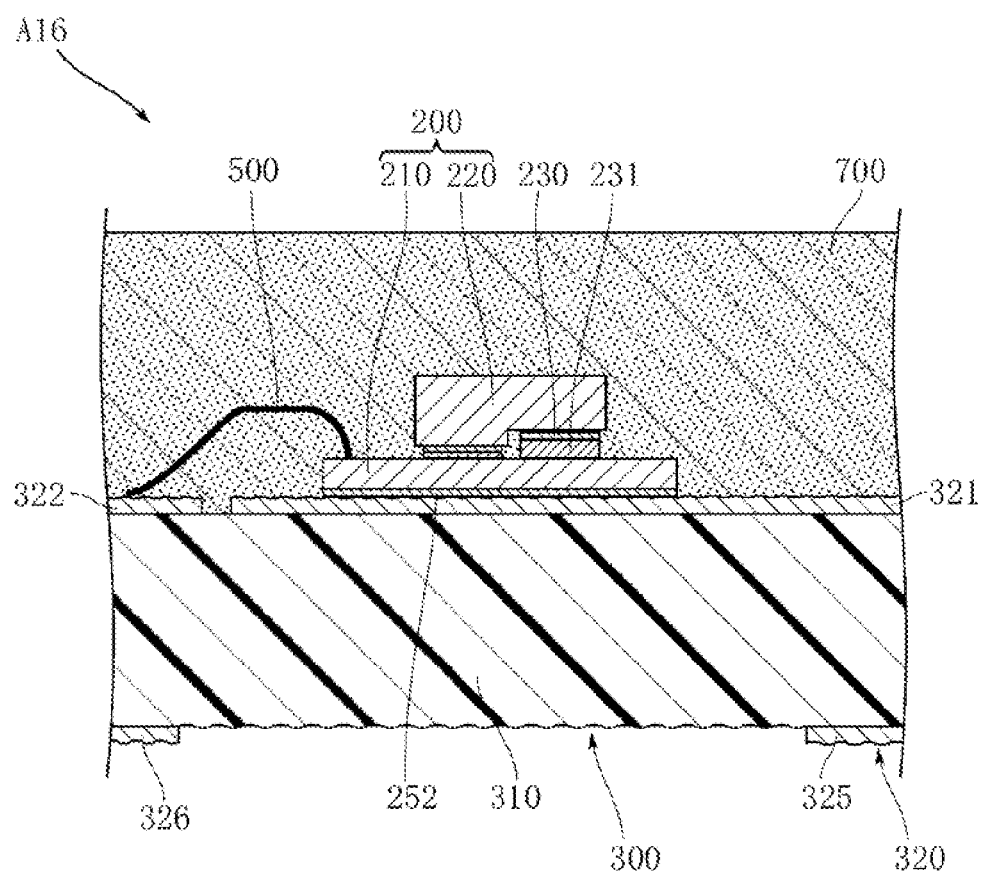
FIG. 55 is a main part enlarged sectional view showing the LED module shown in FIG. 53.
Figure 56:
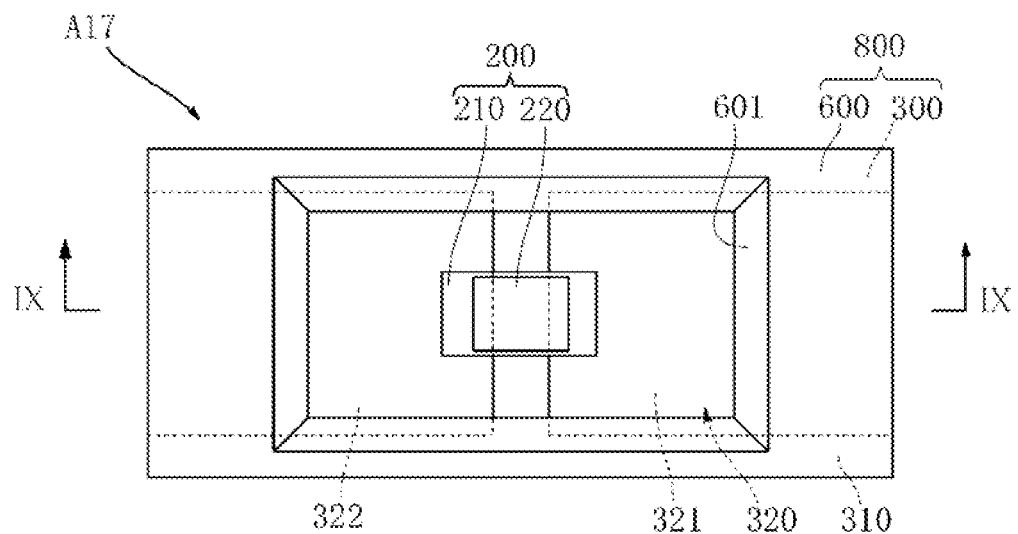
FIG. 56 is a plan view showing an LED module according to a 17th embodiment of the present disclosure.
Figure 57:
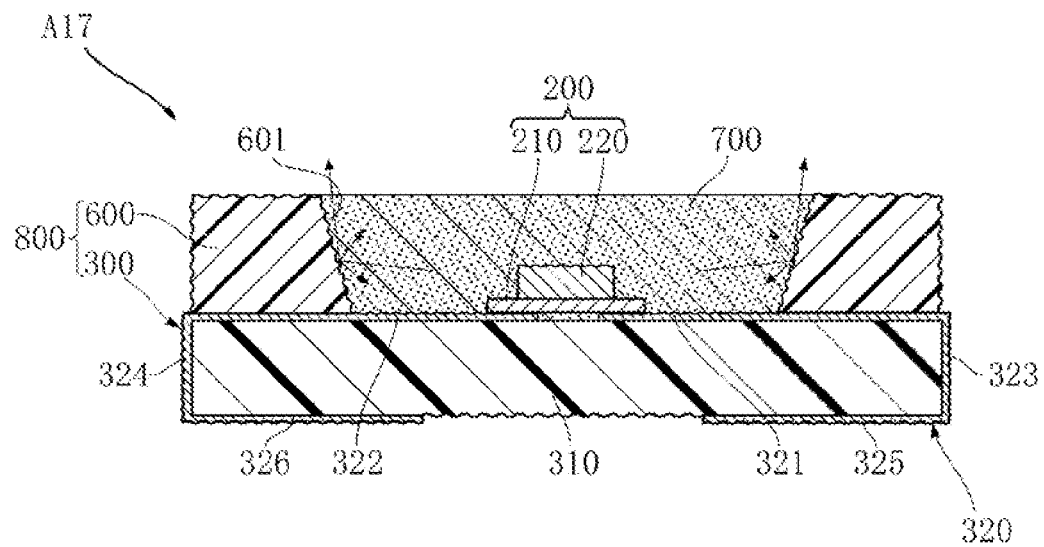
FIG. 57 is a sectional view taken along line IX-IX in FIG. 56.

FIGS. 53 to 55 show an LED module according to a sixteenth embodiment of the present disclosure. An LED module A16 of this embodiment is different in configuration of the LED chip 200 and a range of uneven surfaces from the above-described LED module A15.

As shown in FIG. 55, in this embodiment, only one wire 500 is bonded to the submount substrate 210 of the LED chip 200, and the LED chip 200 is a so-called 1-wire type. The wire 500 is connected to the bonding portion 322. An electrode (not shown) is formed on the bottom side of the submount substrate 210. This electrode is bonded to and makes conductive connection with the bonding portion 321 by means of a conductive paste 252.

As shown in FIGS. 54 and 55, in this embodiment, not only the reflecting surface 601 but also an outer surface of the reflector 600, an Outer surface of the substrate 300 and a region surrounded by the reflecting surface 601 have unevenness. A method of manufacturing the LED module A16 will be described in brief below, by way of example. First, the semiconductor layer 220 is bonded to the submount substrate 210. Next, the reflector 600 is formed on the substrate 300 by using a mold. Next, the reflecting surface 601 of the reflector 600 is subjected to a shot blasting treatment. In the shot blasting treatment, particles of shot material collide with not only the reflecting surface 601 but also the exposed surfaces of the reflector 600 and the substrate 300. Accordingly, most of the exposed surfaces of the reflector 600 and the substrate 300 are subjected to the shot blasting treatment. Next, the LED chip 200 is mounted on the substrate 300. Next, the wire 500 is bonded to the LED chip 200. Finally, the sealing resin 700 is formed to complete the LED module A16.

This embodiment can also achieve compactness and high luminance of the LED module A16.

FIGS. 56 to 59 show an LED module according to a seventeenth embodiment of the present disclosure. An LED module A17 of this embodiment is different in configuration of the LED chip 200 and a range of uneven surfaces from the above-described LED modules A15 and A16.

Figure 58:
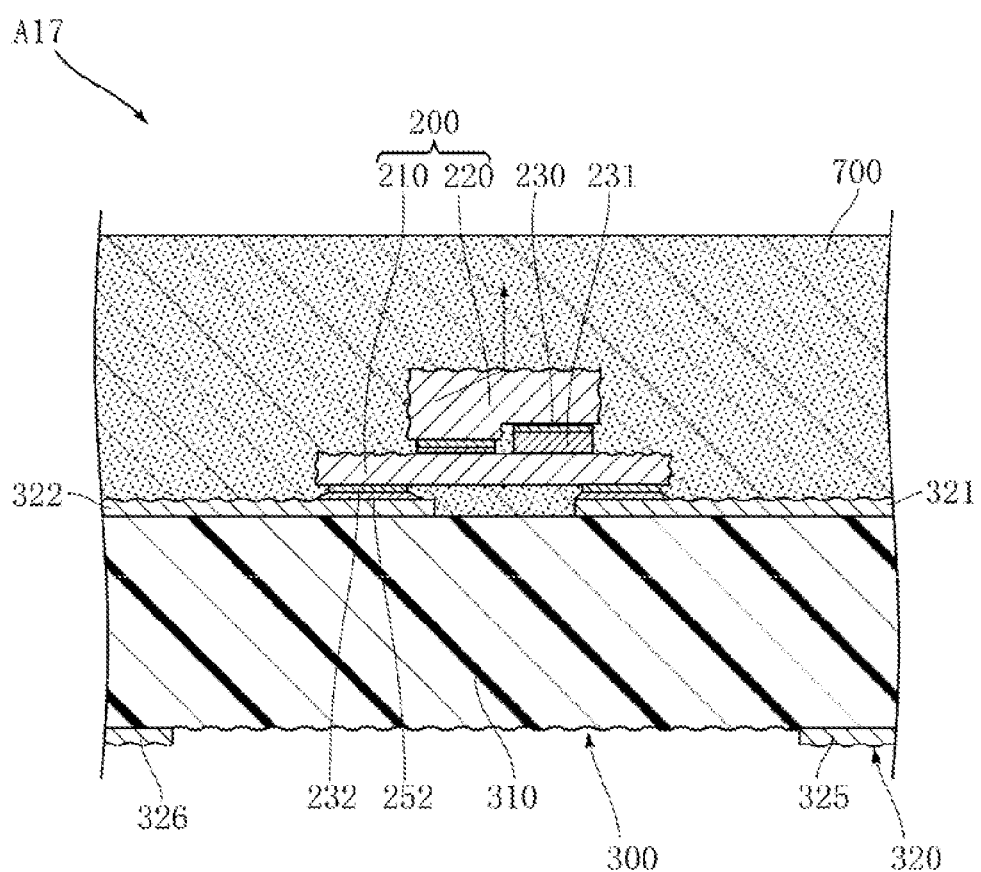
FIG. 58 is a main part enlarged sectional view showing the LED module shown in FIG. 56.

As shown in FIG. 58, in this embodiment, two electrode pads 232 are formed on the bottom side of the submount substrate 210 of the LED chip 200. These electrode pads 232 make conductive connection with two electrode pads 230 via conduction paths (not shown) formed in the submount substrate 210. The two electrode pads 232 are bonded to and make conductive connection with the bonding portions 321 and 322 via conductive pastes 252, respectively. The LED chip 200 having this configuration is called a flip chip type.

In this embodiment, like the LED module A16, most parts of the reflector 600 and the substrate 300 have uneven surfaces. In addition, as shown in FIG. 58, the top side and exposed surface of the LED chip 200 also have unevenness. A method of manufacturing the LED module A17 will be described in brief below, by way of example. First, the semiconductor layer 220 is bonded to the submount substrate 210. Next, the reflector 600 is formed on the substrate 300 by using a mold. Next, the LED chip 200 is mounted on the substrate 300. Next, the reflecting surface 601 of the reflector 600 is subjected to a shot blasting treatment. In the shot blasting treatment, particles of shot material collide with not only the reflecting surface 601 but also exposed surfaces of the reflector 600, the substrate 300 and the LED chip 200. Accordingly, most of the exposed surfaces of the reflector 600, the substrate 300, and the LED chip 200 are subjected to the shot blasting treatment. Finally, the sealing resin 700 is formed to complete the LED module A17. The roughness of the top side of the LED chip 200 may be 1 μm to 10 μm (preferably 1 to 6 μm) in Ry (maximum height).

This embodiment can also achieve compactness and high luminance of the LED module A17. In addition, as shown in FIG. 58, some of the light generated in the semiconductor layer 220 of the LED chip 200 propagates within the semiconductor layer 220 to be incident on the top side of the semiconductor layer 220. Since the top side of the semiconductor layer 220 has unevenness and an incidence angle of light onto an uneven surface is greater than that onto a flat surface, totally-reflected light can be emitted from the semiconductor layer 220, thereby further accelerating the high luminance of the LED module A17.

Figure 59:
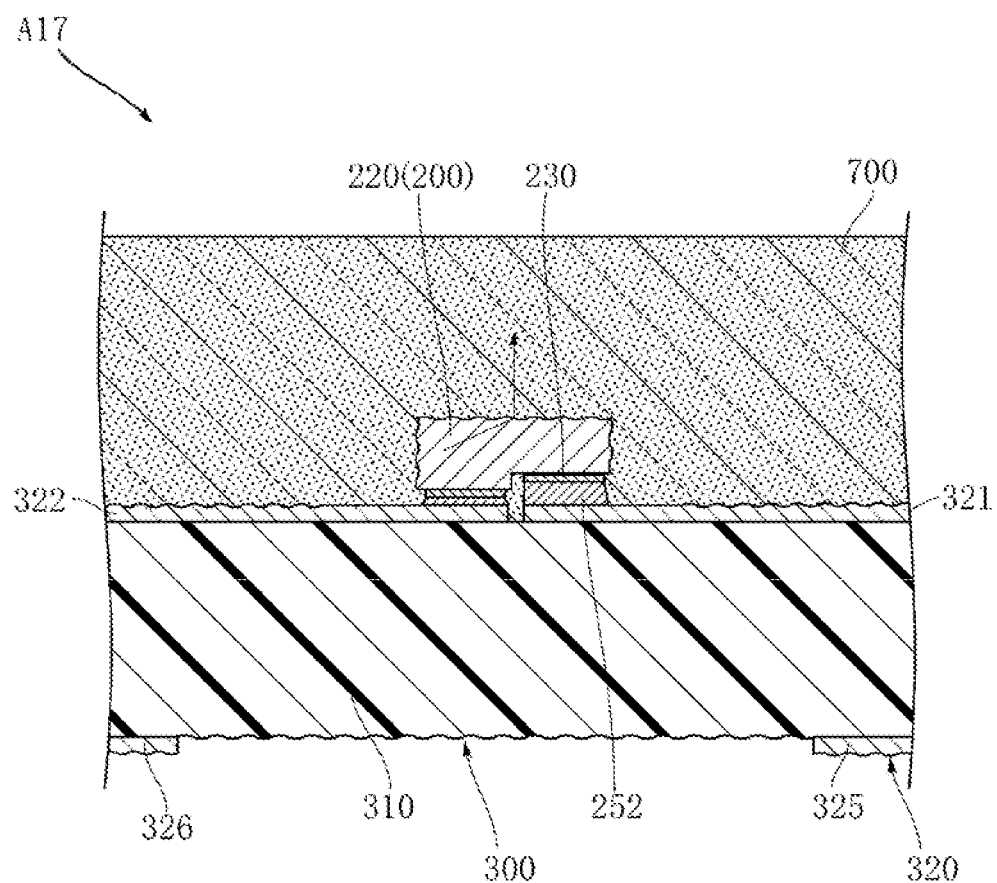
FIG. 59 is a main part enlarged sectional view showing a modification of the LED chip in the LED module shown in FIG. 56.

FIG. 59 shows a modification of the LED module A17. In this modification, the LED chip 200 includes the semiconductor layer 220 but does not include the submount substrate 210. The LED chip 200 is a flip chip type and is mourned on the substrate 300 without using wires. Also in this embodiment, most of the top side and exposed surface of the LED chip 200 have unevenness through the above-described process of manufacturing the LED module A17.

This modification can also accelerate the high luminance of the LED module A17.

The LED chip 200 of the LED modules A16 and A17 may also be used in the LED module A15. In addition, the LED chip of the LED modules A15 and A17 may also be used in the LED module A16.

Figure 60:
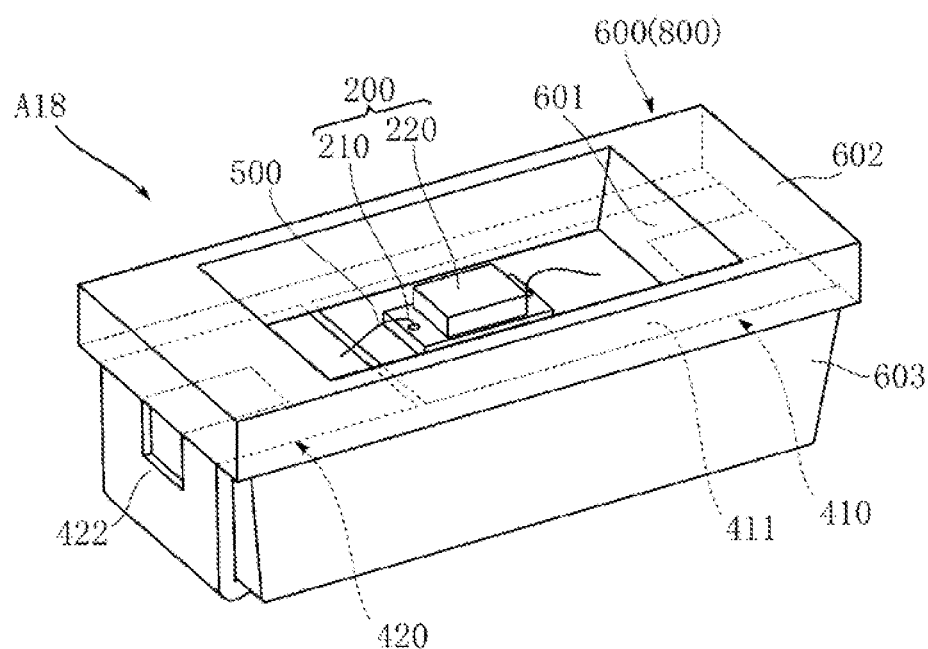
FIG. 60 is a perspective view showing an LED module according to an 18th embodiment of the present disclosure.
Figure 61:
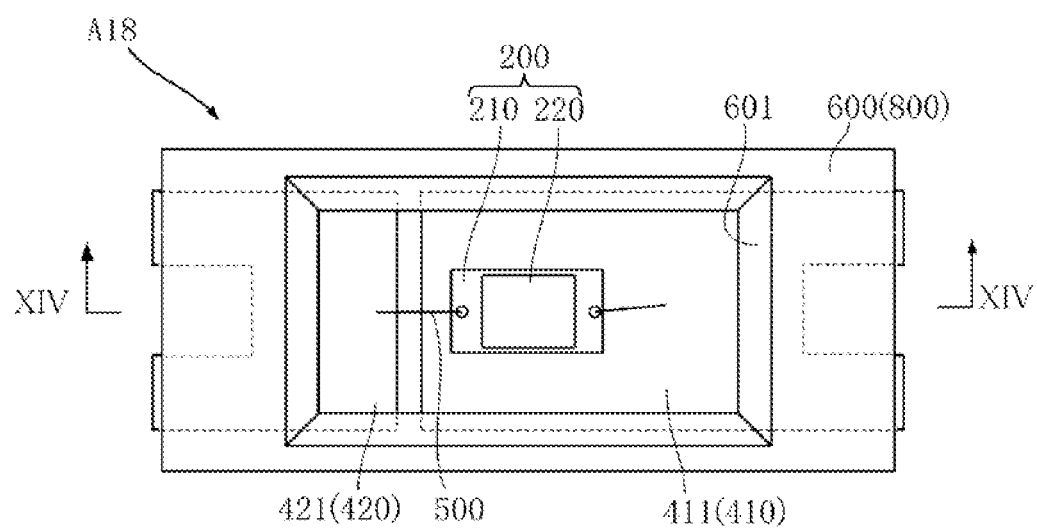
FIG. 61 is a plan view showing the LED module shown in FIG. 60.
Figure 62:
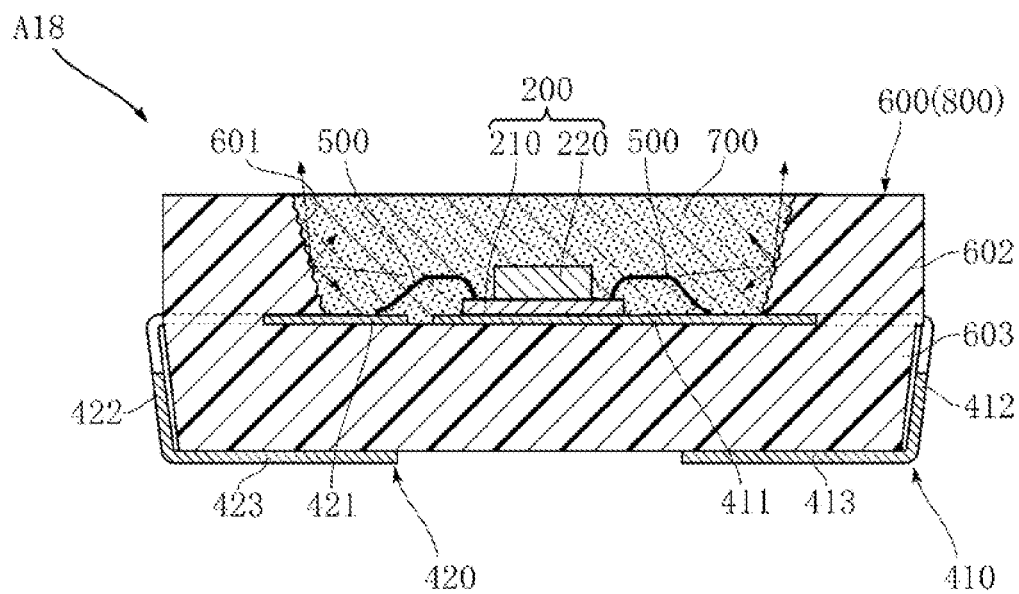
FIG. 62 is a sectional view taken along line XIV-XIV in FIG. 61.

FIGS. 60 to 62 show an LED module according to an eighteenth embodiment of the present disclosure. An LED module A18 of this embodiment is different from the above-described LED modules A15 to A17 in that the LED module A18 includes leads 410 and 420 and has a different configuration of the reflector 600.

The leads 410 and 420 are formed by subjecting a plate made of, for example, Cu or a Cu alloy to a blanking or a bending treatment. The lead 410 includes a bonding portion 411, a bypass portion 412 and a mounting terminal 413. The lead 420 includes a bonding portion 421, a bypass portion 422 and a mounting terminal 423. The LED chip 200 is bonded to the bonding portion 411. The bonding portion 411 and the mounting terminal 413 are arranged substantially in parallel and interconnected by the bypass portion 412. The bonding portion 421 and the mounting terminal 423 are arranged substantially in parallel and interconnected by the bypass portion 422. In this embodiment, the LED chip 200 is of the 2-wire type shown in FIG. 52. One of the two wires 500 is bonded to the bonding portion 411 and the other is bonded to the bonding portion 421.

The reflector 600 includes a frame unit 602 and a base 603. The frame unit 602 is formed with the reflecting surface 601 and surrounds the LED chip 200. The base 603 is connected to the bottom of the frame unit 602 and embraced by the leads 410 and 420. In this embodiment, the supporting member 800 is formed by only the reflector 600. The LED module A18 is similar to the LED module A15 in that only the reflecting surface 601 has unevenness, and a method of manufacturing the LED module A18 is similar to the method of manufacturing the LED module A15.

This embodiment can also achieve compactness and high luminance of the LED module A18. The leads 410 and 420 formed of the metal plate have relatively high thermal conductivities to allow heat generated in the LED chip 200 to be more efficiently radiated out of the LED module A18.

Figure 63:
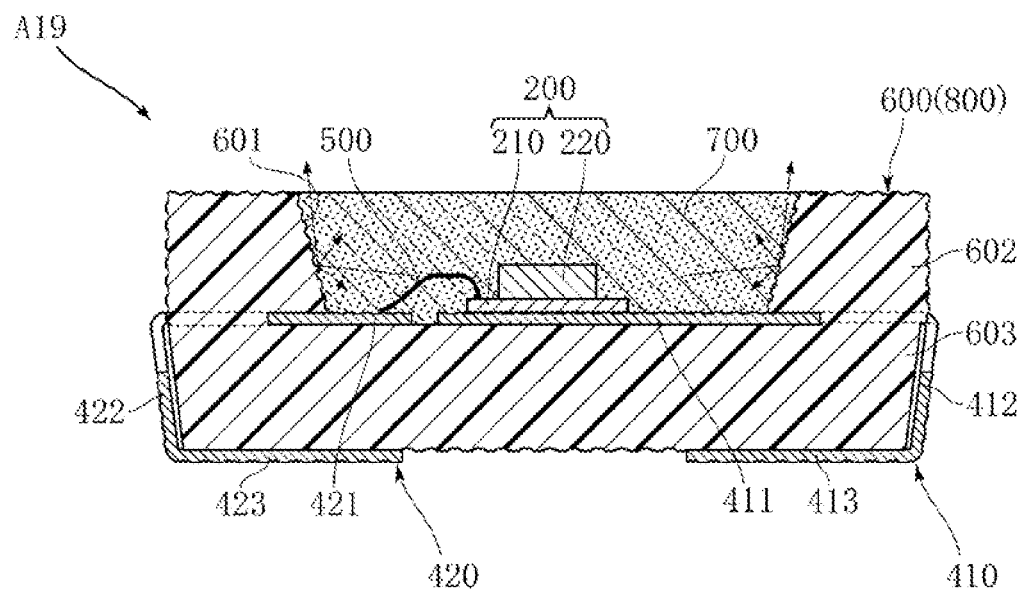
FIG. 63 is a sectional view showing an LED module according to a 19th embodiment of the present disclosure.

FIG. 63 shows an LED module according to a nineteenth embodiment of the present disclosure. An LED module A19 of this embodiment is different in configuration of the LED chip 200 and a range of uneven surfaces from the above-described LED module A18. In this embodiment, the LED chip 200 is of the I-wire type shown in FIG. 55. In addition, in this embodiment, like the LED module A16, the outer surface of the reflector 600 and most of the region covered by the sealing resin 700 have unevenness. A method of manufacturing the LED module A19 is similar to the method of manufacturing the LED module A16. This embodiment can also achieve compactness and high luminance of the LED module A19.

Figure 64:
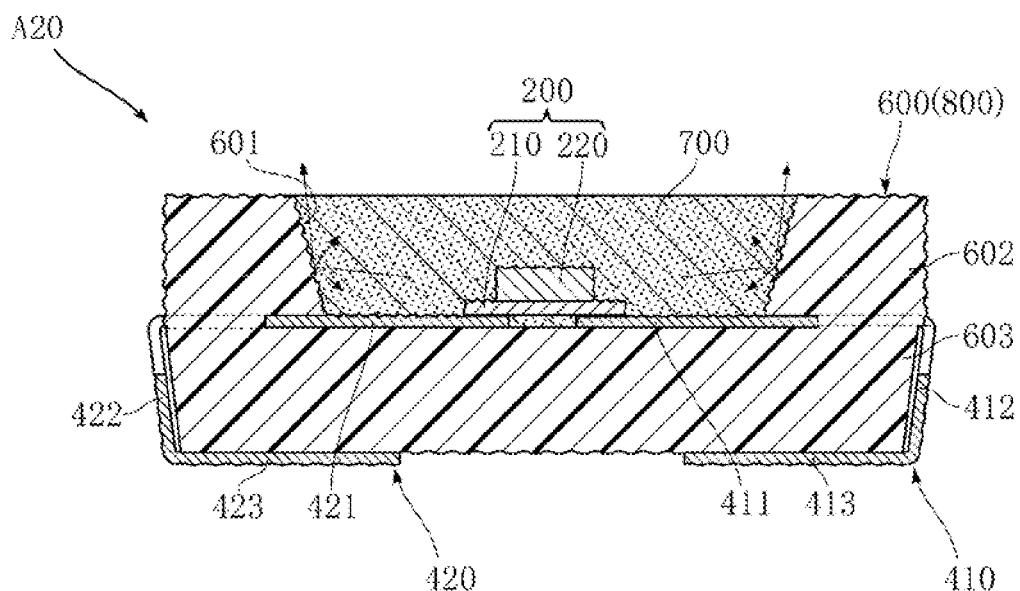
FIG. 64 is a sectional view showing an LED module according to a 20th embodiment of the present disclosure.

FIG. 64 shows an LED module according to a twentieth embodiment of the present disclosure. An LED module A20 of this embodiment is different in configuration of the LED chip 200 and a range of uneven surfaces from the above-described LED modules A18 and A19. In this embodiment, the LED chip 200 is of the so-called flip chip type shown in FIG. 58. In addition, in this embodiment, most of the reflector 600 and the LED chip 200 have unevenness. A method of manufacturing the LED module A20 is similar to the method of manufacturing the LED module A17. In addition, the LED chip 200 shown in FIG. 59 may be used in the LED module A20. This embodiment can also achieve compactness and high luminance of the LED module A20.

FIGS. 65 to 68 show an LED module according to a twenty-first embodiment of the present disclosure. An LED module A21 of this embodiment is different from the above-described LED modules A15 to A20 in that the former include three LED chips 200 and 201. The LED module A21 includes leads 430 to 435, three LED chips 200 and 201, a reflector 600 and a sealing resin 700. For convenience, the sealing resin 700 is not shown in FIG. 65.

The leads 430 to 435 are made of, for example, Cu or a Cu alloy, and partially covered by the reflector 600. In this embodiment, the supporting member 800 is formed by the leads 430 to 435 and the reflector 600.

The two LED chips 200 are of the 2-wire type shown in FIG. 52. One of the LED chips 200 emits blue light and the other emits green light. The LED chip 201 is one example of the additional LED chip mentioned in the present disclosure and emits red light. The three LED chips 200 and 201 are mounted in a column on the lead 430.

Figure 65:
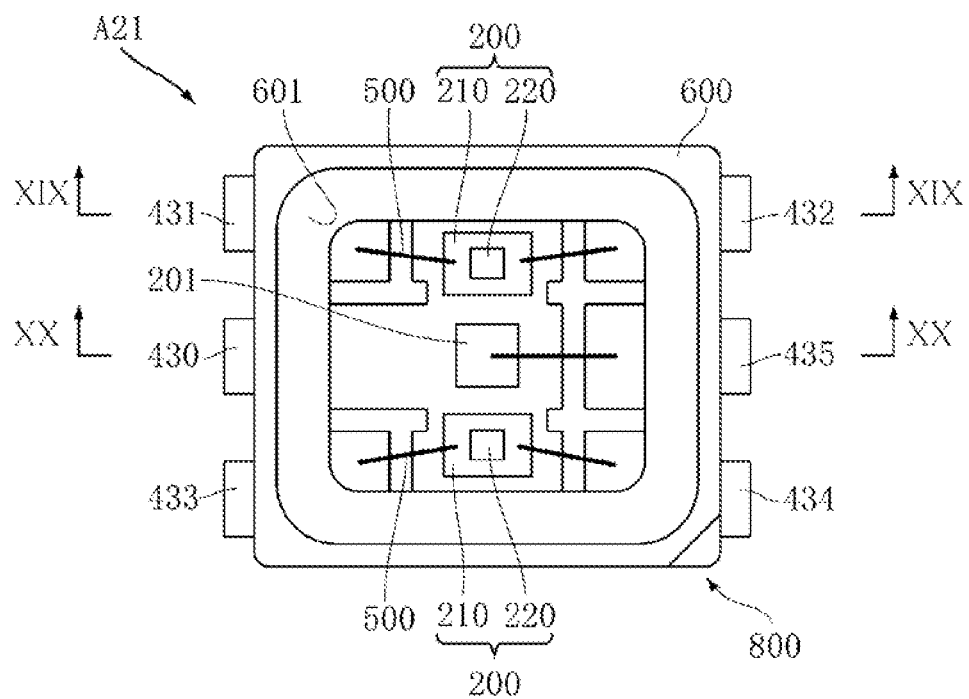
FIG. 65 is a plan view showing an LED module according to a 21st embodiment of the present disclosure.
Figure 66:
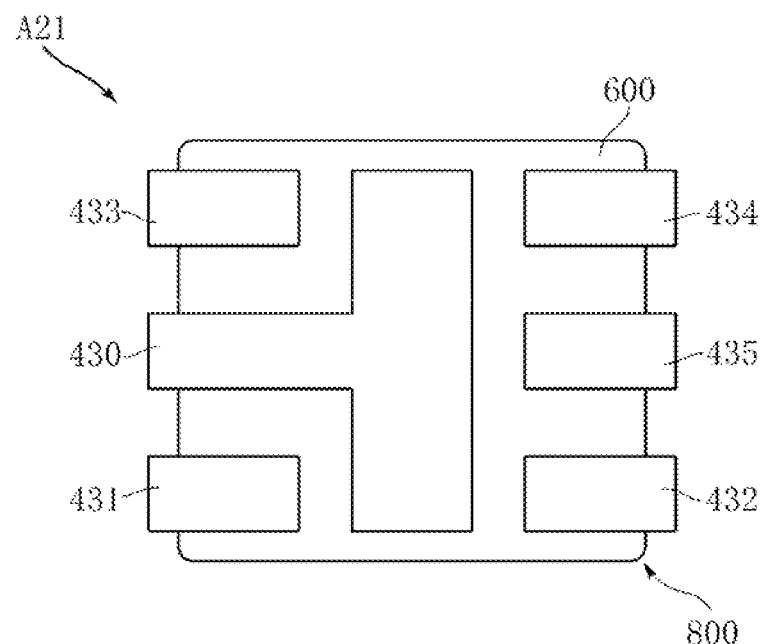
FIG. 66 is a bottom view of the LED module shown in FIG. 65.
Figure 67:
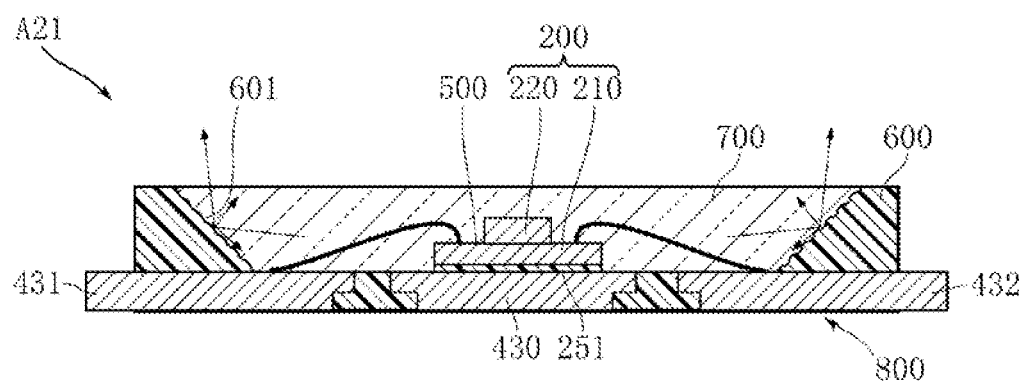
FIG. 67 is a sectional view taken along line XIX-XIX in FIG. 65.
Figure 68:
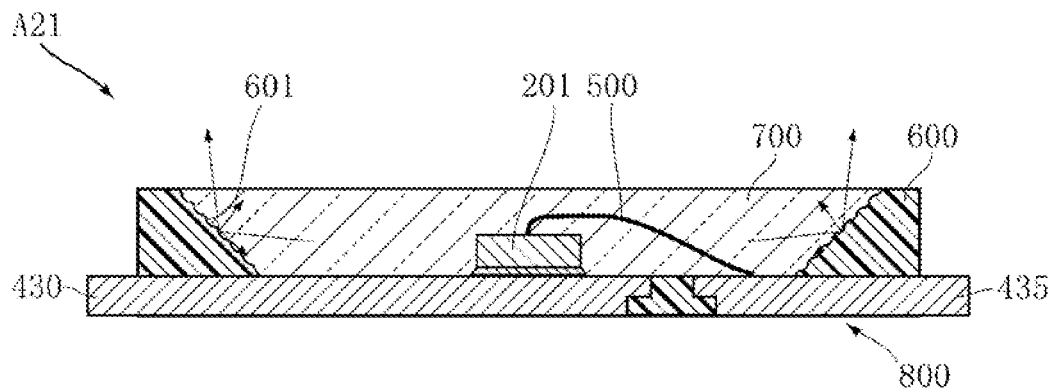
FIG. 68 is a sectional view taken along line XX-XX in FIG. 65.

Two wires 500 bonded to the LED chip 200 located at the upper side in FIG. 65 are bonded to the leads 431 and 432, respectively. Two wires 500 bonded to the LED chip 200 located at the lower side in FIG. 65 are bonded to the leads 433 and 434, respectively.

The LED chip 201 has a bottom side corresponding to an electrode surface on which an electrode is formed, and is bonded to and makes conductive connection with the lead 430. One end of a wire 500 is bonded to a top side of the LED chip 201. The other end of the wire 500 is bonded to the lead 435.

The sealing resin 700 is formed of, for example, transparent epoxy resin. In this embodiment, no fluorescent material is mixed with the sealing resin 700.

In this embodiment, only the reflecting surface 601 of the reflector 600 has unevenness. A method of manufacturing the LED module A21 is similar to the method of manufacturing the LED module A15.

This embodiment can also achieve compactness and high luminance of the LED module A21. In addition, when the red, green and blue light emitted from the three LED chips 200 and 201 are mixed together, white light can be emitted. In addition, light having a variety of tones can be emitted by individually controlling currents flowing into the three LED chips 200 and 201.

Figure 69:
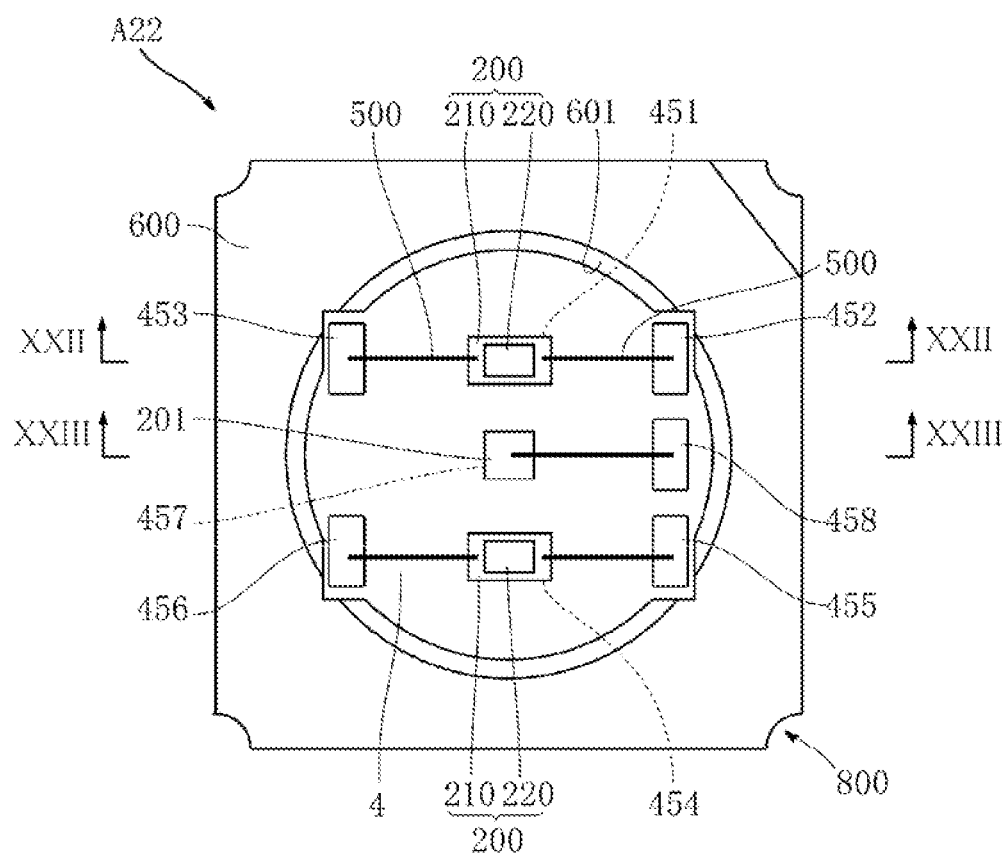
FIG. 69 is a plan view showing an LED module according to a 22nd embodiment of the present disclosure.
Figure 70:
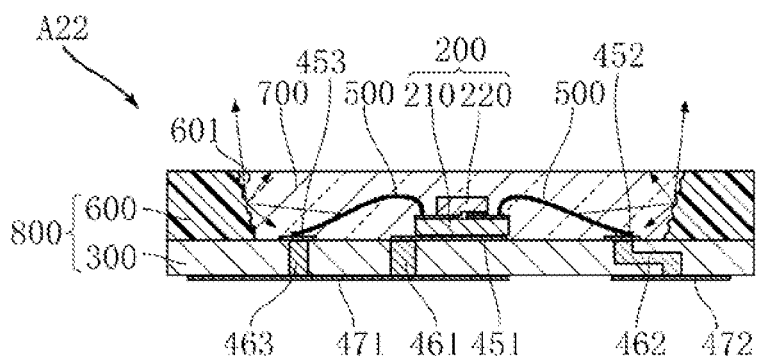
FIG. 70 is a sectional view taken along line XXII-XXII in FIG. 69.
Figure 71:
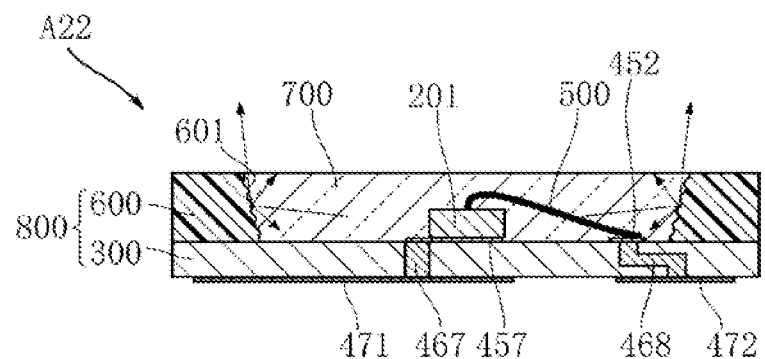
FIG. 71 is a sectional view taken along line XXIII-XXIII in FIG. 69.

FIGS. 69 to 71 show an LED module according to a twenty-second embodiment of the present disclosure. An LED module A22 of this embodiment is different from the above-described LED module A21 in that the supporting member 800 is formed by the substrate 300 and the reflector 600, and bonding pads 451 to 458, through conductors 461 to 468 (through conductors 464, 465, 466 are not shown), and mounting terminals 471 and 472 are formed in the substrate 300.

The substrate 300 is a ceramic substrate formed by firing, for example, a plurality of stacked ceramic material sheets. In this embodiment, only the reflecting surface 601 of the reflector 600 has unevenness.

The bonding pads 451 to 458 are made of, for example, Ag or Cu. Two LED chips 200 are mounted on the bonding pads 451 and 454, respectively. Two wires 500 connected to one of the LED chips 200 are bonded to the bonding pads 452 and 453, respectively. Two wires 500 connected to the other LED chip 200 are bonded to the bonding pads 455 and 456, respectively. The LED chip 201 is mounted on the bonding pad 457 and wires 500 connected to the LED chip 201 are bonded to the bonding pad 458.

This embodiment can also achieve compactness and high luminance of the LED module A22. In addition, when the red, green and blue light emitted from the three LED chips 200 and 201 are mixed together, white light can be emitted.

The LED modules of the present disclosure are not limited to the above-described embodiments. Details of various components of the LED modules of the present disclosure may be changed in design in various ways.

Figure 74:
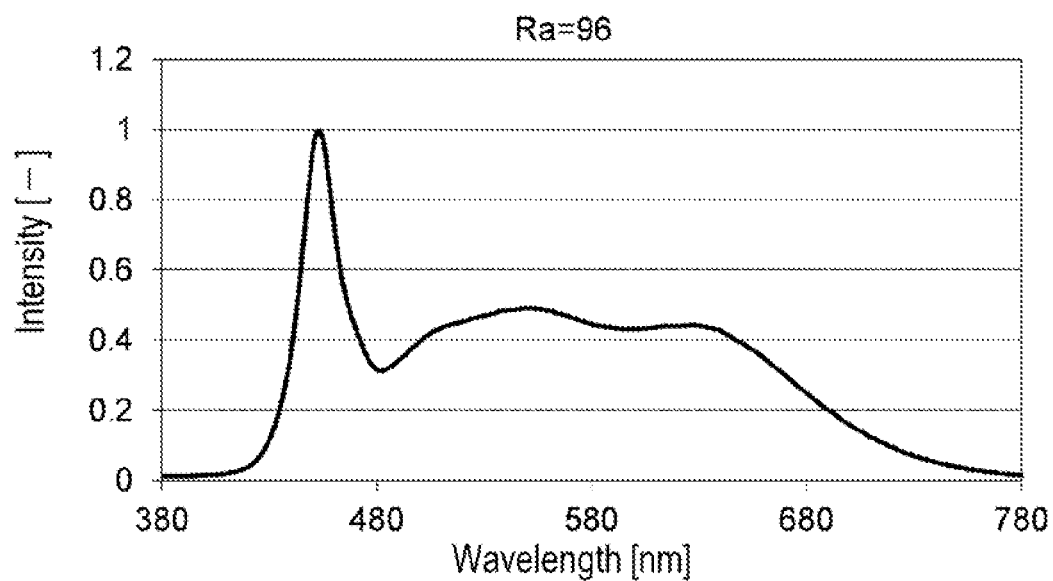
FIG. 74 is a graph showing an emission spectrum of the LED module according to the 23rd embodiment of the present disclosure.
Figure 75:
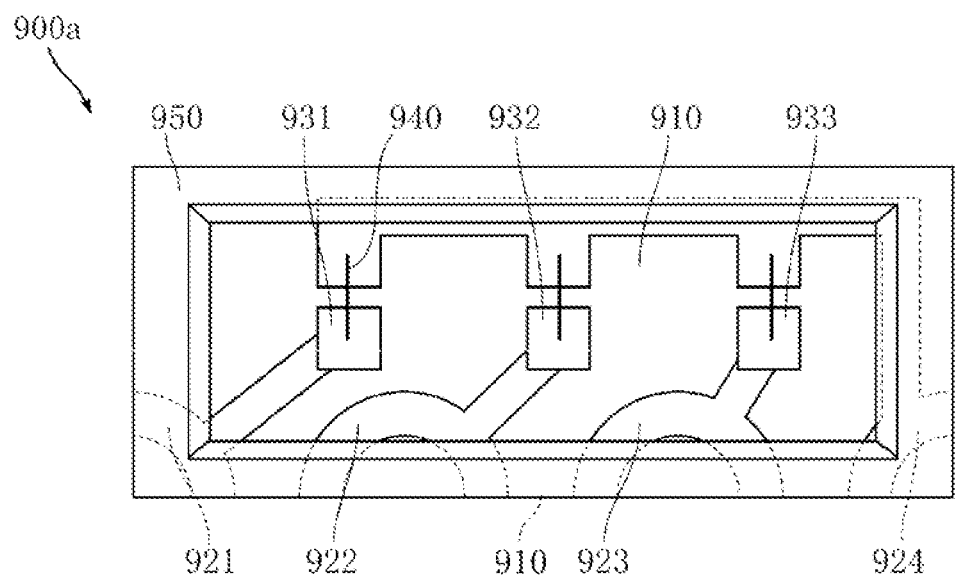
FIG. 75 is a sectional view showing one example of a conventional LED module.
Figure 76:
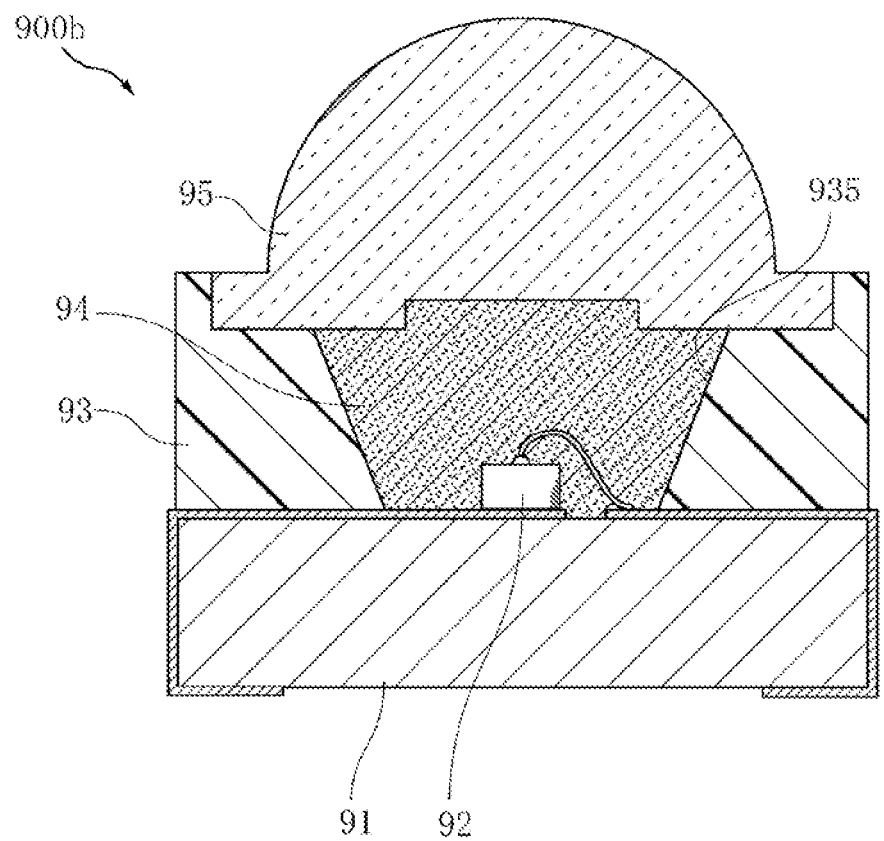
FIG. 76 is a sectional view showing one example of a conventional LED module.
Figure 77:
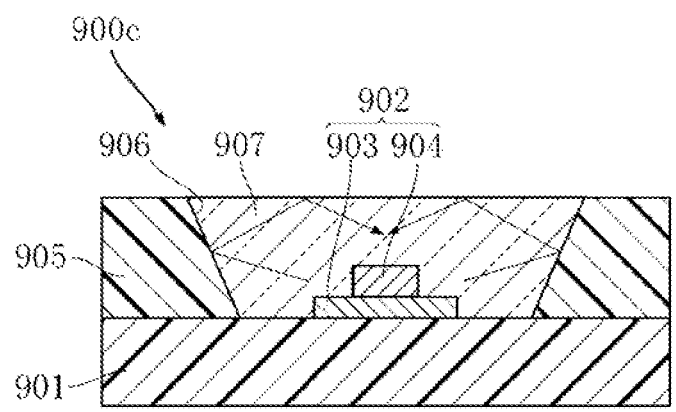
FIG. 77 is a sectional view showing one example of a conventional LED module.

Next, an LED module capable of improving an Ra value and a method of manufacturing the same will be described in detail with reference to FIGS. 72 to 74.

Figure 72:
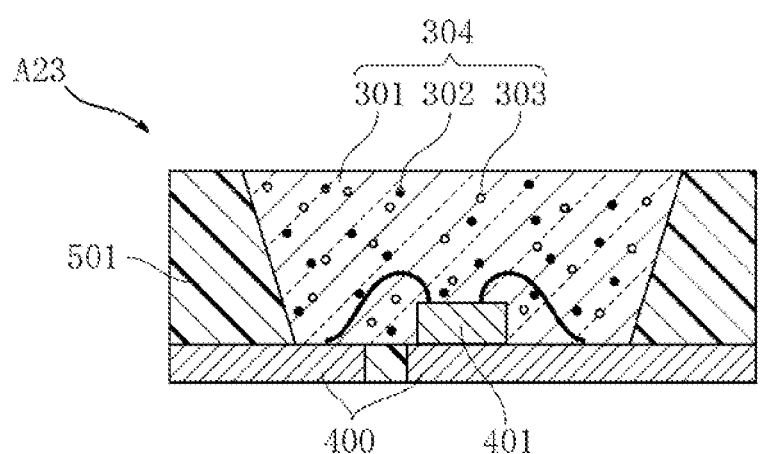
FIG. 72 is a sectional view showing an LED module according to a 23rd embodiment of the present disclosure.

FIG. 72 shows an LED module according to a twenty-third embodiment of the present disclosure. An LED module A23 of this embodiment includes an LED chip 401, a fluorescent portion 304, a lead 400 and a case 501.

The LED chip 401 includes a p-type semiconductor layer made of, for example, GaN semiconductor material, an n-type semiconductor layer and an active layer interposed therebetween; and emits blue light. A peak wavelength of the blue light may be 440 nm to 485 nm, and preferably 445 nm to 460 nm. If the peak wavelength is out of this range, the Ra value generally becomes smaller than 90 even when a mixture ratio (weight ratio) of a red fluorescent material 302 and a green fluorescent material 303, which will be described later, is changed within an industrially applicable range. The LED chip 401 is a so-called 2-wire type, where the LED chip 401 is connected to the lead 400 via two wires. However, the LED chip 401 is not limited to the 2-wire type and may be a 1-wire type, a flip chip type, a submount substrate type or the like.

The lead 400 is made of, for example, a metal such as Cu, Fe or the like, and corresponds to a conductive connection path of the power supplied to the LED chip 401 while supporting the LED chip 401. The case 501 is made of, for example, white resin and formed on the lead 400 to surround the LED chip 401.

The fluorescent portion 300 fills a space surrounded by the case 501 and covers the LED chip 401. The fluorescent portion 300 includes a transparent resin 301, a red fluorescent material 302 and a green fluorescent material 303. The transparent resin 301 is, for example, transparent epoxy resin, silicone resin or the like.

The red fluorescent material 302 corresponds to the first fluorescent material mentioned in the present disclosure and emits red light when excited by the blue light emitted from the LED chip 401. A peak wavelength of the red light from the red fluorescent material 302 is equal to or greater than 625 nm, preferably 645 nm, more preferably 655 to 700 nm. If the peak wavelength is shorter than this range, it is difficult to set the Ra value to be greater than 90. If the peak wavelength is longer than this range, it is difficult or requires high cost to get a fluorescent material emitting light having such a peak wavelength. Examples of the red fluorescent material 302 may include $REuW_2O_8$ (R is at least one of Li, Na, K, Rb and Cs), $M_2Si_5N_8$:Eu (M is at least one of Ca, Sr and Ba), CaS:Eu and SrS:Eu.

The green fluorescent material 303 corresponds to the second fluorescent material mentioned in the present disclosure and emits green light when excited by the blue light emitted from the LED chip 401. A peak wavelength of the green light from the green fluorescent material 303 is equal to or less than 565 nm, preferably 530 nm, more preferably 500 to 520 nm. If the peak wavelength is shorter than this range, it is difficult or requires high cost to get a fluorescent material emitting light having such a peak wavelength. Lithe peak wavelength is longer than this range, it is difficult to set the Ra value to be greater than 90. Examples of the green fluorescent material 303 may include $BaMgAl_{10}O_{17}$:Eu, ZnS:Cu and $MGa_2S_4$:Eu (M is at least one of Ca, Sr and Ba).

In addition, in order to improve the Ra value, which will be described later, the difference in peak wavelength between the red fluorescent material 302 and the green fluorescent material 303 may be set to be equal to or greater than 120 nm. If the peak wavelength difference is smaller than this range, it is difficult to set the Ra value to be greater than 90. A mixture ratio (weight ratio) of the green fluorescent material 303 to the red fluorescent material 302 may be set to be 5.0 to 7.5 (for example, in a case where the peak wavelength of the light from the red fluorescent material 302 is 625 nm to 700 nm and the peak wavelength of the light from the green fluorescent material 303 is 500 nm to 565 nm). Alternatively, the mixture ratio may be set to be 6.8 to 7.2 (for example, in a case where the peak wavelength of the light from the red fluorescent material 302 is equal to or greater than 625 nm and the peak wavelength of the light from the green fluorescent material 303 is equal to or less than 565 nm). If the mixture ratio is out of this range, white light emitted from the LED module A23 may deviate from natural, white light of black body radiation and become reddish or greenish.

In this embodiment, the red fluorescent material 302 and the green fluorescent material 303 are uniformly distributed in the fluorescent portion 304.

Now, a method of manufacturing the LED module A23 will be described in brief. First, the case 501 is formed on the lead 400 by using, for example, a molding. Next, the LED chip 401 is mounted on the lead 400. Then, resin liquid material is injected into a space surrounded by the case 501. The resin liquid material is obtained by uniformly agitating epoxy resin liquid material or silicone resin liquid material, which is the base material of the transparent resin 301, the red fluorescent material 302 and the green fluorescent material 303. The fluorescent portion 304 can be obtained by curing the injected resin liquid material before the fluorescent materials are sunk. Thus, a biased distribution of the fluorescent materials (the red fluorescent material 302 and the fluorescent material 303) in the lower part of the resin liquid material can be avoided. In particular, even if the green fluorescent material 303 has particle diameters greater than those of the red fluorescent material 302 and more Rely to be sunk, the fluorescent portion 304 can be obtained by curing the injected resin liquid material before the green fluorescent material 303 is sunk.

Next, operation of the LED module A23 will be described.

FIG. 73 is a table representing the first to the seventeenth embodiment. FIG. 73 shows measurement results of the Ra values in the embodiments under conditions where peak wavelengths of light from the LED chip 401, the red fluorescent material 302 and the green fluorescent material 303 are set in different ways. In all of the embodiments, the peak wavelength of the light from the LED chip 401 is set to be 445 nm to 465 nm. As shown in FIG. 73, the Ra value tends to increase with an increase of a peak wavelength P1 of the red fluorescent material 302. In addition, the Ra value tends to increase with a decrease of a peak wavelength P2 of the green fluorescent material 303.

Applications placing stress on color rendition require Ra values of at least 80 or more, preferably greater than 90 in many cases. In this respect, Ra value of 90 to 97 are obtained in the embodiments (first, fifth to seventh, ninth, thirteenth and seventeenth embodiments) where the peak wavelength of the red fluorescent material 302 is 650 nm and the peak wavelength of the green fluorescent material 303 is 525 nm. In particular, Ra values reach 95 to 97 in the first, thirteenth and seventeenth embodiments where the peak wavelength of the LED chip is 450 nm to 460 nm. FIG. 74 shows an emission spectrum in the first embodiment where the Ra value is 96. As can be understood from FIG. 74, the first embodiment shows peaks near 455 nm corresponding to the peak wavelength of the LED chip 401, near 525 nm corresponding to the peak wavelength of the green fluorescent material 303 and near 650 nm corresponding to the peak wavelength of the red fluorescent material 302. Such a relatively wide peak wavelength distribution achieves a large Ra value. In order to put peaks in such a wide peak wavelength range, a difference in peak wavelength between the red fluorescent material 302 and the green fluorescent material 303 may be set to be larger than 120 nm.

In addition, studies of the present inventors showed that a uniform distribution of the red fluorescent material 302 and the green fluorescent material 303 in the fluorescent portion 304 is effective in improving Ra values. As shown in FIG. 73, it was verified that Ra values decrease in a comparative example where peak wavelengths of the red fluorescent material 302 and the green fluorescent material 303 of the embodiment providing an Ra value of about 80 were employed and the red fluorescent material 302 and the green fluorescent material 303 were non-uniformly distributed.

The LED modules of the present disclosure and the method of manufacturing the same are not limited to the above-described embodiments. Details of various components of the LED modules of the present disclosure and the method of manufacturing the same may be changed in design in various ways.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED (Light Emitting Diode) module comprising:
   an LED unit having one or more LED chips; and
   a case including:
      a body including a base plate made of ceramic, the base plate having a main surface and a bottom surface opposite to the main surface;
      a through conductor penetrating through the base plate; and
      one or more pads formed on the main surface and making conductive connection with the through conductor, the pads mounting thereon the LED unit,
   wherein the through conductor includes:
      a main surface exposed portion exposed to the main surface and overlapping the LED unit when viewed from top, at least a part of the main surface exposed portion being buried under the main surface of the base plate, and at least a part of the main surface exposed portion having a caved shape deviated from the LED unit;
      a bottom surface exposed portion exposed to the bottom surface; and
      a reaching portion connected to the main surface exposed portion and the bottom surface exposed portion,
   wherein the pads cover at least a portion of the main surface exposed portion,
   wherein the reaching portion is smaller than the main surface exposed portion and the LED unit when viewed from top, and
   wherein the main surface exposed portion contains the LED unit when viewed from top.

2. The LED module of claim 1, wherein at least a portion of the reaching portion does not overlap the LED unit.

3. The LED module of claim 1, wherein the pads cover the main surface exposed portion such that the main surface exposed portion is not exposed.

4. The LED module of claim 1, wherein the through conductor is made of Ag.

5. The LED module of claim 1, wherein each of the pads has a surface made of Au.

6. The LED module of claim 1, wherein a mounting electrode making conductive connection with the through conductor is formed on the bottom surface of the base plate.

7. The LED module of claim 1, wherein the body further includes a frame unit made of resin, the frame unit being bonded to the main surface and surrounding the LED unit.

8. The LED module of claim 7, wherein an inner side of the frame unit surrounding the LED unit serves as a reflector.

9. The LED module of claim 8, wherein the reflector has a section perpendicular to a normal line of the main surface, a dimension of the section decreasing as the section becomes more spaced apart from the main surface.

10. The LED module of claim 7, further comprising a transparent resin filling a region surrounded by the frame unit and covering the LED unit, the transparent resin being formed of resin material transmitting light emitted from the LED unit and fluorescent material emitting, when excited by the light emitted from the LED unit, light having a wavelength different from a wavelength of the light emitted from the LED unit.

11. The LED module of claim 1, wherein the reaching portion does not overlap the LED unit when viewed from top.

12. An LED (Light Emitting Diode) module comprising:
an LED unit having one or more LED chips; and
a case including one or more pads mounting thereon the LED unit, a base plate having a main surface on which the pads are formed and a bottom surface opposite to the main surface, and a frame unit bonded to the main surface and surrounding the LED unit,
wherein the base plate is made of ceramic,
wherein the frame unit is made of resin,
wherein the case further includes a through conductor penetrating through the base plate and making conductive connection with the pads,
wherein the through conductor has a main surface exposed portion exposed to the main surface and overlapping the LED unit when viewed from top, a bottom surface exposed portion exposed to the bottom surface, a reaching portion connected to the main surface exposed portion and the bottom surface exposed portion, at least a part of the main surface exposed portion being buried under the main surface of the base plate, and at least a part of the main surface exposed portion having a caved shape deviated from the LED unit,
wherein the pads cover at least a portion of the main surface exposed portion,
wherein the reaching portion is smaller than the main surface exposed portion and the LED unit when viewed from top, and
wherein the main surface exposed portion contains the LED unit when viewed from the top.

13. The LED module of claim 12, wherein an inner side of the frame unit surrounding the LED unit serves as a reflector.

14. The LED module of claim 13, wherein the reflector has a section perpendicular to a normal line of the main surface, a dimension of the section decreasing as the section becomes more spaced apart from the main surface.

15. The LED module of claim 12, further comprising a transparent resin filling a region surrounded by the frame unit and covering the LED unit, the transparent resin being formed of resin material transmitting light emitted from the LED unit and fluorescent material emitting, when excited by the light emitted from the LED unit, light having a wavelength different from a wavelength of the light emitted from the LED unit.

16. The LED module of claim 12, wherein at least a portion of the reaching portion does not overlap the LED unit.

17. The LED module of claim 12, wherein the pads cover the main surface exposed portion such that the main surface exposed portion is not exposed.

18. The LED module of claim 12, wherein the through conductor is made of Ag.

19. The LED module of claim 12, wherein each of the pads has a surface made of Au.

20. The LED module of claim 12, wherein a mounting electrode making conductive connection with the through conductor is formed on the bottom surface of the base plate.

21. The LED module of claim 12, wherein the reaching portion does not overlap the LED unit when viewed from top.

* * * * *